(12) United States Patent
Kwon et al.

(10) Patent No.: US 12,133,346 B2
(45) Date of Patent: Oct. 29, 2024

(54) DISPLAY DEVICE

(71) Applicant: LG ELECTRONICS INC., Seoul (KR)

(72) Inventors: Ohkwan Kwon, Seoul (KR); Sungyul An, Seoul (KR); Eunbong Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 290 days.

(21) Appl. No.: 17/538,651

(22) Filed: Nov. 30, 2021

(65) Prior Publication Data

US 2023/0065758 A1 Mar. 2, 2023

(30) Foreign Application Priority Data

Aug. 26, 2021 (WO) ................ PCT/KR2021/011407

(51) Int. Cl.
*F16M 11/00* (2006.01)
*F16M 11/12* (2006.01)
*F16M 11/18* (2006.01)
*F16M 11/20* (2006.01)
*F16M 11/28* (2006.01)
(Continued)

(52) U.S. Cl.
CPC ......... *H05K 5/0234* (2013.01); *F16M 11/125* (2013.01); *F16M 11/18* (2013.01); *F16M 11/2014* (2013.01); *F16M 11/28* (2013.01); *F16M 13/022* (2013.01); *G06T 7/70* (2017.01); *F16M 2200/00* (2013.01); *G06T 2207/30196* (2013.01)

(58) Field of Classification Search
CPC .... H05K 5/0234; F16M 11/125; F16M 11/18; F16M 11/2014; F16M 11/28; F16M 13/022; F16M 2200/00; F16M 11/08; G06T 7/70; G06T 2207/30196
See application file for complete search history.

(56) References Cited

U.S. PATENT DOCUMENTS 8,469,323 B1 * 6/2013 Deros .................. F16M 11/105
 248/124.2
11,131,332 B2 * 9/2021 Huang .................... F16B 2/065
(Continued)

FOREIGN PATENT DOCUMENTS

JP 3233085 U 7/2021
KR 20-2014-0000629 U 1/2014
(Continued)

*Primary Examiner* — Amy J. Sterling
(74) *Attorney, Agent, or Firm* — Birch, Stewart, Kolasch & Birch, LLP

(57) ABSTRACT

A display device can include a display; a mounting bracket coupled to a rear surface of the display; a first arm connected to the mounting bracket for tilting the mounting bracket up and down; a second arm connected to an end portion of the first arm and the first arm being configured to rotate based on a first swivel shaft disposed in the second arm; a third arm connected to an end portion of the second arm and rotates based on a second swivel shaft disposed in the third arm; a pillar connected to the third arm and the pillar being configured to move up and down; and a fixing part configured to be fixed to an external object, in which the pillar is connected to an upper surface of the fixing part and rotates based on a third swivel shaft disposed in the fixing part or the pillar.

25 Claims, 47 Drawing Sheets

(51) Int. Cl.
    *F16M 13/02*     (2006.01)
    *G06T 7/70*     (2017.01)
    *H05K 5/02*     (2006.01)

(56) References Cited

U.S. PATENT DOCUMENTS

| | | | |
|---|---|---|---|
| 11,193,527 B2* | 12/2021 | Li | F16M 11/2092 |
| 2011/0079692 A1* | 4/2011 | Li | F16M 11/105 |
| | | | 248/220.21 |
| 2011/0315843 A1* | 12/2011 | Hung | F16M 13/022 |
| | | | 248/278.1 |
| 2014/0367137 A1* | 12/2014 | Leung | F16M 11/2014 |
| | | | 174/68.3 |
| 2018/0209582 A1* | 7/2018 | Petts | F16M 13/022 |
| 2020/0032953 A1* | 1/2020 | Chen | F16M 13/022 |
| 2020/0266252 A1* | 8/2020 | Cancel Olmo | G06F 1/1686 |
| 2021/0239262 A1* | 8/2021 | Lim | F16M 11/2092 |
| 2021/0293375 A1* | 9/2021 | Ambridge | F16M 11/2064 |
| 2021/0388943 A1* | 12/2021 | Miura | F16M 11/24 |
| 2022/0082206 A1* | 3/2022 | Walker | F16M 11/2092 |
| 2023/0010833 A1* | 1/2023 | Fei | F16M 11/2014 |
| 2023/0400146 A1* | 12/2023 | Sin | F16M 11/125 |

FOREIGN PATENT DOCUMENTS

| | | | |
|---|---|---|---|
| KR | 10-2016-0121052 A | 10/2018 |
| KR | 10-2020-0084564 A | 7/2020 |
| KR | 10-2020-0120196 A | 10/2020 |

\* cited by examiner

DISPLAY DEVICE

CROSS-REFERENCE TO RELATED APPLICATION

Pursuant to 35 U.S.C. § 119(a), this application claims the benefit of the earlier filing date and the right of priority to PCT Patent Application No. PCT/KR2021/011407, filed on Aug. 26, 2021, the contents of which are incorporated by reference herein in their entirety.

BACKGROUND

1. Technical Field

The present disclosure relates to a display device.

2. Description of the Related Art

As is well known, a display device is a device that displays information for visual or stereoscopic reception, storage, and transmission.

As the information society develops, various display devices such as a Liquid Crystal Display (LCD), a Plasma Display Panel (PDP), an Electroluminescent Display (ELD), a Vacuum Fluorescent Display (VFD), and the like have been developed and used.

Such a display device includes a display unit for displaying an image and a support device for supporting the display unit to be spaced apart from an upper surface of a desk and/or table by a preset height.

However, in the related art display device, the support device (e.g., a display stand or mount) supports the display unit at a fixed height, which makes it difficult to adjust a height of a screen.

In particular, since the support device is fixed to an upper surface of an installation object, such as a desk or table, in consideration of a connection with electronic devices that are connected to communicate with the display device, it is difficult to adjust a distance between user's eyes and the screen.

In addition, since most of the display unit is fixed to the support device, it is not easy to adjust a tilting angle (viewing angle) of the screen of the display unit with respect to the user's gaze.

In the related art display device, the height, the distance, and the tilting angle (viewing angle) of the screen of the display unit have to be individually adjusted manually with respect to the user's gaze, which causes inconvenience and fatigue in use of the display device.

SUMMARY

Therefore, one aspect of the present disclosure is to provide a display device capable of easily and automatically adjusting height and distance of a screen.

Another aspect of the present disclosure is to provide a display device capable of easily and automatically adjusting height, distance, and tilting angle of a screen.

Still another aspect of the present disclosure is to provide a display device capable of easily adjusting height, distance, and tilting angle of a screen by securing a relatively high 5 degrees of freedom or more.

Still another aspect of the present disclosure is to provide a display device capable of reducing driving force required to adjust height and tilting angle of a screen.

Still another aspect of the present disclosure is to provide a display device capable of automatically adjusting height, distance, and tilting angle of a screen according to a change in a user's posture.

In order to achieve these and other advantages and in accordance with the purpose of this specification, as embodied and broadly described herein, there is provided a display device which may include a support device disposed on a rear surface of a display unit to adjust tilting, height, and distance of the display unit in a vertical (up and down) direction.

Specifically, the support device may include a mounting bracket coupled to the rear surface of the display unit, a first arm having one end portion connected to the mounting bracket to be tiltable up and down, a second arm having one end portion connected to another end portion of the first arm to be relatively rotatable centering on a vertically disposed shaft, a third arm having one end portion connected to another end portion of the second arm to be relatively rotatable centering on a vertically disposed shaft, a fixing unit fixed to a fixing object, and a pillar connected to the fixing unit to be relatively rotatable centering on a vertically disposed shaft and coupled with the third arm such that the third arm moves up and down.

This may facilitate height, distance, and vertical tilting angle of a screen of the display unit to be adjusted with respect to user's eyes.

A display device according to one implementation of the present disclosure may include a display unit on which an image is displayed, a mounting bracket coupled to a rear surface of the display unit, a first arm connected to the mounting bracket to be tiltable up and down, a second arm connected to an end portion of the first arm to be relatively rotatable centering on a vertically disposed shaft, a third arm connected to an end portion of the second arm to be relatively rotatable centering on a vertically disposed shaft, a pillar to which the third arm is coupled to be movable up and down, and a fixing unit fixed to a fixing object and having an upper surface to which the pillar is connected to be relatively rotatable centering on a vertically disposed shaft.

Accordingly, the display unit can have a relatively high degree of freedom (more than 5 degrees of freedom), and thus the height, distance, tilting angle of the screen of the display unit with respect to the user's eyes can be adjusted, which may facilitate an appropriate viewing angle to be secured.

In one implementation of the present disclosure, the pillar may include a lower pillar connected to the fixing unit, and an upper pillar movable up and down relative to the lower pillar.

Here, the third arm may be provided on the upper pillar.

Accordingly, the third arm can move up and down in cooperation with the upper pillar.

The third arm may be coupled to an upper end of the upper pillar to protrude horizontally.

In one implementation of the present disclosure, the pillar may include an elastic member compressed upon a downward movement of the upper pillar to accumulate elastic force.

Accordingly, when the upper pillar moves up, driving force required for pushing up the upper pillar can be reduced by that much owing to the elastic force accumulated in the elastic member.

In one implementation of the present disclosure, the elastic member may be configured as a gas spring that expands and contracts in response to upward and downward movement of the upper pillar.

The gas spring can accumulate elastic force by being compressed when the upper pillar moves down, and the elastic force accumulated in the gas spring can facilitate the upward movement of the upper pillar when the upper pillar moves up.

In one implementation of the present disclosure, the pillar may be provided with a height adjusting unit to adjust the height of the third arm.

Accordingly, the height of the display unit connected to the third arm can be adjusted.

In one implementation of the present disclosure, the height adjusting unit may include a rack tooth part provided in the lower pillar, a pinion provided in the upper pillar and engaged with the rack tooth part, and a pinion driving motor to operate the pinion.

Accordingly, the upper pillar can move up and down relative to the lower pillar by forward and reverse rotation of the pinion.

In one implementation of the present disclosure, the gas springs may be provided on both sides of the rack tooth part inside the upper pillar, respectively.

In one implementation of the present disclosure, a driving motor for rotating the pinion may be provided inside the upper pillar.

In one implementation of the present disclosure, a clutch for selectively transmitting rotational force of the driving motor to the pinion may be provided between the driving motor and the pinion.

In a state in which power transmission from the driving motor to the pinion is suppressed by the clutch, the upper pillar can be manually moved up and down relative to the lower pillar.

In one implementation of the present disclosure, the driving motor may be provided in the third arm to be spaced apart from the pinion provided in the upper pillar.

Power can be transmitted from the driving motor to the pinion by a power transmission unit.

The power transmission unit may include, for example, a belt and a pulley.

The pulley may include a driving pulley coupled to the driving motor and a driven pulley coupled to the pinion.

In one implementation of the present disclosure, the height adjusting unit may include a lead screw provided in the upper pillar, a female screw member provided in the lower pillar and screwed to the lead screw, and a lead screw driving motor to rotate the lead screw.

In one implementation of the present disclosure, the lead screw driving motor may be provided in the upper pillar.

The driving motor may be vertically disposed, and the lead screw may be connected to a rotating shaft of the driving motor to enable power transmission.

In one implementation of the present disclosure, a clutch for selectively transmitting rotational force of the driving motor to the lead screw may be provided between the driving motor and the lead screw.

In one implementation of the present disclosure, the gas spring may be provided on one side of the lead screw along a protruding direction of the third arm.

Accordingly, the gas spring can partially complement a load applied to the third arm and the upper pillar, so that driving force required to rotate the lead screw for raising the third arm can be remarkably reduced.

In one implementation of the present disclosure, the third arm may include a slider disposed in the pillar to be movable up and down, and a sliding support portion for supporting the slider to be movable up and down may be disposed in the pillar.

The pillar may be provided with a cutout portion cut out to correspond to a movement trajectory of the third arm.

The third arm may be accommodated inside the cutout portion and move up and down in a connected state to the slider.

In one implementation of the present disclosure, the slider may include a plurality of rollers.

In one implementation of the present disclosure, the sliding support portion may include a plurality of rails coming in rolling contact with the plurality of rollers such that the plurality of rollers can move relatively.

In one implementation of the present disclosure, among the plurality of rollers, plural rollers may be disposed at an end portion (front end portion) adjacent to the cutout portion of the slider and one roller may be disposed at an end portion (rear end portion) far from the cutout portion of the slider.

More specifically, among the plurality of rollers, two front rollers may be disposed at an end portion (front end portion) adjacent to the cutout portion of the slider and one rear roller may be disposed at an end portion (rear end portion) far from the cutout portion of the slider.

When the plurality of rollers are viewed from a top, two front rollers may be disposed at both sides of a connecting portion to which the third arm is connected, and one rear roller may be disposed on an extension line of the connecting portion to which the third arm is connected.

The two front rollers disposed at the front end portion of the slider and the one rear roller disposed at the rear end portion of the slider may be disposed at positions corresponding to vertices of a triangular shape.

Therefore, the slider can be stably supported and an occurrence of clearance of the slider in a transverse direction can be suppressed.

In one implementation of the present disclosure, the two rollers at the front end portion of the slider may each have an outer surface with a cylindrical shape, and the one roller disposed at the rear end portion of the slider may be provided with a groove portion inwardly recessed from an outer surface.

Correspondingly, among the plurality of rails, rails with which the two rollers are brought into contact may have flat surfaces, respectively, and a rail with which the one roller is brought into contact may be provided with a protruding portion corresponding to a shape of the groove portion.

Here, the groove portion and the protruding portion may have a triangular cross-section or a semi-circular cross-section, respectively.

This may result in effectively suppressing an occurrence of transverse clearance of the slider.

The groove portion may have two tilted surfaces that are tilted in an axial direction to have a cross section with a shape like "V".

The protruding portion may have a cross section with a shape like "V" protruding outwardly to be in surface contact with the two tilted surfaces of the groove portion.

In one implementation of the present disclosure, the slider may be provided with an elastic member for accumulating elastic force when the slider moves down.

In one implementation of the present disclosure, the elastic member provided in the slider may be configured as a gas spring.

Accordingly, when the slider moves down, the gas spring can accumulate elastic force, and when the slider moves up, driving force required to push the slider up can be reduced by the elastic force of the gas spring.

The gas spring may be provided at the front of the rear roller.

The gas spring may be provided between the two front rollers.

In one implementation of the present disclosure, the pillar may be provided with a height adjusting unit to adjust the height of the third arm.

This may result in facilitating the adjustment of the height of the display unit.

In one implementation of the present disclosure, the height adjusting unit may include a rack tooth part disposed in the pillar in the vertical direction, and a pinion disposed on the slider and engaged with the rack tooth part.

The pinion may be rotated by the driving motor.

The driving motor may be provided on the slider.

In one implementation of the present disclosure, the display device may further include a tilting shaft horizontally disposed on an end portion of the first arm, and a tilting member connected to be tiltable up and down based on the tilting shaft and connected to the mounting bracket.

Accordingly, the display unit connected to the mounting bracket can rotate up and down centering on the tilting shaft.

With the configuration, the viewing angle of the screen of the display unit with respect to the user's eyes can be easily adjusted and secured.

In one implementation of the present disclosure, the display device may further include a tilting driving unit to tilt the display unit centering on the tilting shaft.

This may facilitate the viewing angle of the display unit to be secured.

In one implementation of the present disclosure, the tilting driving unit may include a driving gear provided on any one of the first arm and the tilting member, a driven gear provided on another one of the first arm and the tilting member and engaged with the driving gear, and a tilting driving motor to rotate the driving gear.

This may further facilitate the viewing angle of the display unit to be securely.

In one implementation of the present disclosure, the tilting driving unit may further include an elastic member compressed when the tilting member moves down to accumulate elastic force.

Accordingly, driving force required for upward rotation of the display unit can be reduced.

With the configuration, the elastic member can accumulate elastic force by being compressed when the display unit rotates downward, and upward rotation of the display unit can be facilitated by the accumulated elastic force upon the upward rotation of the display unit. This may result in remarkably reducing power consumption of the tilting driving motor.

A rated capacity of the tilting driving motor can also be reduced in consideration of the elastic force of the elastic member and the weight of the display unit.

In one implementation of the present disclosure, the tilting member and the mounting bracket may be connected by a pivot shaft to pivot relative to each other.

The pivot shaft may be disposed parallel to the first arm.

The pivot shaft may be horizontally disposed in a back and forth (front and rear) direction.

Accordingly, the display unit can pivot up and down centering on the pivot shaft.

In one implementation of the present disclosure, a stopper for limiting a relative rotation range of the mounting bracket and the tilting member may be provided in a contact area between the mounting bracket and the tilting member.

The stopper may include a stopper protrusion protruding from any one of contact surfaces of the mounting bracket and the tilting member, and a stopper protrusion accommodating portion formed to correspond to a rotational trajectory of the stopper protrusion and accommodating the stopper protrusion.

Here, the stopper protrusion accommodating portion may have a preset angle (range).

In the implementation, the stopper protrusion accommodating portion may have an angle of 90 degrees along a rotation trajectory of the stopper protrusion.

More specifically, the display unit may be formed in a rectangular shape having two long side portions arranged horizontally and two short side portions arranged vertically.

The stopper protrusion accommodating portion may be configured such that the display unit (the mounting bracket) rotates centering on the pivot shaft and thus the two long side portions are arranged vertically.

In one implementation of the present disclosure, a connector electrically connected to the display unit may be provided on one side of the mounting bracket.

Accordingly, when the mounting bracket is coupled to the rear surface of the display unit, the connector may be connected to a connector of the display unit.

Therefore, the display unit can be connected to another electronic device in a wired manner to receive power and perform communication.

In one implementation of the present disclosure, a recessed portion may be inwardly recessed into the rear surface of the display unit, and the mounting bracket may be coupled to close an opening of the recessed portion.

An accommodation hole may be formed through the mounting bracket such that the first arm is accommodated to be relatively movable.

In one implementation of the present disclosure, the first arm may include a first arm body, and a second arm connecting portion formed on an end portion of the first arm body to be connected to the second arm.

In one implementation of the present disclosure, the first arm body may be provided with a pivot shaft pivotable with respect to the first arm body.

Accordingly, the display unit can pivot along a plate surface direction based on the first arm (the first arm body).

In the implementation, the first arm body and the pivot shaft may rotate between a first position at which the long side portions of the display unit are horizontally disposed and a second position at which the long side portions of the display unit are vertically disposed.

In one implementation of the present disclosure, one end portion (front end portion) of the first arm body may be accommodated in the accommodation hole of the mounting bracket, and a tilting shaft may be horizontally disposed on the one end portion (the front end portion) of the first arm body.

A tilting shaft support member for supporting the tilting shaft may be provided on the front end portion of the first arm body.

In one implementation of the present disclosure, the tilting shaft support member may have a shape with one side open.

In one implementation of the present disclosure, an elastic member that is compressed when the display unit rotates downward to accumulate elastic force may be provided between the tilting shaft and the tilting shaft support member.

Accordingly, when the display unit rotates upward, the display unit can easily rotate upward by virtue of the elastic force accumulated in the elastic member.

In addition, driving force required for the upward rotation of the display unit can be reduced.

A tilting member that is tiltable up and down with respect to the first art centering on the tilting shaft may be coupled to the tilting shaft.

The tilting member may have an inner accommodation space, and the tilting shaft support member may be accommodated in the accommodation space.

The tilting member may be implemented in a cylindrical shape with one side (rear area) open.

The tilting member may be coupled to the mounting bracket.

In one implementation of the present disclosure, a front surface of the mount bracket may be coupled to the rear opening of the tilting member.

In one implementation of the present disclosure, a tilting case having one side (rear side) open may be coupled to an outside of the tilting member.

The tilting case may be configured to accommodate the tilting member therein.

The tilting case may be inserted into the recessed portion of the display unit.

In one implementation of the present disclosure, a connector may be provided inside the tilting case.

The connector may be connected to a connector provided in the recessed portion of the display unit.

Accordingly, when the tilting case is inserted into the recessed portion, the display unit can be electrically connected to another electronic device connected to the tilting case.

The tilting case may be formed to correspond to the shape of the recessed portion, and may be implemented in a rectangular parallelepiped shape with one side open.

The mounting bracket may be coupled to the opening of the tilting case.

In one implementation of the present disclosure, the tilting shaft may be configured to be pivotable with respect to the first arm (the first arm body).

Accordingly, the tilting member, the tilting case, the mounting bracket, and the display unit coupled to the tilting shaft can rotate in a plate surface direction centering on the first arm (the first arm body).

In one implementation of the present disclosure, the tilting member and the first arm may be provided with a tilting driving unit for tilting the tilting member up and down based on the tilting shaft.

In one implementation of the present disclosure, the tilting driving unit may include a driving gear provided on any one of the tilting member and the first arm, a driven gear provided on another one of the tilting member and the first arm and engaged with the driving gear, and a tilting driving motor to rotate the driving gear.

In one implementation of the present disclosure, the driving gear may be provided on the tilting member, and the driven gear may be provided on the first arm.

The driving gear may be provided on a rotating shaft of the tilting driving motor fixed to the tilting member, and the driven gear may be provided on the tilting shaft connected to the first arm.

Here, the driven gear may have a tooth portion formed in an arcuate shape to correspond to a movement trajectory of the driving gear, and may be fixedly coupled to the tilting shaft.

With the configuration, the driving gear may be engaged with the tooth portion of the driven gear to be movable in an arcuate direction of the driven gear and accordingly the tilting member can be tilted (rotated) up and down centering on the tilting shaft.

In one implementation of the present disclosure, the first arm and the second arm may be coupled to vertically overlap each other.

In one implementation of the present disclosure, a first swivel shaft may be provided in an overlapping area between the first arm and the second arm.

Accordingly, the first arm can swivel (rotate) relative to the second arm centering on the first swivel shaft.

In one implementation of the present disclosure, a first swivel driving unit for swiveling (rotating) the first arm with respect to the second arm may be provided in a coupling area between the first arm and the second arm.

In one implementation of the present disclosure, the first swivel driving unit may include a first swivel shaft coupled to the second arm to be movable relative to the first arm, a fixed gear formed on an end portion of the first arm in a circumferential direction, a driving gear engaged with the fixed gear to be relatively movable, and a first swivel driving motor for rotating the driving gear.

Accordingly, the first arm can swivel (rotate) relative to the second arm centering on the first swivel shaft.

In one implementation of the present disclosure, the first swivel driving motor may be provided on the second arm.

In one implementation of the present disclosure, the second arm connecting portion of the first arm may be formed substantially in a disk shape.

A first swivel shaft hole may be formed through a center of the second arm connecting portion so that the first swivel shaft can be accommodated to be relatively movable.

In one implementation of the present disclosure, a first arm accommodating portion in which the first arm is accommodated to be relatively movable may be formed in one end portion (front end portion) of the second arm.

The first arm accommodating portion may have one side (front side) open.

The second arm may include an upper support part in contact with an upper side of the second arm connecting portion of the first arm, and a lower support part in contact with a lower side of the second arm connecting portion.

The first arm accommodating portion may be disposed between the upper support part and the lower support part.

In one implementation of the present disclosure, the first swivel shaft may include a shaft body, a head extending outwardly from one end portion of the shaft body, and a male screw portion formed on another end portion of the shaft body.

A head accommodating portion in which the head of the first swivel shaft is accommodated may be formed in the upper support part of the second arm, and a female screw portion to which the male screw portion of the first swivel shaft is screwed may be provided in the lower support part.

In one implementation of the present disclosure, the fixed gear may be disposed on an upper surface of the second arm connecting portion of the first arm at a preset angle (internal angle) along the circumferential direction.

In one implementation of the present disclosure, an internal angle between both end portions of the fixed gear may be 180 degrees or less.

Accordingly, the first arm can be rotated by 180 degrees or less relative to the second arm centering on the first swivel shaft.

The fixed gear may be tilted with respect to an axial direction of the first swivel shaft.

The driving gear may be connected to a rotating shaft of the first swivel driving motor.

The rotating shaft of the first swivel driving motor may be disposed perpendicular to the first swivel shaft.

The driving gear may be tilted with respect to the rotating shaft of the first swivel driving motor.

In one implementation of the present disclosure, the fixed gear may be formed at 45 degrees with respect to the first swivel shaft, and the driving gear may be formed at 45 degrees with respect to the rotating shaft of the first swivel driving motor.

In one implementation of the present disclosure, a stopper for limiting a relative rotation range of the first arm and the second arm may be provided in a contact area between the first arm and the second arm.

In one implementation of the present disclosure, the stopper may include a stopper protrusion protruding in an axial direction from one of contact surfaces of the first arm and the second arm, and a stopper protrusion accommodating portion formed in another contact surface to accommodate an end portion of the stopper protrusion and formed to correspond to a relative rotation trajectory of the stopper protrusion.

In one implementation of the present disclosure, the protrusion may be formed on the second arm, and the protrusion accommodating portion may be formed on the first arm.

The protrusion may protrude from the upper support part of the second arm to the first arm accommodating portion.

The protrusion accommodating portion may be recessed in the first arm to accommodate the protrusion.

In one implementation of the present disclosure, the protrusion accommodating portion may be formed such that an internal angle between the protrusions disposed at both end portions is 180 degrees or less.

In one implementation of the present disclosure, the protrusion accommodating portion may be disposed at an upper side of the fixed gear.

In one implementation of the present disclosure, the protrusion accommodating portion may have a smaller rotation radius than a rotation radius of the fixed gear.

In one implementation of the present disclosure, a second swivel shaft may be provided in a coupling area between the second arm and the third arm.

The second arm and the third arm may be disposed to vertically overlap each other, and the second swivel shaft may be disposed in an overlapping area.

Accordingly, the second arm and the third arm can rotate relative to each other centering on the second swivel shaft.

In one implementation of the present disclosure, a second swivel driving unit for relatively rotating the second arm may be provided in the coupling area between the second arm and the third arm.

In one implementation of the present disclosure, the second swivel driving unit may include a second swivel shaft having one end portion provided inside the third arm and another end portion provided inside the second arm, a fixed gear disposed on one end portion of the second swivel shaft to be tilted in the axial direction, a driving gear engaged with the fixed gear, and a second swivel driving motor for rotating the driving gear.

This may further facilitate the rotation of the second arm.

In one implementation of the present disclosure, a lower end of the second swivel shaft may be inserted into the third arm.

The second swivel shaft may be fixedly supported by the third arm.

An upper end of the second swivel shaft may protrude to an upper side of the third arm.

An upper end of the second swivel shaft may be inserted into the second arm to be relatively rotatable.

In one implementation of the present disclosure, the second swivel shaft may be provided with a fixed gear along the circumferential direction.

In one implementation of the present disclosure, a tooth portion of the fixed gear may be downwardly tilted toward an outside in an axial direction of the second swivel shaft.

In one implementation of the present disclosure, the driving gear may be engaged with the tooth portion of the fixed gear to be relatively rotatable.

In one implementation of the present disclosure, the second swivel driving motor may be provided inside the second arm.

The second swivel driving motor may be provided on the second arm such that the rotating shaft is horizontally disposed.

In one implementation of the present disclosure, the driving gear may be coupled to a rotating shaft of the second swivel driving motor.

A tooth portion of the driving gear may be formed to be tilted with respect to the rotating shaft of the second swivel driving motor.

In one implementation of the present disclosure, a cable may be accommodated in the second arm and the third arm.

Accordingly, external exposure of the cable can be suppressed and appearance quality can be enhanced.

In one implementation of the present disclosure, a through portion may be formed through the second swivel shaft in the axial direction.

The cable may pass through the inside of the second swivel shaft.

In one implementation of the present disclosure, a separation preventing portion for suppressing a sudden separation of the second arm from the second swivel shaft may be provided in a coupling area between the second arm and the second swivel shaft.

In one implementation of the present disclosure, the separation preventing portion may include a separation preventing protrusion protruding from one of contact surfaces of the second arm and the second swivel shaft toward another contact surface, and a separation preventing protrusion groove formed in the another contact surface such that the separation preventing protrusion is accommodated.

The separation preventing protrusion may be a separation preventing protrusion formed on the second arm, and the separation preventing protrusion groove may be a separation preventing protrusion accommodating groove formed on the second swivel shaft.

The separation preventing protrusion accommodating portion may be formed to correspond to the relative rotation trajectory of the separation preventing protrusion.

The separation preventing protrusion accommodating portion may be formed such that an internal angle between both end portions thereof is a preset angle (range).

This may result in controlling a rotation range of the second arm.

In one implementation of the present disclosure, the fixing unit may be detachably disposed on the fixing object.

Accordingly, the fixing unit can be remarkably reduced in size and weight.

In one implementation of the present disclosure, the fixing unit may include an upper fixing member placed on an upper surface of the fixing object, a lower fixing member disposed on a lower surface of the fixing object to be movable close to and away from the upper fixing member, a pressing member coupled to an upper surface of the lower fixing member to be movable up and down, and a manipulation handle screwed through the lower fixing member and having one end portion connected to the pressing member.

Accordingly, the upper fixing member placed on the upper surface of the fixing object can be significantly reduced in size.

With the configuration, the size reduction of the upper fixing member may result in remarkably reducing an area occupied by the upper fixing member on the upper surface of the fixing object, thereby further increasing usability of the upper surface of the fixing object (e.g., a desk or table).

Accordingly, coupling and separation of the fixing unit with respect to the fixing object can be facilitated.

Here, the upper fixing member may be provided with a guide extending downward to guide the lower fixing member.

The lower fixing member may be provided with a guide accommodating portion in which the guide is accommodated to be relatively movable.

In one implementation of the present disclosure, the guide may be provided with a concave-convex portion in which convex portions and concave portions are alternately formed along the vertical direction, and the lower fixing member may be provided with an engagement protrusion engaged with the concave-convex portion.

Accordingly, when the engagement protrusion is inserted into the concave portion, the lower fixing member can be temporarily fixed to a corresponding position.

In one implementation of the present disclosure, the guide accommodating portion of the lower fixing member may have a larger width than a thickness of the guide to form a clearance, and an elastic member may be provided on the lower fixing member to apply elastic force to the engagement protrusion such that the engagement protrusion is inserted into the concave portion.

Here, the elastic member may be implemented as a leaf spring.

In one implementation of the present disclosure, the pillar may be coupled to an upper surface of the upper fixing member to be relatively rotatable.

This may further facilitate the control (distance adjustment) of the display unit.

In one implementation of the present disclosure, a third swivel driving unit for relatively rotating the pillar (third arm) with respect to the fixing unit may be provided in a coupling area between the pillar and the fixing unit.

In one implementation of the present disclosure, the third swivel driving unit may include a third swivel shaft disposed in a contact area between the pillar and the upper fixing member, a fixed gear disposed on the upper fixing member in the circumferential direction based on the third swivel shaft, a driving gear engaged with the fixed gear to be relatively movable, and a third swivel driving motor to rotate the driving gear.

Accordingly, the pillar may be rotated with respect to the fixed unit by using driving force of the third swivel driving motor.

In one implementation of the present disclosure, a stopper for limiting rotation of the pillar may be provided in a contact area between the third swivel shaft and the fixing unit (the upper fixing member).

In one implementation of the present disclosure, the stopper may include a stopper protrusion protruding from any one of contact surfaces of the swivel shaft and the upper fixing member, and a stopper protrusion accommodating portion in which the stopper protrusion is accommodated and which is formed to correspond to a rotation trajectory of the stopper protrusion.

In one implementation of the present disclosure, an internal angle between both end portions of the stopper protrusion accommodating portion may be a preset angle.

Here, the preset angle may be formed in a range of 120 degrees to 180 degrees.

In one implementation of the present disclosure, the stopper protrusion may be formed on the upper fixing member, and the stopper protrusion accommodating portion may be formed in the separation preventing portion of the third swivel shaft.

In one implementation of the present disclosure, the third swivel driving motor may be provided in the pillar.

The third swivel driving motor may be provided in the pillar such that the rotating shaft is disposed in the vertical direction.

A third swivel driving motor accommodating portion in which the third swivel driving motor is accommodated may be provided in a lower portion of the pillar.

The fixed gear may include a tooth portion formed to be tilted downward with respect to the upper fixing member.

The driving gear may include a tooth portion formed to be tilted with respect to a rotating shaft of the third swivel driving motor.

In one implementation of the present disclosure, the display device may include a control unit for controlling the position of the display unit by using a control program.

A signal input unit for inputting an operation signal may be connected to the control unit to perform communication.

In one implementation of the present disclosure, the control unit may adjust a tilting angle of the display unit (screen) in the vertical direction.

The tilting driving unit may be controllably connected to the control unit.

Accordingly, the tilting angle of the screen of the display unit can be adjusted based on the tilting shaft.

The control unit may adjust a height of the display unit.

The height adjusting unit may be controllably connected to the control unit.

Accordingly, the height of the display unit can be adjusted as the display unit moves along the vertical direction of the pillar.

The control unit may adjust a distance of the display unit with respect to the pillar.

A distance adjusting unit for adjusting the distance of the display unit with respect to the pillar may be controllably connected to the control unit.

The distance adjusting unit may include a first swivel driving unit for rotating the first arm relative to the second arm, and a second swivel driving unit for rotating the second arm relative to the third arm.

In one implementation of the present disclosure, the distance adjusting unit may further include a third swivel driving unit for rotating the pillar with respect to the fixing unit.

Accordingly, a distance between the screen of the display unit and user's eyes can be more effectively adjusted.

In one implementation of the present disclosure, the display unit may be provided with a camera for capturing a user's posture, and the camera may be connected to the control unit to perform communication.

The control unit may recognize the user's basic posture and changed posture captured by the camera, and control each of the tilting driving unit, the height adjusting unit, the first swivel driving unit, the second swivel driving unit, and the third swivel driving unit 340 to adjust the user's viewing angle.

Accordingly, the control unit can control the position of the display unit such that an appropriate viewing angle can be secured for the user's eyes and the screen of the display unit.

The control unit may recognize a posture of the user who uses the display device to determine whether the user's posture is a first mode corresponding to a correct (good) posture or a second mode corresponding to another posture other than the correct posture. When the user's posture is the first mode and a predetermined time elapses, the control unit may determine whether the user's posture captured through the camera has changed and whether a changed posture is appropriate or not. When it is determined that the changed posture is inappropriate, the control unit may control the first arm to be tilted in the vertical direction such that the display unit is tilted in the vertical direction. When it is determined that the changed posture is appropriate, the control unit may control a monitor setting position to be fixed. When a predetermined time elapses after the monitor setting position is fixed, the control unit may control the monitor to be automatically adjusted in height and tilting angle in the vertical direction or a left and right direction.

As described above, according to one implementation of the present disclosure, a tilting angle, height, and distance of a display unit can be easily adjusted, by providing a mounting bracket that can be coupled to a rear surface of the display unit, a first arm that is tiltable up and down with respect to the mounting bracket, a second arm connected to an end portion of the first arm to be relatively rotatable, a third arm connected to an end portion of the second arm to be relatively rotatable, a pillar along which the third arm moves up and down, and a fixing unit to which the pillar is rotatably coupled.

In addition, since the pillar includes lower and upper pillars that can be stretched up and down, the upper pillar can move down when the display unit moves down, thereby suppressing an occurrence of interference with surroundings.

An elastic member that is compressed when the upper pillar moves down to accumulate elastic force. Accordingly, when the display unit moves up, driving force required for the upward movement of the display unit can be reduced by virtue of the elastic force accumulated in the elastic member.

The lower pillar may include a rack tooth part and the upper pillar may include a pinion, which may facilitate adjustment of a height of the upper pillar (third arm) with respect to the lower pillar.

The upper pillar may include a lead screw and the lower pillar may include a female screw member, which may facilitate adjustment of the height of the upper pillar (third arm) with respect to the lower pillar.

The lead screw may include a lead screw driving motor, to be rotated by electric power.

The third arm may include a slider that moves up and down inside the pillar and a sliding support portion may be provided in the pillar, which may allow a height of the third arm with respect to the pillar to be adjustable.

The slider may include a plurality of rollers and the sliding support portion may include a plurality of rails, which may allow the slider to move up and down smoothly.

The plurality of rollers may include a plurality of front rollers disposed on an end portion of the slider adjacent to a cutout portion of the slider and a single rear roller disposed on an end portion of the slider spaced apart from the cutout portion, thereby preventing the slider from being tilted toward the third arm.

The rear roller may have a groove portion recessed inward and the sliding support portion may include a protruding portion protruding to correspond to the groove portion, thereby suppressing an occurrence of a transverse clearance of the slider.

A tilting shaft may be horizontally disposed at one end portion of the first arm and a tilting member may be disposed to be tiltable up and down centering on the tilting shaft, thereby adjusting a tilting angle of a screen of the display unit.

A tilting driving unit may include a driving gear disposed on one of the first arm and the tilting member, a tilting driving motor to rotate the driving gear, and a driven gear engaged with the driving gear. With the configuration, upward and downward tilting of the display unit can be facilitated by electric power.

A first swivel shaft, a fixed gear disposed on an end portion of the first arm, a driving gear coupled to the fixed gear to be relatively movable, and a first swivel driving motor to rotate the driving gear may be provided in a coupling area between the first arm and the second arm, which may allow the first arm to be relatively rotated with respect to the second arm by electric power.

A protrusion, and a protrusion accommodating portion in which the protrusion is accommodated and which is formed to correspond to a rotation trajectory of the protrusion may be provided in the coupling area between the first arm and the second arm, thereby limiting a relative rotation range of the first arm and the second arm.

A second swivel shaft, a fixed gear disposed on an end portion of the second swivel shaft, a driving gear coupled to the fixed gear to be relatively movable, and a second swivel driving motor to rotate the driving gear may be provided in a coupling area between the second arm and the third arm, which may allow the second arm to be relatively rotated with respect to the third arm by using electric power.

The fixing unit may include an upper fixing member placed on an upper surface of a fixing object, a lower fixing member disposed on a lower surface of the fixing object, a pressing member coupled to an upper surface of the lower fixing member to be movable up and down, and a manipulation handle screwed through the lower fixing member and connected to the pressing member, thereby remarkably reducing a size of the upper fixing member disposed on the upper surface of the fixing object.

In addition, a fixed gear formed on the upper fixing member in a circumferential direction, a driving gear coupled to the fixed gear to be relatively movable, and a third swivel driving motor to rotate the driving gear may be provided in a coupling area between the pillar and the upper fixing member, thereby relatively rotating the pillar with respect to the fixing unit by using electric power.

A tilting driving unit for tilting the display unit with respect to the first arm, a height adjusting unit for adjusting a height of the third arm with respect to the pillar, a signal input unit for inputting an operation signal, and a control unit for controlling the tilting driving unit and the height adjusting unit based on an input signal may be provided, thereby facilitating adjustment of height and tilting angle of the display unit.

Also, a first swivel driving unit for rotating the first arm relative to the second arm, a second swivel driving unit for rotating the second arm relative to the third arm, and a third swivel driving unit for rotating the pillar (third arm) relative to the fixing unit may be provided, thereby facilitating adjustment of a distance between the display unit and a user by using electric power.

A camera for capturing a user's posture may be provided, and the control unit may control each of the tilting driving unit, the height adjusting unit, the first swivel driving unit, the second swivel driving unit, and the third swivel driving unit to adjust the user' viewing angle by recognizing the user's basic posture captured by the camera and a changed posture, respectively, thereby appropriately adjusting a viewing angle of the display unit in an automatic manner (using a program) to correspond to the change in the user's posture.

DETAILED DESCRIPTION OF THE EMBODIMENTS

Hereinafter, implementations of the present disclosure will be described in detail with reference to the accompanying drawings. For the sake of brief description with reference to the drawings, the same or equivalent components will be provided with the same reference numbers, and description thereof will not be repeated. A singular representation used herein can include a plural representation unless it represents a definitely different meaning from the context. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

Figure 1:
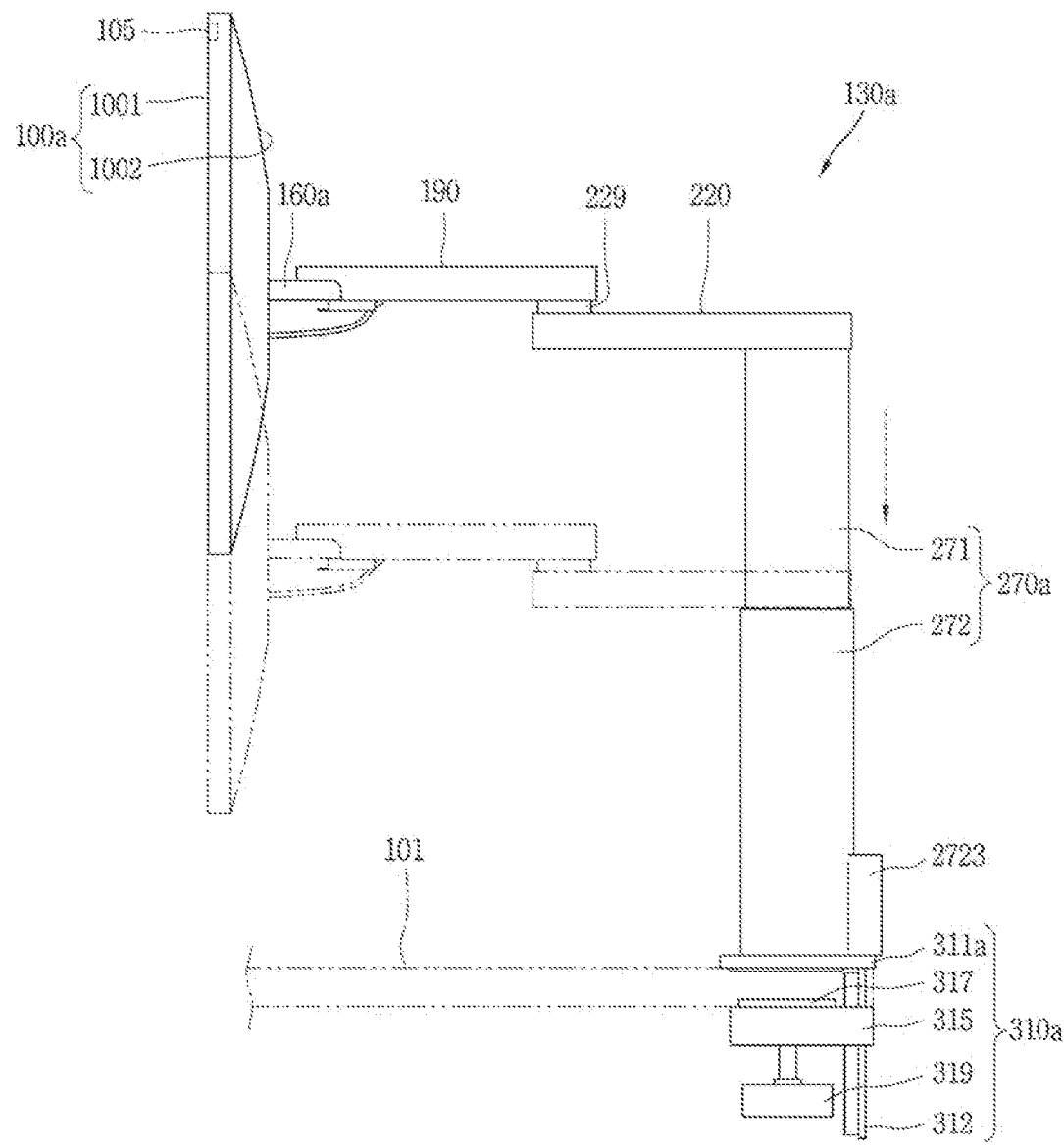
FIG. 1 is a lateral view of a display device in accordance with one implementation of the present disclosure.
Figure 2:
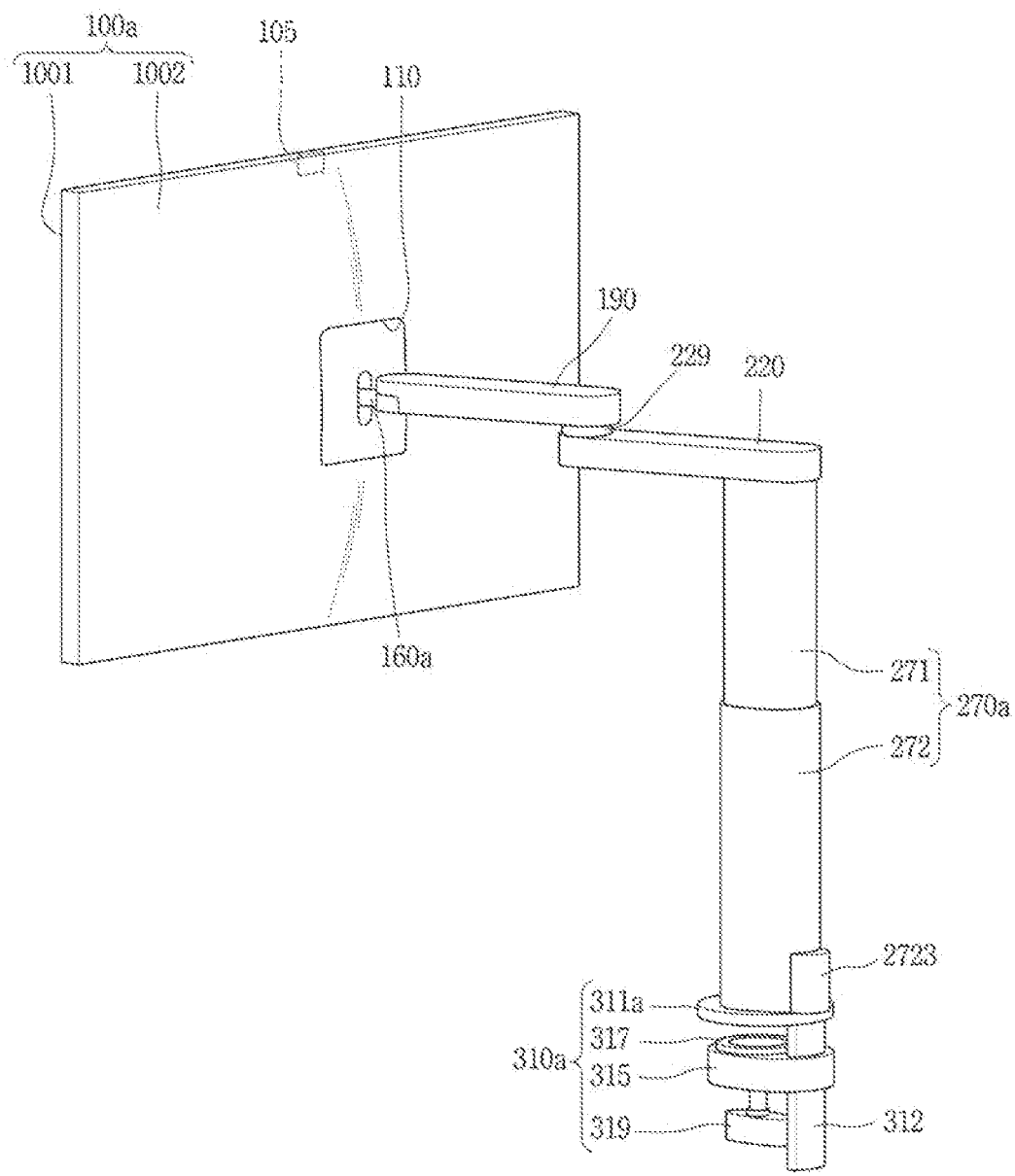
FIG. 2 is a rear perspective view of the display device of FIG. 1 according to an embodiment of the present disclosure.

FIG. 1 is a lateral view of a display device in accordance with one implementation of the present disclosure, and FIG. 2 is a perspective view of the display device of FIG. 1. As illustrated in FIGS. 1 and 2, a display device according to an implementation of the present disclosure can include a display unit 100a, a mounting bracket 140a, a first arm 160a, a second arm 190, a third arm 220, a pillar 270a, and a fixing unit 310a.

The display unit 100a can have a screen disposed on its front surface to display images.

The display unit 100a can include, for example, a display panel 1001 defining the screen, and a cover 1002 surrounding and supporting the display panel 1001.

The display device according to the implementation can include the display unit 100a, and a support device 130a coupled to a rear surface of the display unit 100a to support the display unit 100a such that tilting angle, height, and distance of the display unit 100a are adjusted.

The support device 130a can include a mounting bracket 140a, a first arm 160a, a second arm 190, a third arm 220, a pillar 270a, and a fixing unit 310a.

The mounting bracket 140a, the first arm 160a, the second arm 190, the third arm 220, the pillar 270a, and the fixing unit 310a can be coupled to the rear surface of the display unit 100a to be movable relatively.

Accordingly, since the display unit 100a has a relatively high degree of freedom (more than 5 degrees of freedom), the height, back and forth distance, and vertical tilting angle of the screen of the display unit 100a with respect to the user's eyes can be adjusted, so that an appropriate viewing angle can be easily secured.

The mounting bracket 140a can be fixedly coupled to the rear surface of the display unit 100a, and a front end portion of the first arm 160a can be coupled to be vertically tilted centering on a shaft (tilting shaft) 1603 that is horizontally disposed on the mounting bracket 140a.

A front end portion of the second arm 190 can be coupled to a rear end portion of the first arm 160a to be relatively pivotable centering on a shaft (first swivel shaft 210) that is arranged vertically.

A front end portion of the third arm 220 can be coupled to a rear end portion of the second arm 190 to be relatively pivotable centering on a shaft (second swivel shaft 230) that is arranged vertically.

A rear end portion of the third arm 220 can be coupled to the pillar 270a to be movable up and down.

The pillar 270a can be coupled to the fixing unit 310a to be relatively pivotable centering on a shaft (third swivel shaft 330) that is arranged vertically.

The fixing unit 310a can be fixed to a fixing object 101 (e.g., a top plate of a desk or table).

The fixing unit 310a can be coupled to an edge of the fixing object 101.

The implementation disclosed herein illustrates an example in which the fixing object 101 is formed in a rectangular plate shape and the fixing unit 310a is coupled to a center of a rear side part of the fixing object 101.

The display unit 100a can be formed, for example, in a rectangular parallelepiped shape having two long side portions 1003 and two short side portions 1004.

In general, the display unit 100a can be arranged to have a long length in left and right directions. The two long side portions 1003 of the display unit 100a can be arranged in a horizontal direction and the two short side portions 1004 can be arranged in a vertical (perpendicular) direction.

When the screen of the display unit 100a faces forward, the long side portions 1003 can be arranged in the left and right direction and the short side portions 1004 can be arranged in the vertical direction.

In the implementation disclosed herein, when the screen of the display unit 100a is disposed to face forward, a thickness direction of the display unit 100a can be referred to as a back and forth direction.

In the implementation, the display unit 100a can be configured to pivot between a first position at which the two long side portions 1003 are horizontally arranged and a second position at which the two long side portions 1003 are vertically disposed, about the first arm 160a coupled to the rear surface.

A camera 105 for capturing a user can be provided on a front surface of the display unit 100a. The camera 105 can be disposed, for example, on a central area of an upper edge (long side portion 1003) of the screen of the display unit 100a.

A recessed portion 107 can be in the rear surface of the display unit 100a, and a recessed portion cover 110 can be disposed on the recessed portion 107 to close an opening of the recessed portion 107. One side (front end portion) of the first arm 160a can be coupled through the recessed portion cover 110.

Figure 3:
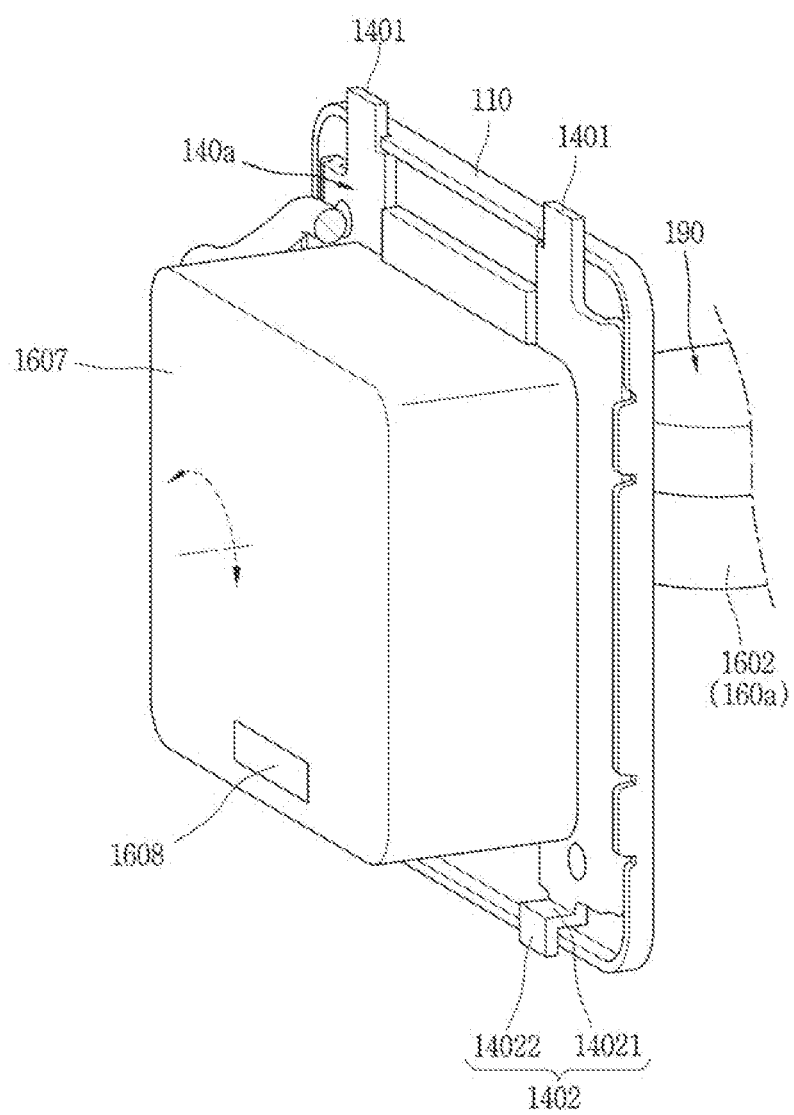
FIG. 3 is an external perspective view illustrating a coupling area between a first arm and a display unit of FIG. 1 according to an embodiment of the present disclosure.
Figure 4:
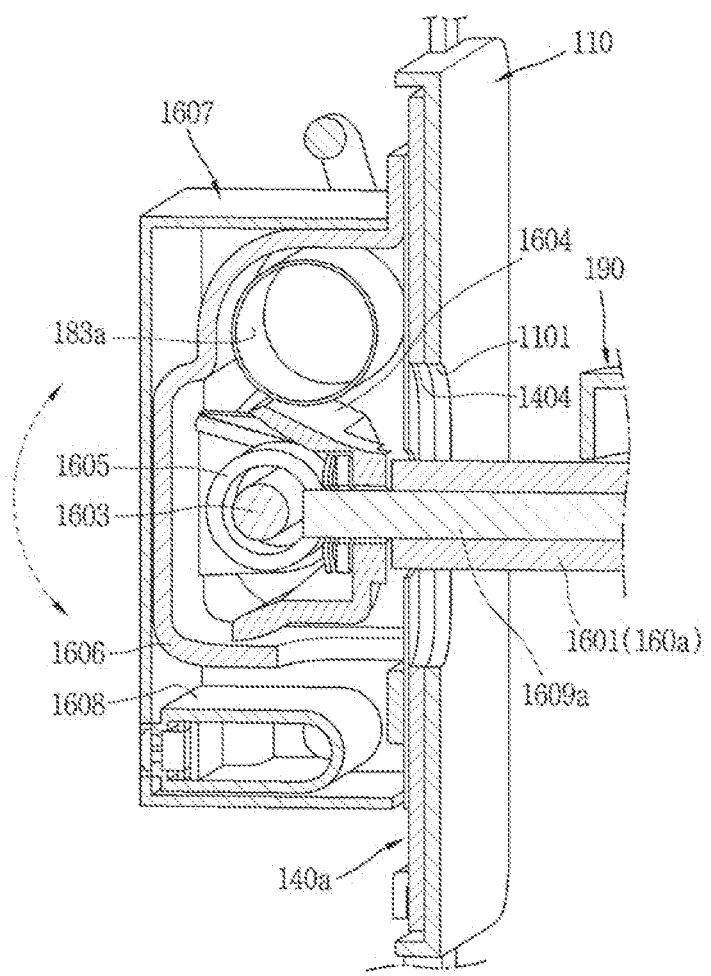
FIG. 4 is a cross-sectional view of FIG. 3 according to an embodiment of the present disclosure.
Figure 5:
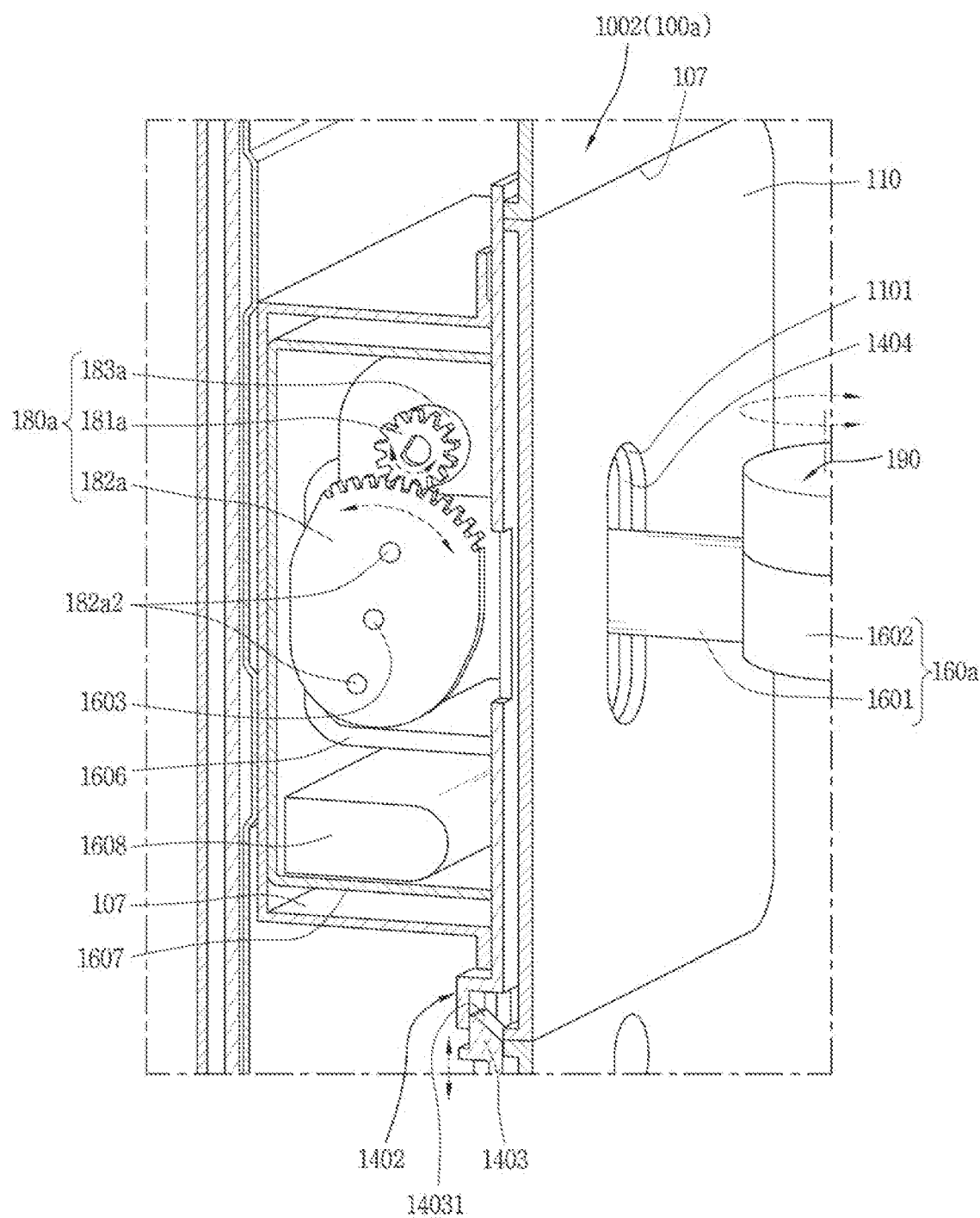
FIG. 5 is a view illustrating a driving gear and a driven gear of FIG. 3 according to an embodiment of the present disclosure.

FIG. 3 is an external perspective view illustrating a coupling area between the first arm and the display unit 110a of FIG. 1, FIG. 4 is a cross-sectional view of FIG. 3, and FIG. 5 is a view illustrating a driving gear and a driven gear of FIG. 3. As illustrated in FIGS. 3 to 5, the mounting bracket 140a can be provided on an inner side of the recessed portion cover 110.

The mounting bracket 140a can have a substantially rectangular plate shape.

The recessed portion cover 110 can be implemented in a rectangular plate shape with a size sufficient to cover the exterior of the mounting bracket 140a.

In the implementation, the display unit 100a and the mounting bracket 140a can be coupled to each other in a snap-fit manner.

Specifically, an upper coupling protrusion 1401 can protrude upwardly from an upper side of the mounting bracket 140a. An upper coupling protrusion groove in which the upper coupling protrusion 1401 is inserted can be formed in an upper side of the recessed portion 107 of the display unit 100a.

An elastic protrusion 1403 that elastically protrudes and retracts can protrude from a lower side of the recessed portion 107 to be disposed at the front of the elastic protrusion 1403. The elastic protrusion 1403 can be disposed at the rear of the lower coupling protrusion 1402 to suppress a rearward separation of the lower coupling protrusion 1402.

The lower coupling protrusion 1402 can include a horizontal section 14021 protruding forward from a lower end of the mounting bracket 140a, and a vertical section 14022 bent downward from the horizontal section 14021. The elastic protrusion 1403 can be disposed below the horizontal section 14021 of the lower coupling protrusion 1402 and behind the vertical section 14022.

Although not specifically shown in the drawings, an elastic protrusion spring can be provided at one side of (below) the elastic protrusion 1403 to apply an elastic force so that the elastic protrusion 1403 protrudes upward. A guide tilted surface 14031 can be formed on an outer surface (rear surface) of the elastic protrusion 1403 to be tilted in a moving direction of the elastic protrusion 1403. The elastic protrusion 1403 can be pushed down when the guide tilted surface 14031 is pressed. On the other hand, when the pressing force is released, the elastic protrusion 1403 can be restored to an initial position, at which it upwardly protrudes, by an elastic force of the elastic protrusion spring.

With the configuration, the mounting bracket 140a can be coupled in a downwardly tilted state to the rear side so that an end portion of the upper coupling protrusion 1401 can be inserted into the upper coupling protrusion groove. A lower side portion of the mounting bracket 140a can rotate downward such that the lower coupling protrusion 1402 is brought into contact with the guide tilted surface 14031 of the elastic protrusion 1403. The vertical section 14022 of the lower coupling protrusion 1402 can thus press the elastic protrusion 1403. When the lower end portion of the vertical section 14022 of the lower coupling protrusion 1402 presses the guide tilted surface 14031, the elastic protrusion 1403 can move downward.

When the vertical section 14022 of the lower coupling protrusion 1402 passes the elastic protrusion 1403, the mounting bracket 140a can be brought into contact with the rear surface of the display unit 100a. When a pressing force applied to the elastic protrusion 1403 is released after the vertical section 14022 of the lower coupling protrusion 1402 passes the elastic protrusion 1403, the elastic protrusion 1403 can protrude upward and return to its initial position. At this time, the elastic protrusion 1403 can be located below the horizontal section 14021 of the lower coupling protrusion 1402 and behind the vertical section 14022, so that the mounting bracket 140a can be suppressed from being unexpectedly separated from the display unit 100a.

Accommodation holes 1101 and 1404 can be formed through recessed portion cover 110 and the mounting bracket 140a, respectively. Accordingly, the first arm 160a can be accommodated in the accommodation holes 1101 and 1404 to be relatively movable.

Each of the accommodation holes 1101 and 1404 can be formed to have a long length vertically to correspond to a relative movement trajectory of the first arm 160a when the display unit 100a is tilted up and down.

In the implementation, the first arm 160a can include, for example, a first arm body 1601, and a second arm connecting portion 1602 formed on one end portion (rear end portion) of the first arm body 1601 to be connected to the second arm 190.

The first arm body 1601 can have, for example, a rod shape.

The second arm connecting portion 1602 can be expanded compared to the first arm body 1601 to correspond to the size of the second arm 190, for example.

As illustrated in FIG. 4, a tilting shaft 1603 can be provided on the front end portion of the first arm 160a.

The tilting shaft 1603 can be disposed to be perpendicular to the first arm 160a.

The tilting shaft 1603 can be disposed in the horizontal direction.

When the first arm 160a is disposed in the back and forth direction of the fixing object 101, the tilting shaft 1603 can be disposed in the left and right direction of the fixing object 101.

The tilting shaft 1603 can be spaced apart from the front end portion of the first arm 160a, for example.

A pivot shaft 1609a that can pivot with respect to the first arm body 1601 can be provided in the front end portion of the first arm 160a.

Accordingly, the display unit 100a can pivot along a plate surface direction about the first arm 160a (the first arm body 1601).

The pivot shaft 1609a can protrude to the front of the first arm body 1601.

The pivot shaft 1609a can be coupled to the center of the first arm body 1601 to be relatively pivotable.

A tilting shaft support member 1604 for supporting the tilting shaft 1603 can be provided on the front end portion of the first arm 160a (the first arm body 1601).

The tilting shaft support member 1604 can have a shape with one side (front) open.

The tilting shaft support member 1604 can be coupled to the pivot shaft 1609a.

Accordingly, the tilting shaft support member 1604 can pivot about the pivot shaft 1609a.

The pivot shaft 1609a can be configured, for example, to pivot between a first position at which the long side portion 1003 of the display unit 100a is horizontally disposed and a second position at which the long side portion 1003 of the display unit 100a is vertically disposed.

The tilting shaft 1603 can be supported by the tilting shaft support member 1604 while being spaced apart from the pivot shaft 1609a.

An elastic member 1605 can be provided between the tilting shaft 1603 and the tilting shaft support member 1604. When the display unit 100a rotates downward, the elastic member 1605 can be compressed to accumulate elastic force.

The elastic member 1605 can be implemented as, for example, a torsion coil spring.

Accordingly, when the display unit 100*a* rotates upward, the display unit 100*a* can easily rotate upward by virtue of the elastic force accumulated in the elastic member 1605.

In addition, driving force required for the upward rotation of the display unit 100*a* can be reduced.

The tilting shaft 1603 can be provided with a tilting member 1606 that can be tilted up and down about the tilting shaft 1603.

The tilting member 1606 can rotate upward and downward centering on the tilting shaft 1603.

The tilting member 1606 can have an inner accommodation space.

The tilting member 1606 can have an open rear end portion.

The tilting member 1606 can include a tilting arm 16061 coupled to the tilting shaft 1603. The tilting arm 16061 can protrude backward from an inner surface of the tilting member 1606. The tilting arm 16061 can be provided with a tilting shaft hole in which the tilting shaft 1603 is accommodated to be relatively rotatable.

A front end portion of the tilting member 1606 can be coupled to the rear surface of the mounting bracket 140*a* in a contacting manner.

A tilting case 1607 can be provided outside the tilting member 1606.

The tilting case 1607 can have a larger size than the tilting member 1606 so that the tilting member 1606 can be accommodated therein.

The tilting case 1607 can accommodate the recessed portion 107 of the display unit The tilting case 1607 can be implemented, for example, in a rectangular parallelepiped shape in which an accommodation space opened rearward is defined.

A rear end portion of the tilting case 1607 can be coupled to the mounting bracket 140*a*.

A connector 1608 can be provided inside the tilting case 1607.

The connector 1608 can be disposed below the tilting member 1606 inside the tilting case 1607.

The connector 1608 can be connected to another connector that is provided in the recessed portion 107 of the display unit 100*a* when the tilting case 1607 is inserted into the recessed portion 107 of the display unit 100*a*.

Accordingly, the display unit 100*a* can be electrically connected to another electronic device. More specifically, the display device according to the implementation can be configured as a monitor (display) of a personal computer, and the electronic device can be configured as a main body of the personal computer. As the connector 1608 is connected, the display device can be electrically connected to the main body of the personal computer to perform communication with the personal computer.

Meanwhile, a tilting driving unit 180*a* can be disposed at the tilting member 1606 and the first arm 160*a* to allow the tilting member 1606 to be tilted up and down based on the tilting shaft 1603.

The tilting driving unit 180*a* can include a driving gear 181*a* disposed on any one of the tilting member 1606 and the first arm 160*a*, a driven gear 182*a* disposed on another one of the tilting member 1606 and the first arm 160*a* to be engaged with the driving gear 181*a*, and a tilting driving motor 183*a* rotating the driving gear 181*a*.

The tilting member 1606 can be provided with the tilting driving motor 183*a*.

The tilting driving motor 183*a* can be disposed at an upper side of the tilting shaft support member 1604 inside the tilting member 1606.

The tilting driving motor 183*a* can have a rotating shaft that is disposed parallel to the tilting shaft 1603.

The driving gear 181*a* can be provided on the rotating shaft of the tilting driving motor 183*a*.

The driving gear 181*a* can be, for example, implemented as a spur gear having a tooth portion protruding from a circumference in a radial direction.

The driven gear 182*a* can be provided on the tilting shaft 1603, for example.

As illustrated in FIG. 5, the driven gear 182*a* can be implemented as a sector gear that is formed on an arcuate portion spaced apart from the tilting shaft 1603 by a preset distance and forms a preset internal angle between both ends.

The driven gear 182*a* can be configured to be fixedly supported by, for example, the tilting shaft 1603 and the tilting shaft support member 1604.

A plurality of protrusions 182*a*2 protruding from the tilting shaft 1603 and the tilting shaft support member 1604 can be inserted into the driven gear 182*a*.

In the implementation, a tooth portion of the driven gear 182*a* can be disposed above the tilting shaft 1603, and the driving gear 181*a* can be provided in an upper portion of the tilting member 1606 to be engaged with the tooth portion of the driven gear 182*a*.

The driving gear 181*a* can be coupled to be disposed at the center of the tooth portion of the driven gear 182*a* when the screen of the display unit 100*a* is disposed in the up and down (vertical) direction. Accordingly, the driving gear 181*a* can move up and down along the driven gear 182*a*.

With the configuration, when the driving gear 181*a* rotates in a clockwise direction in the drawing, the driving gear 181*a* can move downward in the clockwise direction along the tooth portion of the driven gear 182*a*, and the tilting member 1606 can rotate upward centering on the tilting shaft 1603, so that the screen of the display unit 100*a* faces upward. On the other hand, when the driving gear 181*a* rotates in a counterclockwise direction in the drawing, the driving gear 181*a* can move upward along the tooth portion of the driven gear 182*a*, and the tilting member 1606 can rotate downward centering on the tilting shaft 1603, so that the screen of the display unit 100*a* faces downward.

Figure 6:
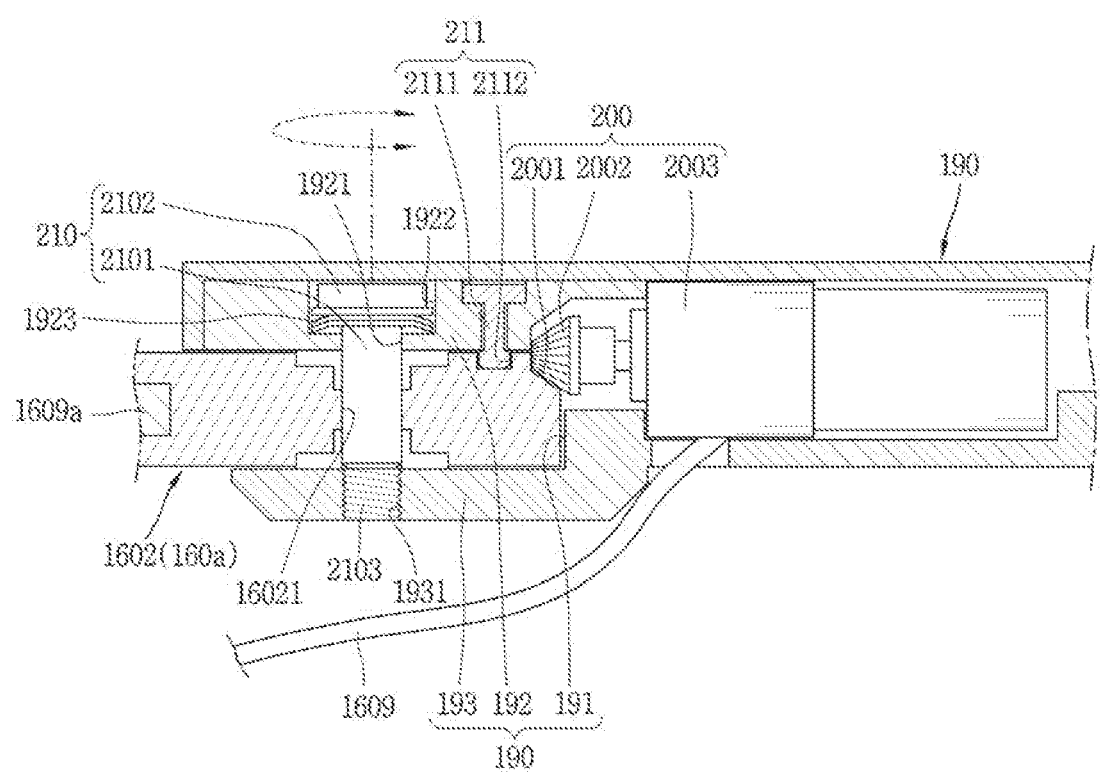
FIG. 6 is a cross-sectional view illustrating a coupling area between the first arm and a second arm of FIG. 1 according to an embodiment of the present disclosure.
Figure 7:
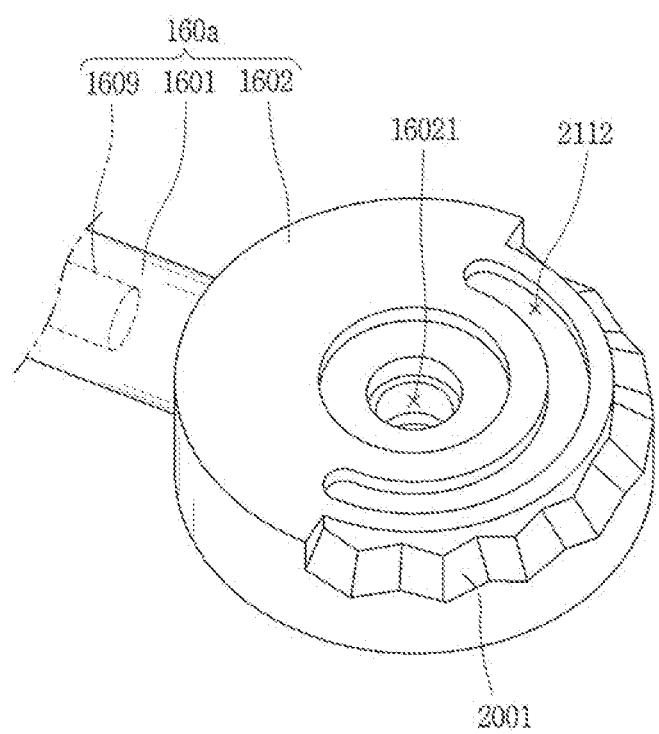
FIG. 7 is a partial perspective view of the first arm of FIG. 6 according to an embodiment of the present disclosure.

FIG. 6 is a cross-sectional view illustrating a coupling area between the first arm and the second arm of FIG. 1, and FIG. 7 is a partial perspective view of the first arm of FIG. 6. As illustrated in FIG. 6, the first arm 160*a* and the second arm 190 can be coupled to overlap each other vertically.

A first swivel shaft 210 can be provided in an overlapping area of the first arm 160*a* and the second arm 190.

Accordingly, the first arm 160*a* and the second arm 190 can rotate relative to each other centering on the first swivel shaft 210.

In the implementation, the first swivel shaft 210 can be fixed to the second arm 190 and coupled to rotate relative to the first arm 160*a*.

Accordingly, the first arm 160*a* can rotate relative to the second arm 190 centering on the first swivel shaft 210.

The second arm connecting portion 1602 connected to the second arm 190 can be provided on the rear end portion of the first arm 160*a*.

The second arm connecting portion 1602 can be implemented in a disk shape, for example, as illustrated in FIG. 7.

The first swivel shaft hole 16021 can be formed through the second arm connecting portion 1602 so that the first swivel shaft 210 can be accommodated to be relatively movable.

The rear end portion (the second arm connecting portion 1602) of the first arm 160a can be accommodated in the second arm 190 to be relatively movable.

The second arm 190 can be provided with a first arm accommodating part 191 in which the first arm 160a is accommodated to be relatively movable.

The first arm accommodating part 191 can be open to one side (the front) of the second arm 190.

The second arm 190 can include, for example, an upper support part 192 in contact with an upper side of the first arm 160a and a lower support part 193 in contact with a lower side of the first arm 160a.

The first arm accommodating part 191 can be recessed between the upper support part 192 and the lower support part 193.

The first swivel shaft 210 can include, for example, a shaft body 2101, a head 2102 formed on one end portion of the shaft body 2101, and a male screw portion 2103 formed on another end portion of the shaft body 2101.

A first swivel shaft accommodation hole 1921 in which the first swivel shaft 210 is accommodated can be formed through the upper support part 192 of the second arm 190. A head accommodating portion 1922 that extends to accommodate the head 2102 of the first swivel shaft 210 can be formed in the upper support part 192.

A frictional force generating member 1923 for increasing frictional force upon coupling the first swivel shaft 210 can be provided in the head accommodating portion 1922. The frictional force generating member 1923 can include, for example, a washer and/or a spring washer.

A female screw portion 1931 can be formed in the lower support part 193 of the second arm 190 to allow the male screw portion 2103 of the first swivel shaft 210 to be coupled.

A first swivel driving unit 200 that allows the first arm 160a to swivel relative to the second arm 190 about the first swivel shaft 210 can be provided in a coupling area between the first arm 160a and the second arm 190.

The first swivel driving unit 200 can include a first swivel shaft 210 coupled to the second arm 190 to be movable relative to the first arm 160a, a fixed gear 2001 disposed on an end portion of the first arm 160a in a circumferential direction, a driving gear 2002 engaged with the fixed gear 2001 to be relatively movable, and a first swivel driving motor 2003 to rotate the driving gear 2002.

Accordingly, the display unit 100a connected to the first arm 160a can swivel to left and right centering on the first swivel shaft 210.

The first swivel driving motor 2003 can be provided on the second arm 190, for example.

A rotating shaft of the first swivel driving motor 2003 can be disposed along a longitudinal direction of the second arm 190.

The fixed gear 2001 can be formed on the second arm connecting portion 1602 of the first arm 160a in the circumferential direction.

The fixed gear 2001 can be, for example, provided on an upper surface of the second female connecting portion 1602.

The fixed gear 2001 can be tilted with respect to the first swivel shaft 210.

The fixed gear 2001 can be tilted at about 45 degrees with respect to the first swivel shaft 210.

The driving gear 2002 can be tilted with respect to the rotating shaft of the first swivel driving motor 2003.

The driving gear 2002 can be tilted at about 45 degrees with respect to the rotating shaft of the first swivel driving motor 2003.

The fixed gear 2001 can have an internal angle between both end portions that is about 180 degrees or smaller.

Accordingly, when the driving gear 2002 rotates, the fixed gear 2001 can relatively rotate centering on the first swivel shaft 210, and the display unit 100a can swivel to left and right centering on the first swivel shaft 210.

A stopper 211 for limiting a relative rotation range of the first arm 160a and the second arm 190 can be provided in the coupling area between the first arm 160a and the second arm 190.

The stopper 211 can include, for example, a stopper protrusion 2111 protruding in an axial direction from one of contact surfaces of the first arm 160a and the second arm 190, and a stopper protrusion accommodating portion 2112 formed in another contact surface to accommodate an end portion of the stopper protrusion 2111 and formed to correspond to a relative rotation trajectory of the stopper protrusion 2111.

In the implementation, the stopper protrusion accommodating portion 2112 can be provided at an upper side of the fixed gear 2001.

The stopper protrusion accommodating portion 2112 can have a smaller rotation radius than a rotation radius of the fixed gear 2001.

Accordingly, when viewed from a top of the second arm connecting portion 1602, the stopper protrusion accommodating portion 2112 can be disposed at an inner side of the fixed gear 2001.

With the configuration, when the driving gear 2002 is disposed at the center in the circumferential direction of the fixed gear 2001, the first arm 160a can be disposed on an extension line of the second arm 190.

When the driving gear 2002 rotates in one direction (counterclockwise), the fixed gear 2001 can rotate clockwise centering on the first swivel shaft 210, and the display unit 100a can also rotate clockwise centering on the first swivel shaft 210.

Figure 8:
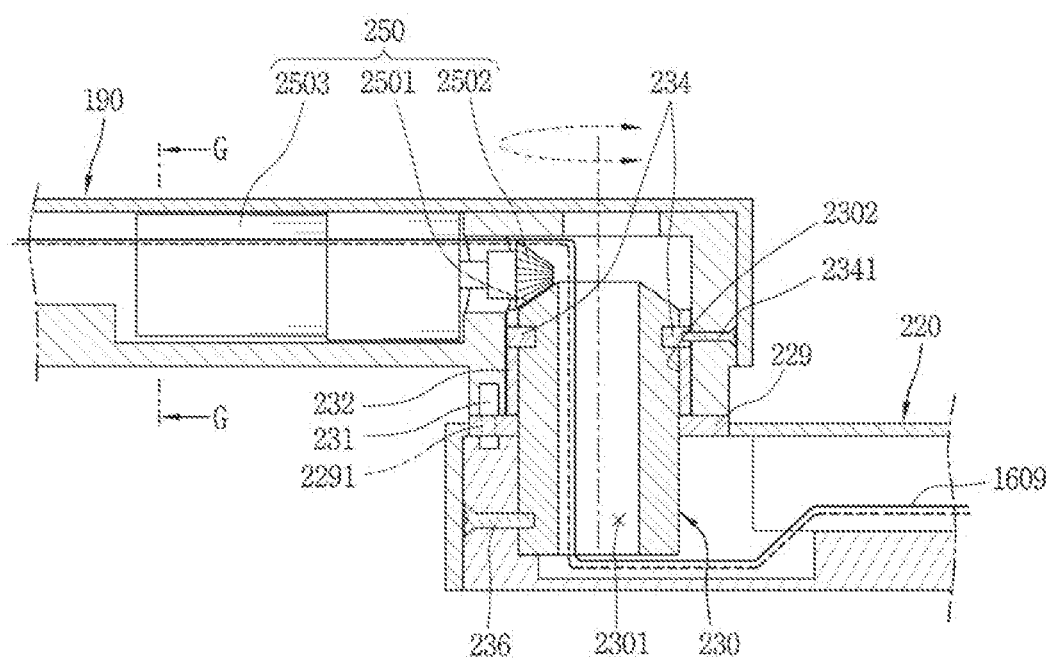
FIG. 8 is a cross-sectional view illustrating a coupling area between the second arm and a third arm of FIG. 1 according to an embodiment of the present disclosure.
Figure 9:
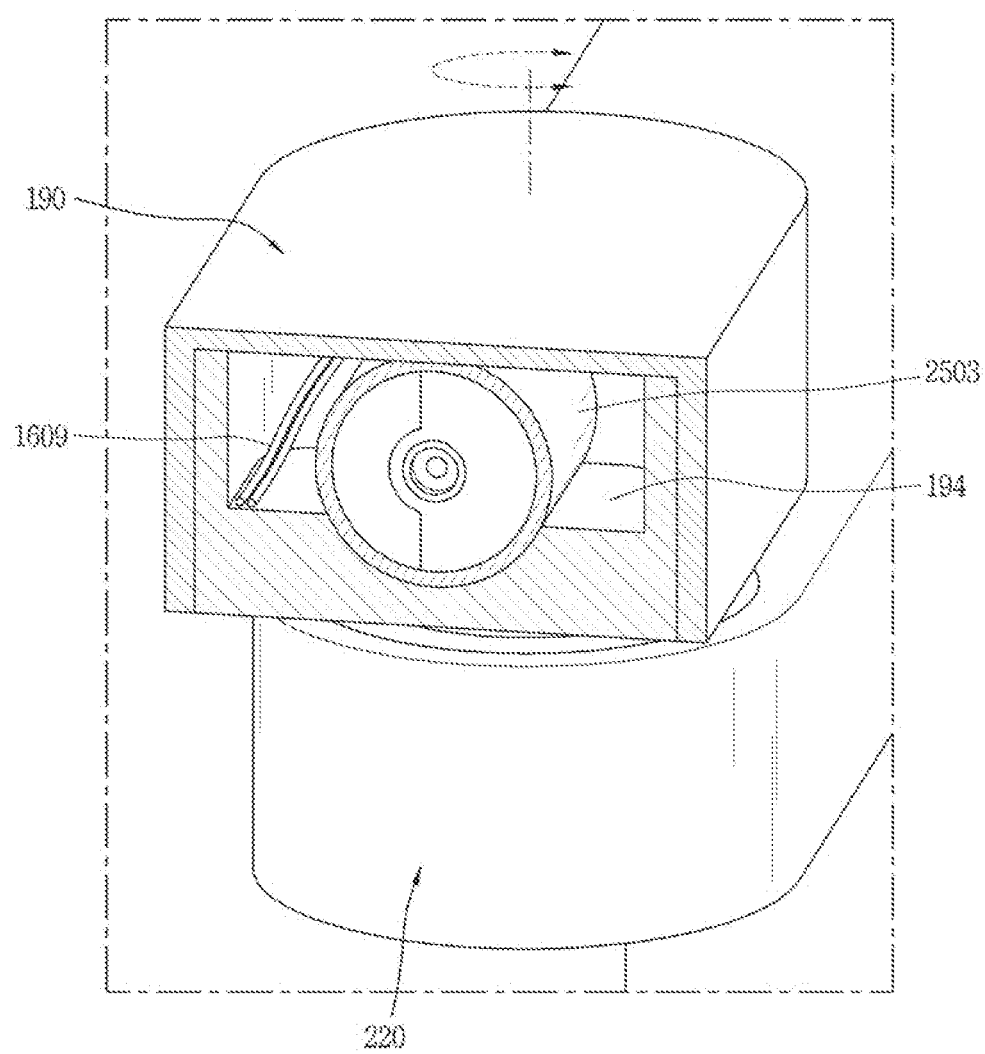
FIG. 9 is a partial cross-sectional view illustrating the inside of the second arm of FIG. 8 according to an embodiment of the present disclosure.

FIG. 8 is a cross-sectional view illustrating a coupling area between the second arm and the third arm of FIG. 1, and FIG. 9 is a partial perspective view illustrating an inside of the second arm of FIG. 8. As illustrated in FIGS. 8 and 9, the second swivel shaft 230 can be provided in the coupling area between the second arm 190 and the third arm 220.

Accordingly, the second arm 190 and the third arm 220 can rotate (swivel) relative to each other centering on the second swivel shaft 230.

In the implementation, the second arm 190 and the third arm 220 can be coupled to overlap each other in the vertical direction.

The second arm 190 can be coupled to an upper side of the third arm 220, for example.

A rear end portion of the second arm 1909 can be coupled to an upper side of a front end portion of the third arm 220.

A spacer 229 can be provided at an overlapping area of the second arm 190 and the third arm 220. Accordingly, the second arm 190 can be supported with being spaced apart from the upper side of the third arm 220.

The second arm 190 can be provided with a rotation preventing protrusion 231 that limits a relative rotation range of the second arm 190.

The spacer 229 can be provided with a rotation preventing protrusion groove 2291 that limits a rotation range of the rotation preventing protrusion 231.

One end portion (a lower end portion in the drawing) of the second swivel shaft 230 can be located inside the third arm 220, and another end portion (an upper end portion) of the second swivel shaft 230 can be located in the second arm 190.

The second swivel shaft 230 can be fixedly coupled to the third arm 220.

The second swivel shaft 230 can be coupled to rotate relative to the second arm 190.

A bush 232 for rotatably supporting the second swivel shaft 230 can be provided on the second arm 190.

A screw 236 that has one end portion inserted into the second swivel shaft 230 in the radial direction can be coupled to the third arm 220. Accordingly, the second swivel shaft 230 can be fixed to the third arm 220.

The second swivel shaft 230 can be provided with a through portion 2301 formed through its inner center in the axial direction.

A cable 1609 can be disposed in the second swivel shaft 230.

A separation preventing protrusion 234 that is coupled to the second swivel shaft 230 to be relatively movable can be provided in the second arm 190.

The separation preventing protrusion 234 can be fixed to the second arm 190 by a screw 2341.

The second swivel shaft 230 can be provided with a separation preventing protrusion groove 2302 that is recessed to correspond to a relative rotation trajectory of the separation preventing protrusion 234.

The separation preventing protrusion groove 2302 can be recessed into an outer surface of the second swivel shaft 230 in the radial direction and extend in the circumferential direction.

Accordingly, the second arm 190 can relatively rotate centering on the second swivel shaft 230, and also can be prevented from being unexpectedly separated from the second swivel shaft 230.

A second swivel driving unit 250 for relatively swiveling the second arm 190 can be provided in a coupling area between the second arm 190 and the third arm 220.

The second swivel driving unit 250 can include a second swivel shaft 230 having one end portion disposed in the third arm 220 and another end portion disposed in the second arm 190, a fixed gear 2501 formed on the one end portion of the second swivel shaft 230 to be tilted in the axial direction, a driving gear 2502 engaged with the fixed gear 2501 to be relatively movable, and a second swivel driving motor 2503 to rotate the driving gear 2502.

The fixed gear 2501 can be, for example, provided on an upper end of the second swivel shaft 230.

The fixed gear 2501 can be disposed on the upper end of the second swivel shaft 230 to be downwardly tilted toward the outside at a preset angle (e.g., 45 degrees).

The second swivel driving motor 2503 can be provided on the second arm 190, for example.

As illustrated in FIG. 9, a second swivel driving motor accommodating part 194 in which the second swivel driving motor 2503 is accommodated can be formed inside the rear end portion of the second arm 190.

The cable 1609 can be accommodated in the second swivel driving motor accommodating part 194.

The driving gear 2502 can be disposed on a rotating shaft of the second swivel driving motor 2503.

The driving gear 2502 can be formed on the rotating shaft of the second swivel driving motor 2503 to be tilted at a preset angle (e.g., 45 degrees).

With the configuration, when the driving gear 2502 rotates in one direction (clockwise), the driving gear 2502 can move counterclockwise along the circumferential direction of the second swivel shaft 230. Accordingly, the second arm 190 can rotate counterclockwise relative to the third arm 220 centering on the second swivel shaft 230.

Figure 10:
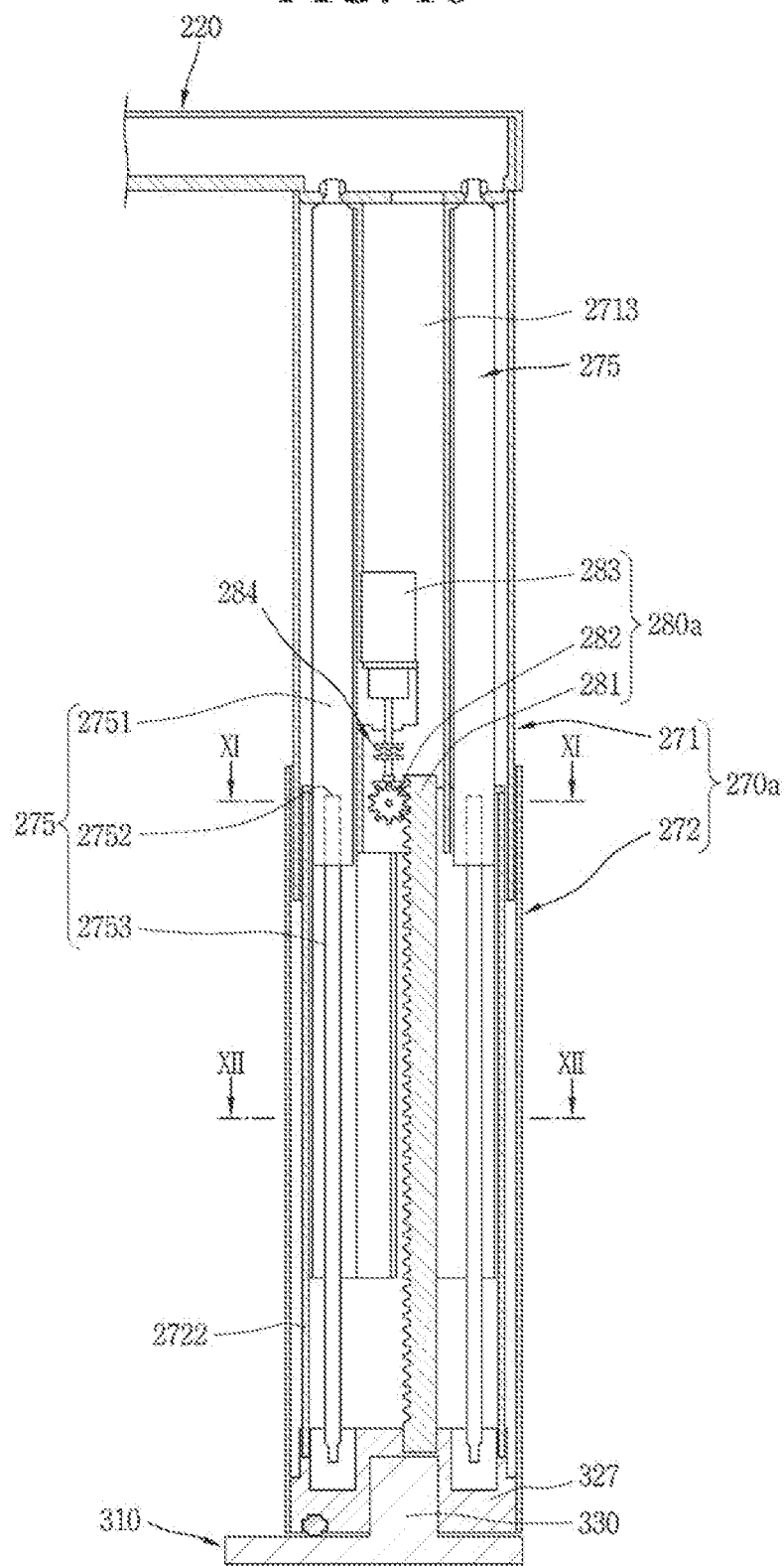
FIG. 10 is a cross-sectional view illustrating the inside of a pillar of FIG. 1 according to an embodiment of the present disclosure.
Figure 11:
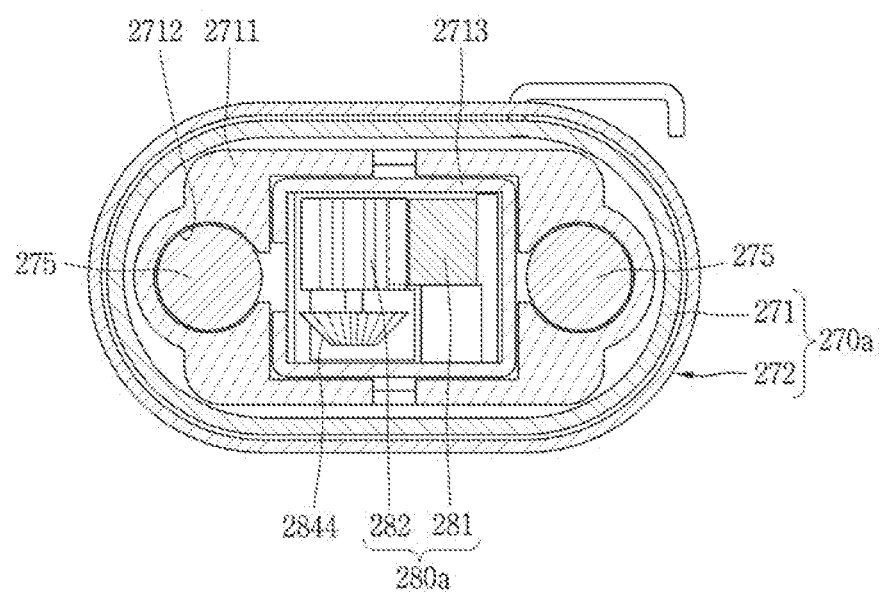
FIG. 11 is a cross-sectional view illustrating an upper pillar of FIG. 10 according to an embodiment of the present disclosure.
Figure 12:
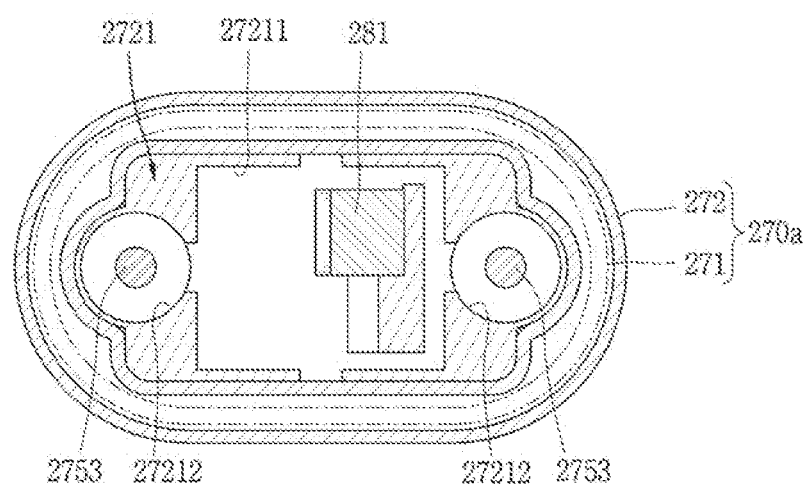
FIG. 12 is a cross-sectional view illustrating a lower pillar of FIG. 10 according to an embodiment of the present disclosure.
Figure 13:
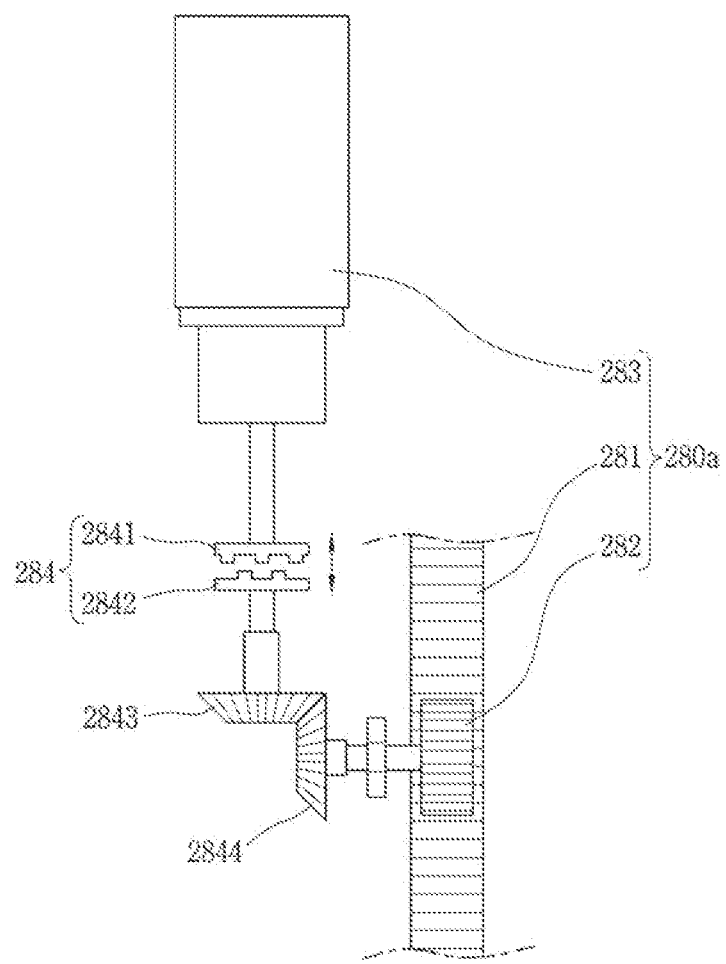
FIG. 13 is a schematic view illustrating a structure of a clutch of FIG. 11 according to an embodiment of the present disclosure.

FIG. 10 is a cross-sectional view illustrating an inside of a pillar of FIG. 1, FIG. 11 is a cross-sectional view illustrating an upper pillar of FIG. 10, FIG. 12 is a cross-sectional view illustrating a lower pillar of FIG. 10, and FIG. 13 is a schematic view illustrating a structure of a clutch of FIG. 11.

As illustrated in FIG. 10, the pillar 270a can include a lower pillar 272 connected to the fixing unit 310a, and an upper pillar 271 disposed to be movable up and down with respect to the lower pillar 272.

The third arm 220 can be provided on the upper pillar 271.

The third arm 220 can be provided on an upper end of the upper pillar 271.

In the implementation, the rear end portion of the third arm 220 can be coupled to the upper end of the upper pillar 271.

Accordingly, the height of the third arm 220 can be adjusted as the upper pillar 271 moves up and down.

The third arm 220 can be disposed perpendicularly to the pillar 270a.

The pillar 270a can be arranged in the vertical direction and the third arm 220 can be arranged in the horizontal direction.

The pillar 270a can be provided with an elastic member 275 that is compressed when the upper pillar 271 moves down to accumulate elastic force.

Accordingly, when the upper pillar 271 moves up, driving force required for pushing up the upper pillar 271 can be reduced by the elastic force of the elastic member 275.

The elastic member 275 can be implemented as, for example, a gas spring 275.

The gas spring 275 can be provided by two disposed side by side with each other.

Each of the elastic member 275 (gas spring) can include, for example, a cylinder 2751, a piston 2752 provided in the cylinder 2751, and a piston rod 2753 connected to the piston 2752 and extending to the outside of the cylinder 2751.

In the implementation, one end portion of the elastic member 275 (gas spring) can be fixed to the lower pillar 272 and another end portion of the elastic member 275 (gas spring) can be fixed to the upper pillar 271.

More specifically, the cylinder 2751 of the gas spring 275 can be fixed to the upper pillar 271 and the piston rod 2753 can be fixed to the lower pillar 272.

The upper pillar 271 can be, for example, inserted into the lower pillar 272.

The upper pillar 271 and the lower pillar 272 each can have an elliptical cross-section.

The upper pillar 271 can be slid with its outer surface brought into contact with an inner surface of the lower pillar 272.

As illustrated in FIG. 11, an upper frame 2711 can be provided in the upper pillar 271.

The upper frame 2711 can be provided with a gas spring accommodating portion 2712 in which the gas spring 275 is accommodated.

An upper guide 2713 can be provided in a center of the upper frame 2711.

The upper guide 2713 can have a substantially rectangular cross-section.

The upper guide 2713 can be implemented as a square tube having an inner accommodation space.

The upper guide 2713 can be disposed between the gas springs 275.

As illustrated in FIG. 12, a lower frame 2721 can be provided in the lower pillar 272.

A lower guide 2722 that is inserted into the upper pillar 271 to guide the upper pillar 271 can be provided outside the lower frame 2721.

The lower frame 2721 can be provided in the lower guide 2722.

An upper guide support portion 27211 for slidably supporting the upper guide 2713 can be formed through the lower frame 2721.

Gas spring support portions 27212 for slidably supporting the gas springs 275 can be formed through the lower frame 2721.

The piston rods 2753 of the gas springs 275 can be accommodated in the gas spring support portions 27212, respectively.

Meanwhile, the pillar 270a can be provided with a height adjusting unit 280a for adjusting the height of the third arm 220.

This can result in adjusting the height of the display unit 100a.

The height adjusting unit 280a can include a rack tooth part 281 provided in the lower pillar 272, a pinion 282 rotating with being engaged with the rack tooth part 281, and a pinion driving motor 283 for rotating the piston 282.

The rack tooth part 281 can be disposed in the upper guide support portion 27211.

The rack tooth part 281 can extend into the upper guide 2713.

The pinion 282 can be provided in the upper pillar 271.

The pinion 282 can be provided on the upper guide 2713.

The pinion driving motor 283 for rotating the pinion 282 can be provided in the upper pillar 271.

Meanwhile, a clutch 284 for selectively transmitting rotational force of the pinion driving motor 283 to the pinion 282 can be provided between the pinion driving motor 283 and the pinion 282.

Accordingly, in a state in which power transmission between the pinion driving motor 283 and the pinion 282 is suppressed by the clutch 284, the upper pillar 271 can be manually moved up and down relative to the lower pillar 272.

As illustrated in FIG. 13, the clutch 284 can include, for example, a first clutch 2841 coupled to a rotating shaft of the pinion driving motor 283, and a second clutch 2842 movable toward or away from the first clutch 2841.

A first gear 2843 and a second gear 2844 that are engaged with each other at a right angle can be provided at one side of the second clutch 2842. The second clutch 2842 can be movable toward or away from the first gear 2843. The second clutch 2842 can be moved away from the first gear 2843 to be engaged with the first clutch 2841. Accordingly, the rotational force of the pinion driving motor 283 can be transmitted to the pinion 282.

The second gear 2844 and the pinion 282 can be coupled to the same rotating shaft.

When the second clutch 2842 is engaged with the first clutch 2841, the rotational force of the pinion driving motor 283 can be transmitted to the pinion 282 sequentially through the first clutch 2841, the second clutch 2842, and the first gear 2843, and the second gear 2844.

When the second clutch 2842 is separated from the first clutch 2841, the pinion driving motor 283 and the pinion 282 can also be separated from each other, and thus the pinion 282 can be free to rotate.

With the configuration, when the pinion 282 rotates in one direction (counterclockwise), the pinion 282 can move downward along the rack tooth part 281. Accordingly, the upper pillar 271 and the third arm 220 can move downward. At this time, each of the gas springs 275 can accumulate an elastic force while being compressed.

When the pinion 282 rotates in another direction (clockwise), the pinion 282 can move upward along the rack tooth part 281, and at this time, the upper pillar 271 and the third arm 220 can move upward. In this case, the upward movement of the upper pillar 271 and the third arm 220 can be facilitated by the accumulated elastic force of each gas spring 275. In addition, an input current of the pinion driving motor 283 can be significantly reduced.

Figure 14:
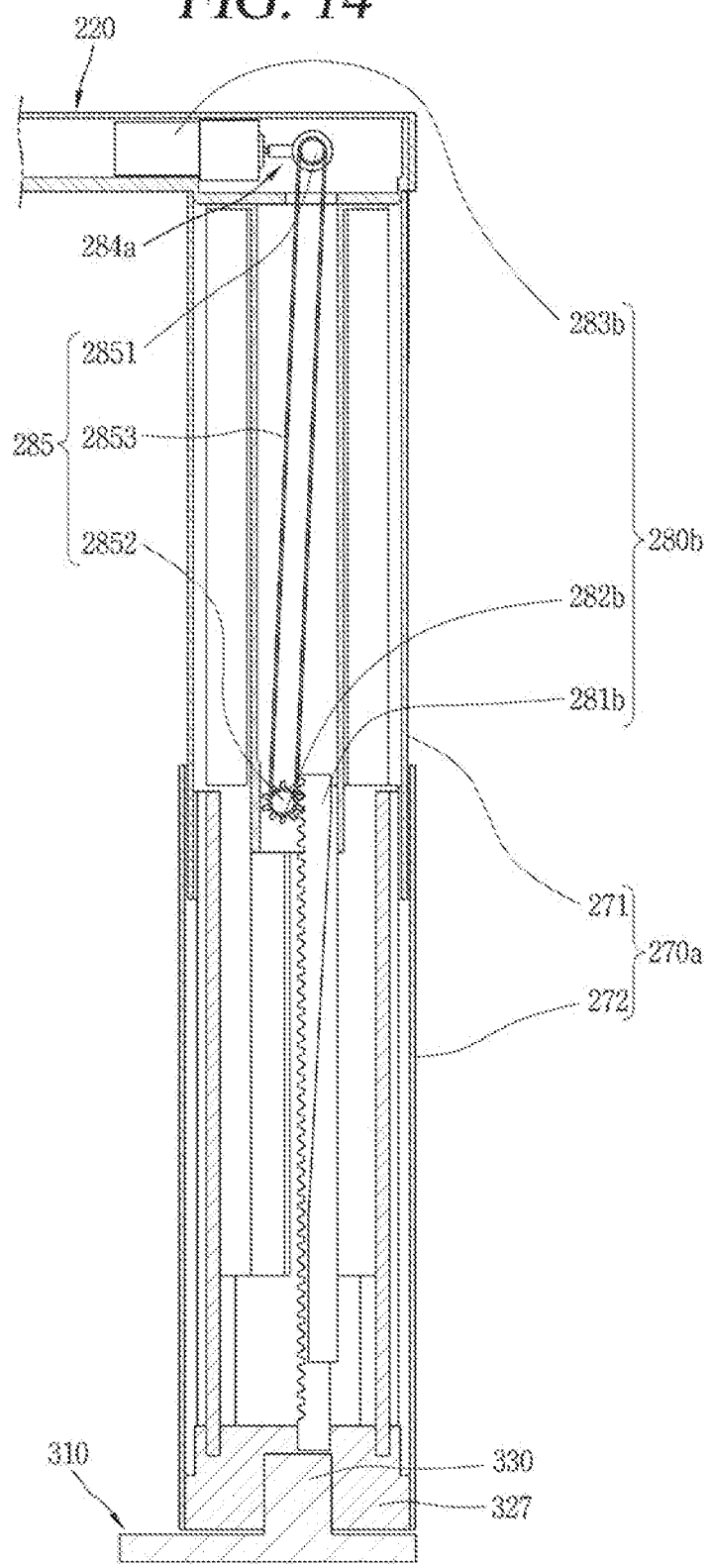
FIG. 14 is a view illustrating a modified example of a height adjusting unit of FIG. 10 according to an embodiment of the present disclosure.

FIG. 14 is a view illustrating a modified example of the height adjusting unit of FIG. 10. As illustrated in FIG. 14, a height adjusting unit 280b of a display device according to an implementation can include a rack tooth part 281b provided in the lower pillar 272, a pinion 282b provided in the upper pillar 271 and engaged with the rack tooth part 281b, and a pinion driving motor 283b for rotating the pinion 282b.

The pinion 282b can be rotatably disposed in the upper guide 2713.

The pinion driving motor 283b can be provided in the second arm 220, for example.

A power transmission unit 285 for transmitting rotational force of the pinion driving motor 283b to the pinion 282b can be provided between the pinion driving motor 283b and the pinion 282b.

The power transmission unit 285 can include, for example, a driving pulley 2851 connected to a rotating shaft of the pinion driving motor 283b, a driven pulley 2852 connected to the pinion 282b, and a belt 2853 rotatably coupled to the driven pulley 2852.

In the implementation, a clutch 284a disposed between the rotating shaft of the pinion driving motor 283b and the driving pulley 2851 to selectively transmitting the rotational force of the pinion driving motor 283b.

Accordingly, in a state in which the connection between the pinion driving motor 283b and the pinion 282b is released by the clutch 284a, the upper pillar 271 and the third arm 220 can be manually moved up and down relative to the lower pillar 282.

With the configuration, when the pinion 282b rotates counterclockwise by the pinion driving motor 283b, the pinion 282b can move downward along a tooth portion of the rack tooth part 281b.

Accordingly, the upper pillar 271 and the third arm 220 can move downward.

When the pinion 282b is rotated clockwise by the pinion driving motor 283b, the pinion 282b can move upward along the tooth portion of the rack tooth part 281b. Accordingly, the upper pillar 271 and the third arm 220 can move upward relative to the lower pillar 272.

In this case, the upward movement of the upper pillar 271 and the third arm 220 can be facilitated by the accumulated elastic force of the gas spring 275. In addition, an input current of the pinion driving motor 283b can be significantly reduced.

Figure 15:
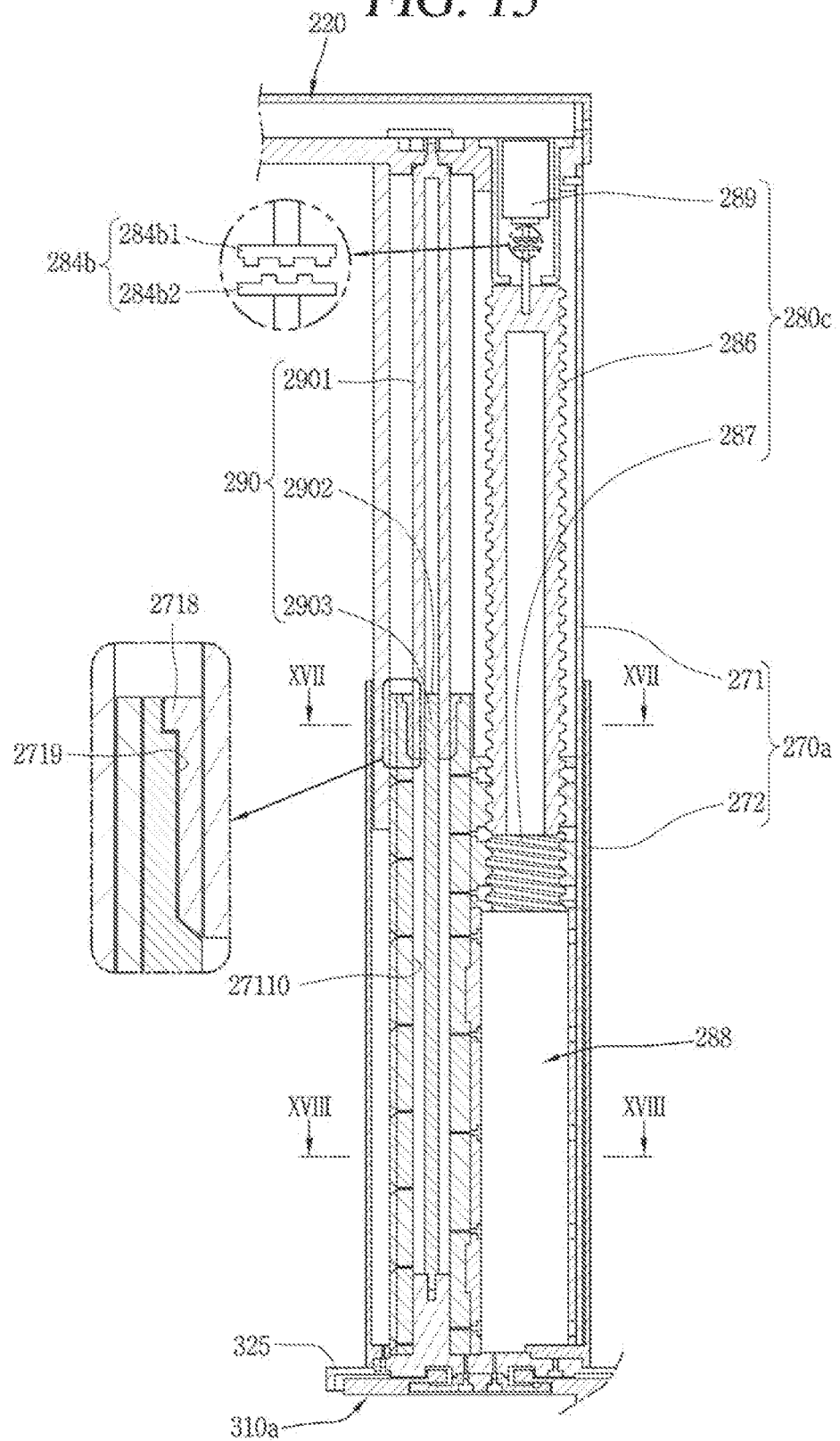
FIG. 15 is a view illustrating a height adjusting unit of a display device in accordance with another implementation of the present disclosure.
Figure 16:
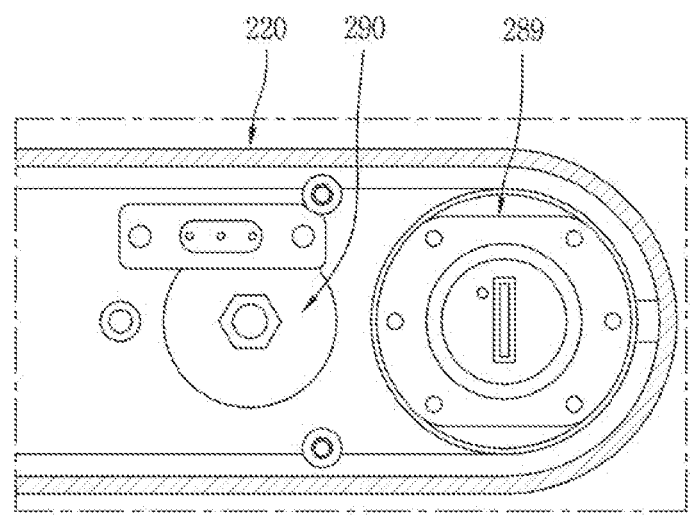
FIG. 16 is a planar view illustrating an upper end portion of a driving motor of FIG. 15 according to an embodiment of the present disclosure.
Figure 17:
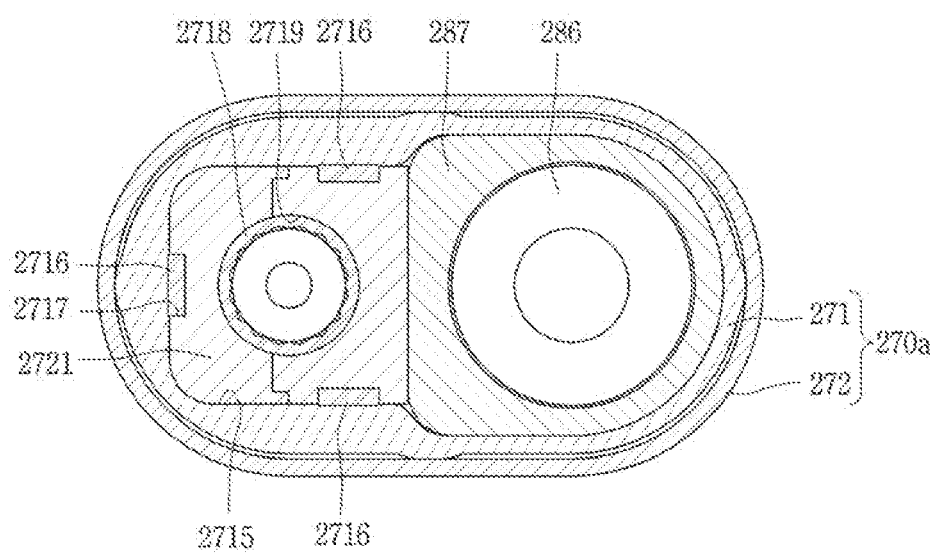
FIG. 17 is a cross-sectional view illustrating a coupling area between an upper pillar and a lower pillar of FIG. 15 according to an embodiment of the present disclosure.
Figure 18:
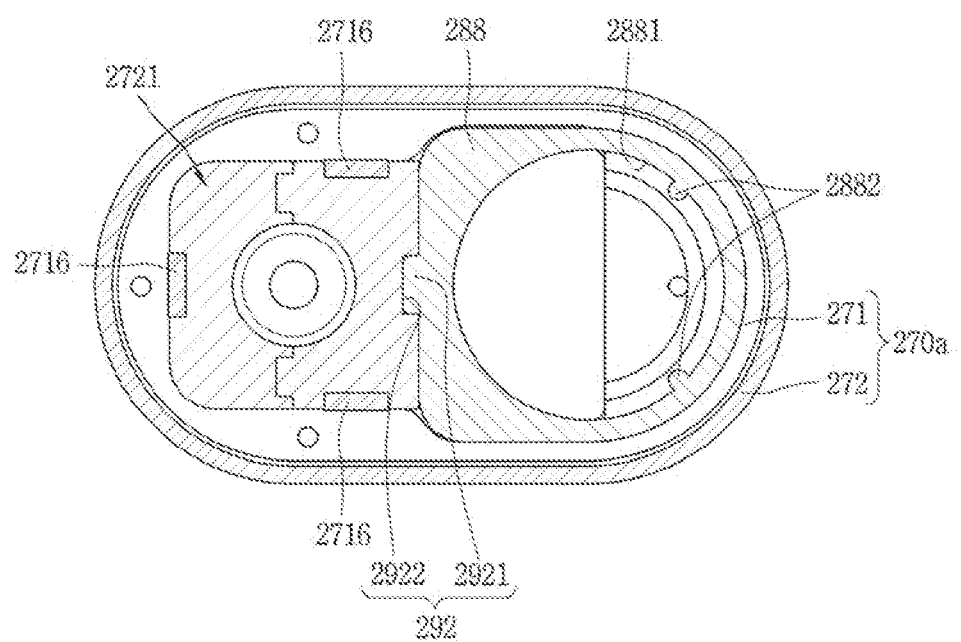
FIG. 18 is a cross-sectional view illustrating the lower pillar of FIG. 15 according to an embodiment of the present disclosure.
Figure 19A:
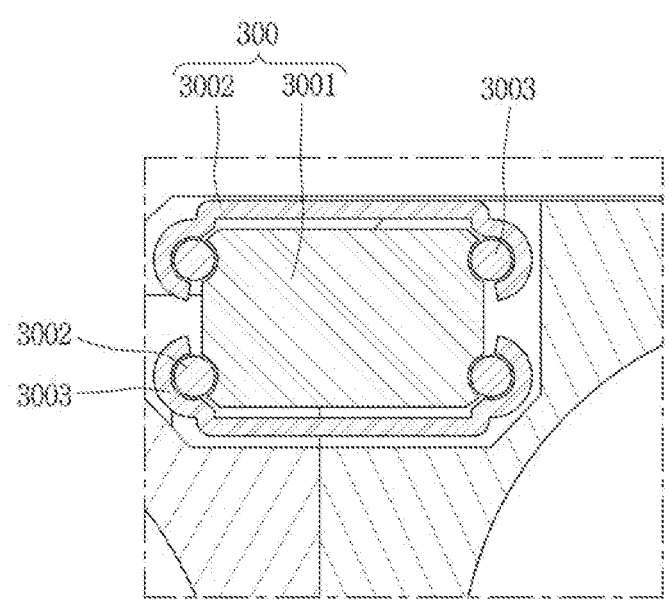
FIG. 19A is a view illustrating a modified example of the height adjusting unit of FIG. 15 according to an embodiment of the present disclosure.

FIG. 15 is a view illustrating a height adjusting unit of a display device in accordance with another implementation of the present disclosure, FIG. 16 is a planar view illustrating an upper end portion of a driving motor of FIG. 15, FIG. 17 is a cross-sectional view illustrating a coupling area between an upper pillar and a lower pillar of FIG. 15, FIG. 18 is a cross-sectional view illustrating the lower pillar of FIG. 15, and FIG. 19A is a view illustrating a modified example of a height adjusting unit of FIG. 15.

As illustrated in FIG. 15, a height adjusting unit 280c of a display device according to another implementation can include a lead screw 286 disposed in the upper pillar 271, a female screw member 287 disposed in the lower pillar 272 and screwed to the lead screw 286, and a lead screw driving motor 289 for rotating the lead screw 286.

The lead screw 286 can be disposed in the upper pillar 271 in the vertical direction.

A clutch 284b for selectively transmitting rotational force of the lead screw driving motor 289 to the lead screw 286 can be disposed, for example, between the lead screw driving motor 289 and the lead screw 286.

The clutch 284b can include, for example, a first clutch 284b1 connected to the lead screw driving motor 289, and a second clutch 284b2 connected to the lead screw 286 and coupled to and separated from the first clutch 284b1.

Accordingly, in a state in which the lead screw driving motor 289 and the lead screw 286 are separated from each other, the upper pillar 271 can be manually moved up and down relative to the lower pillar 272. Regard to the lead screw 286 and the female screw member 287, when external force is applied to the lead screw 286 in the axial direction, the lead screw 286 can move in the axial direction while rotating relative to the female screw member 287.

The female screw member 287 can be provided at an upper area in the lower pillar 272.

A supporter 288 for supporting the female screw member 287 can be disposed below the female screw member 287.

The supporter 288 can have an inner accommodation space in which the lead screw 286 can be accommodated.

An elastic member 290 for accumulating an elastic force by being compressed when the upper pillar 271 is moving down can be disposed inside the pillar 270a.

In the implementation, the elastic member 290 can be implemented as a gas spring 290.

The gas spring 290 can include, for example, a cylinder 2901, a piston 2902 reciprocating inside the cylinder 2901, and a piston rod 2903 having one end connected to the piston 2902 and another end extending to the outside of the cylinder 2901.

As illustrated in FIG. 16, the lead screw driving motor 289 can be connected to the rear end portion of the third arm 220.

A rotating shaft of the lead screw driving motor 289 can be disposed in the vertical direction.

The lead screw driving motor 289 can be rotatable in forward and reverse directions.

The lead screw 286 can be connected to the rotating shaft of the lead screw driving motor 289.

Accordingly, the lead screw 286 can be rotated by the rotational force of the lead screw driving motor 289.

The gas spring 275 can be disposed at the front of the lead screw driving motor 289.

One end portion (upper end portion) of the gas spring 275 can be connected to the third arm 220.

The piston rod 2903 can be fixed to the lower end of the lower pillar 272.

As illustrated in FIG. 18, a lower frame 2721 can be provided in the lower pillar 272.

The lower frame 2721 can have a substantially rectangular cross-section.

The supporter 288 can be disposed on one side (rear side) of the lower frame 2721.

A guide rib 2882 can be disposed in the supporter 288. The guide rib 2882 can be brought into contact with an outer surface of the lead screw 286 to guide the lead screw 286.

The guide rib 2882 can be provided in plurality spaced apart from each other in the circumferential direction of the lead screw 286.

An engagement part 292 can be disposed in a contact area between the supporter 288 and the lower frame 2721. The engagement part 292 can include, for example, a protrusion 2921 protruding from any one of contact surfaces of the supporter 288 and the lower frame 2721, and a protrusion accommodating portion 2922 in which the protrusion 2921 is accommodated.

Accordingly, the occurrence of a transverse clearance of the supporter 288 can be suppressed.

As illustrated in FIG. 17, the lead screw 286 can be disposed at one side (rear area) in the upper pillar 271.

The female screw member 287 can be screwed to a lower portion of the lead screw 286.

A lower frame accommodating portion 2715 in which the lower frame 2721 is accommodated can be disposed in the upper pillar 271.

The lower frame accommodating portion 2715 can have a rectangular cross section to correspond to the shape of the lower frame 2721.

A plurality of sliding members 2716 that are slid in contact with the lower frame 2721 can be disposed in the upper pillar 271.

In the implementation, the plurality of sliding members 2716 can be provided, for example, by three.

The plurality of sliding members 2716 can be provided respectively on a front surface, a rear surface, and a left surface (the front side of the upper pillar 271) in the lower frame accommodating portion 2715.

The lower frame 2721 can be provided with sliding member accommodating groove 2717 in which the sliding members 2716 are slidably accommodated, respectively.

As illustrated in FIGS. 15 and 17, a guide member 2718 for guiding the cylinder 2901 of the gas spring 290 to be movable up and down can be disposed in an upper area of the lower frame 2721.

The lower frame 2721 can be provided with a guide member accommodating portion 2719 in which the guide member 2718 is accommodated.

A cylinder accommodation space 27110 in which the cylinder 2901 of the gas spring 290 is accommodated can be defined below the guide member accommodating portion 2719 of the lower frame 2721.

With the configuration, when the lead screw 286 is rotated in one direction (e.g., clockwise) by the lead screw driving motor 289, the lead screw 286 can move downward while rotating relative to the female screw member 287.

Accordingly, the upper pillar 271 can move downward into the lower pillar 272.

At this time, the gas spring 290 can be compressed to accumulate elastic force.

When the lead screw 286 is rotated in an opposite direction (e.g., counterclockwise) by the lead screw driving motor 289, the lead screw 286 can move upward while rotating relative to the female screw member 287. In this case, the upward movement of the upper pillar 271 can be facilitated by the accumulated elastic force of the gas spring 290. In addition, an input current of the lead screw driving motor 289 for the upward movement of the upper pillar 271 (the third arm 220) can be remarkably reduced.

Meanwhile, as illustrated in FIG. 19, the height adjusting unit 280c of the display device according to the another implementation of the present disclosure can further include a guide rail 300 disposed between the upper pillar 271 and the lower pillar 272.

The guide rail 300 can include, for example, a moving rail 3001 disposed on the upper pillar 271 and a fixed rail 3002 disposed on the lower pillar 272 and slidably coming in contact with the moving rail 3001. The fixed rail 3002 can be fixed to the lower pillar 272, and the moving rail 3001 can be provided on the upper pillar 271 and interlock with the upper pillar 271 to guide the upward and downward movement of the upper pillar 271 while the upper pillar 271 moves up and down.

This can result in preventing the upper pillar 271 from being tilted with respect to the lower pillar 272 due to a load applied to the third arm 220 during the upward movement of the upper pillar 271.

A plurality of balls 3003 can be provided between the fixed rail 3002 and the moving rail 3001. The plurality of balls 3003 can be provided, for example, on the fixed rail 3002 and brought into rolling contact with the moving rail 3001 during the movement of the moving rail 3001 to facilitate the movement of the moving rail 3001.

Figure 19B:
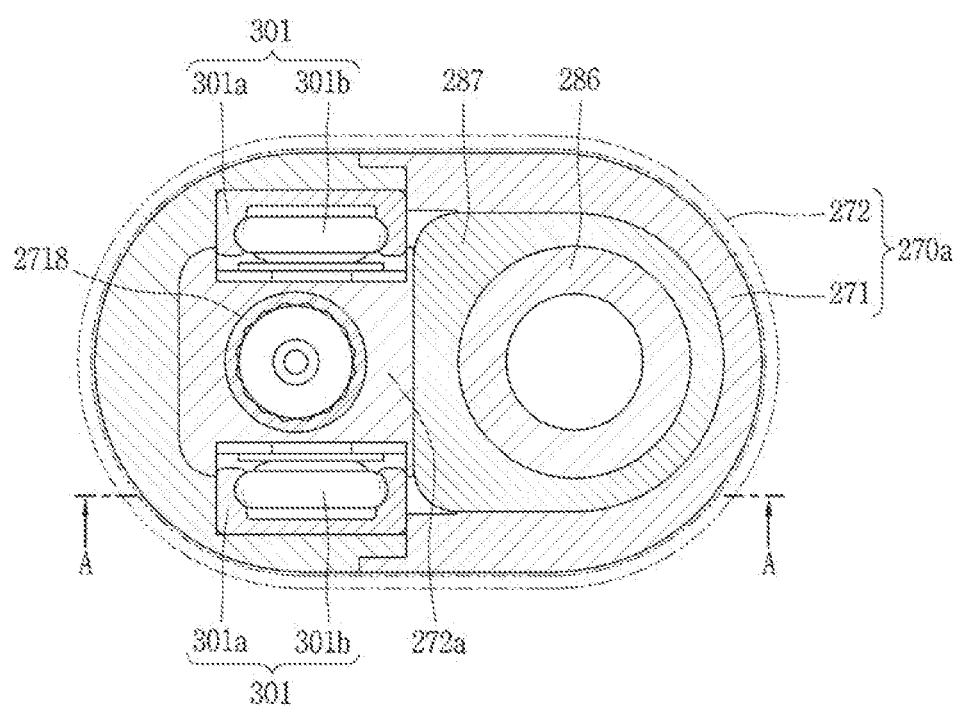
FIG. 19B is a view illustrating a modified example of the height adjusting unit of FIG. 15 according to an embodiment of the present disclosure.
Figure 19C:
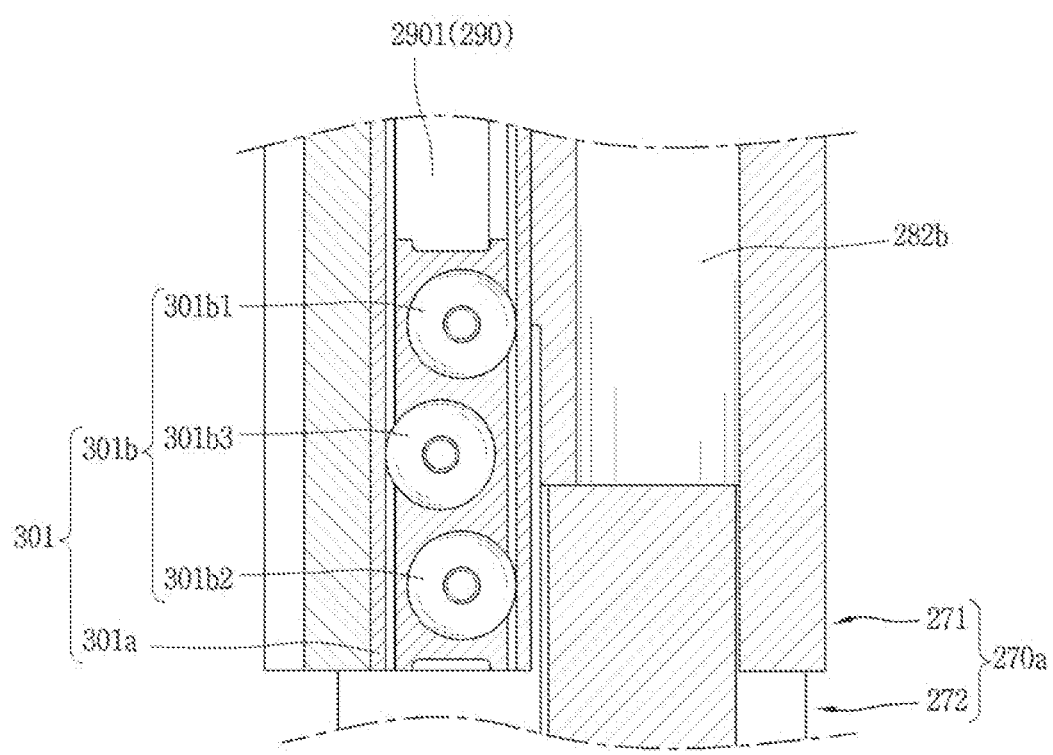
FIG. 19C is a cross-sectional view of the main part of FIG. 19B according to an embodiment of the present disclosure.

FIG. 19B is a view illustrating a modified example of the height adjusting unit of FIG. 15 and FIG. 19C is a cross-sectional view of the main part of FIG. 19B. As illustrated in FIG. 19B, the height adjusting unit 280c of the display device according to the another implementation of the present disclosure can include a guide part 301 disposed between the upper pillar 271 and the lower pillar 272.

The guide part 301 can include, for example, a guide rail 301a provided on the upper pillar 271, and a guide roller 301b provided on the lower pillar 272 and brought into rolling contact with the guide rail 301a.

The guide roller 301b can be provided, for example, on each of both sides of the cylinder 2901. The guide roller 301b can be provided in plurality spaced apart from one another in the vertical direction, as illustrated in FIG. 19C. The guide roller 301b can include, for example, an upper roller 301b1, a lower roller 301b2 disposed below the upper roller 301b1, and an intermediate roller 301b3 disposed between the upper roller 301b1 and the lower roller The guide rail 301a can have a cross-section like "C" with one side open, for example. The guide rail 301a can be configured such that its cross-section is disposed in the back and forth direction of the upper pillar 271.

The upper roller 301b1 and the lower roller 301b2 can, for example, be brought into contact with one side (a rear side in the drawing) of an inner surface of the guide rail 301a, respectively.

The intermediate roller 301b3 can, for example, be brought into contact with another side (a front side in the drawing) of the inner surface of the guide rail 301a. This structure can prevent the guide rail 301a from being tilted in the vertical direction.

With the configuration, the upper pillar 271 can smoothly move up and down with respect to the lower pillar 272.

Figure 19D:
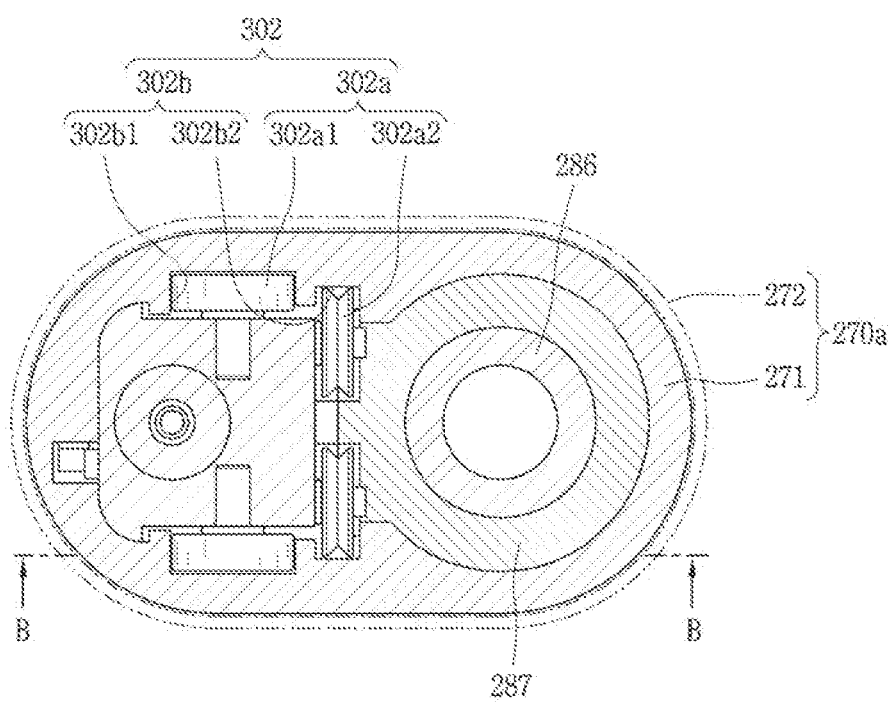
FIG. 19D is a view illustrating a modified example of the height adjusting unit of FIG. 15 according to an embodiment of the present disclosure.
Figure 19E:
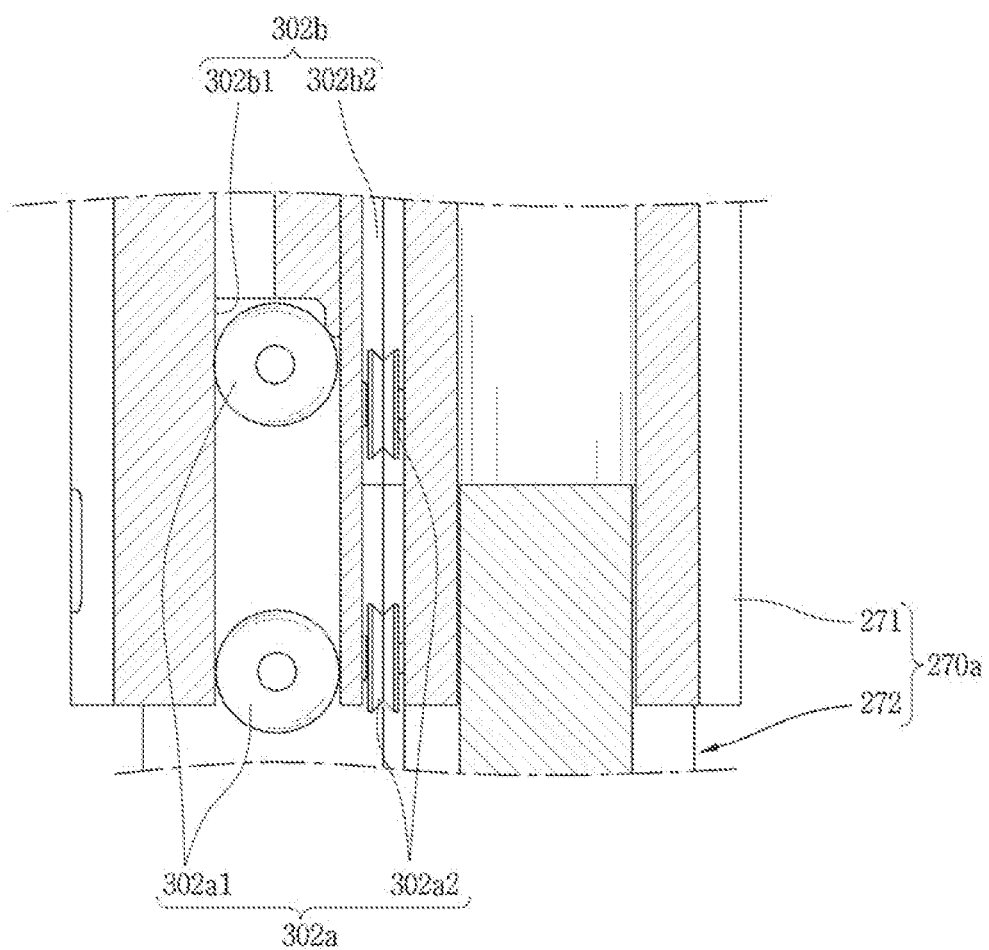
FIG. 19E is a cross-sectional view of the main part of FIG. 19D according to an embodiment of the present disclosure.

FIG. 19D is a view illustrating a modified example of the height adjusting unit of FIG. 15 and FIG. 19E is a cross-sectional view of the main part of FIG. 19D. As illustrated in FIG. 19D, the height adjusting unit 280c of the display device according to the another implementation of the present disclosure can include a guide part 302 disposed between the upper pillar 271 and the lower pillar 272.

The guide part 302 can include, for example, a guide roller 302a provided on the upper pillar 271, and a guide rail 302b provided on the lower pillar 272 and brought into rolling contact with the guide rail 302a to be relatively movable.

The guide roller 302a can include, for example, front rollers 302a1 provided on both sides of the cylinder 2901, and rear rollers 302a2 disposed between the cylinder 2901 and the lead screw 286, respectively.

The front rollers 302a1 can, for example, rotate centering on a rotating shaft disposed in the left and right direction of the lower pillar 272.

The rear rollers 302a2, for example, can rotate centering on a rotating shaft disposed in the back and forth direction of the lower pillar 271. The rear rollers 302a2 can be spaced apart from each other in the back and forth direction of the upper pillar 271.

As illustrated in FIG. 19E, the front roller 302a1 and the rear roller 302a2 can be provided in plurality, respectively, spaced apart from each other in the vertical direction.

The front rollers 302a1 and the rear rollers 302a2, for example, can be provided by four, respectively. The front rollers 302a1 each can have a cylindrical outer surface, for example.

The rear rollers 302a2 each can have an outer surface with an inwardly concave cross-section.

The guide rail 302b can include front rails 302b1 with which the front rollers 302a1 are brought into rolling contact, and rear rails 302b2 with which the rear rollers 302a2 are brought into rolling contact.

The front rail 302b1 can have a flat surface.

The rear rail 302b2 can have a convex cross-section corresponding to the concave cross-section of the rear roller 302a2.

With the configuration, the upper pillar 271 can smoothly move up and down with respect to the lower pillar 272.

Figure 20:
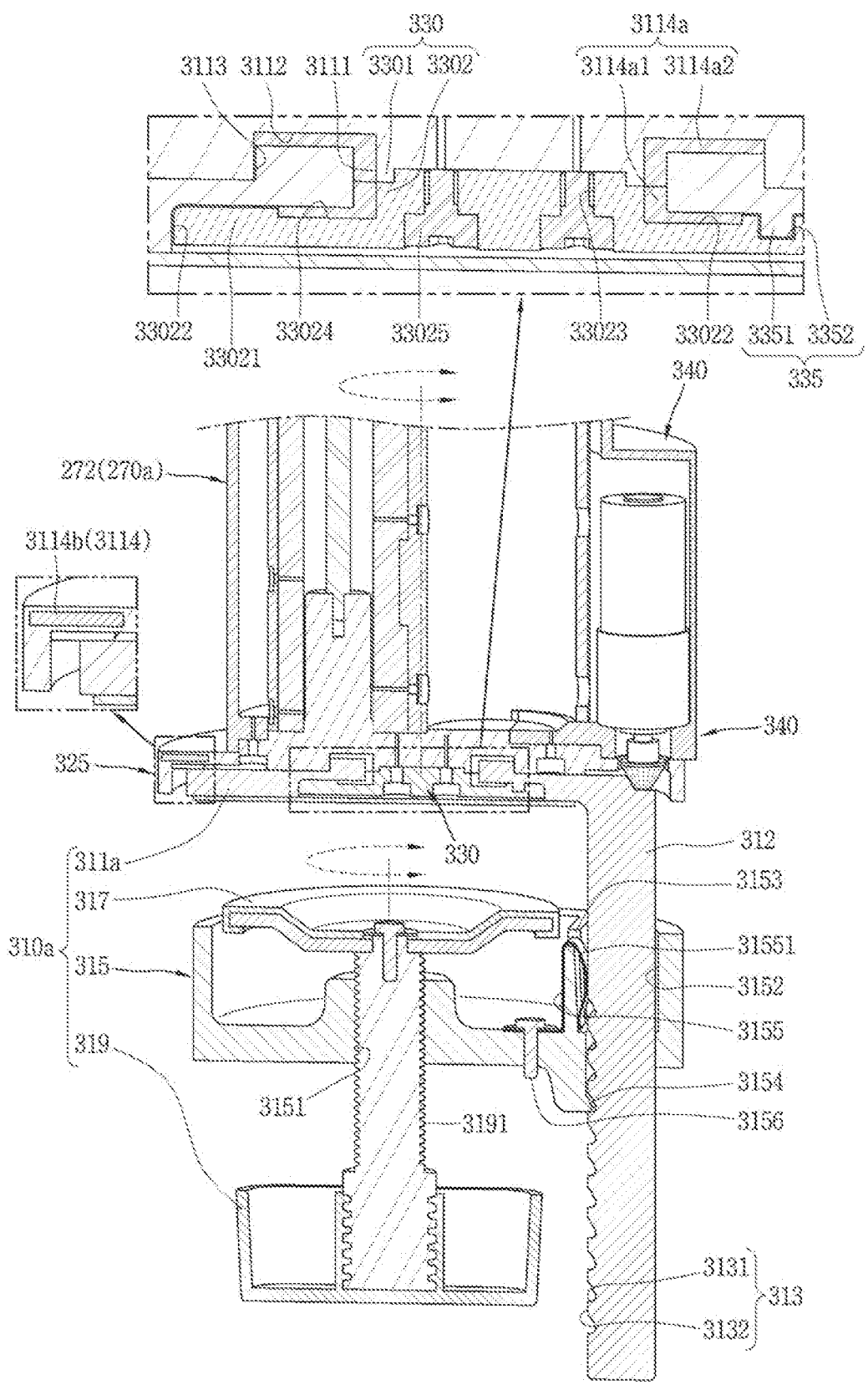
FIG. 20 is a cross-sectional view illustrating a fixing unit of FIG. 1 according to an embodiment of the present disclosure.
Figure 21:
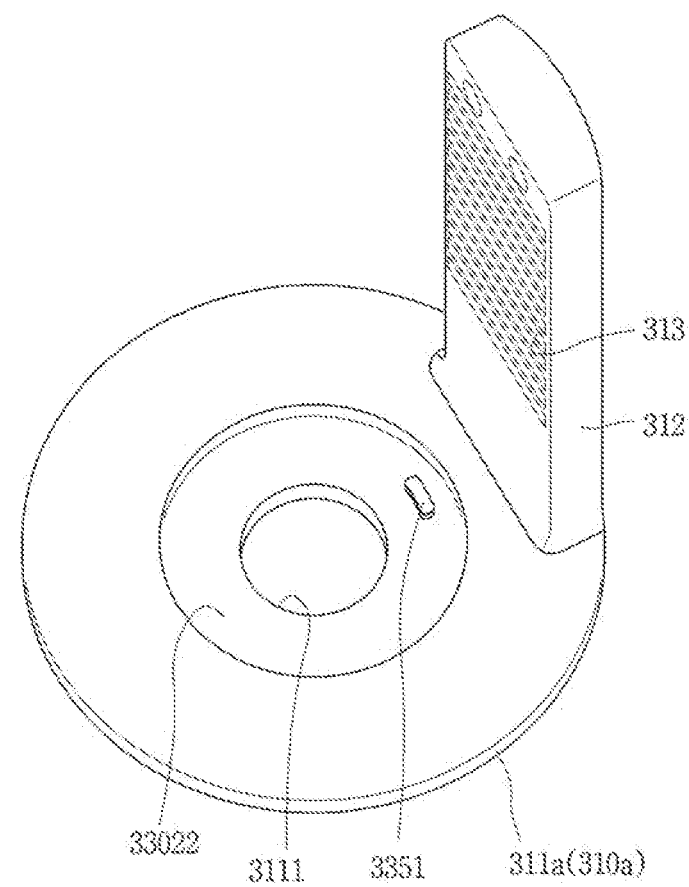
FIG. 21 is a bottom perspective view illustrating an upper fixing member of FIG. 20 according to an embodiment of the present disclosure.
Figure 22:
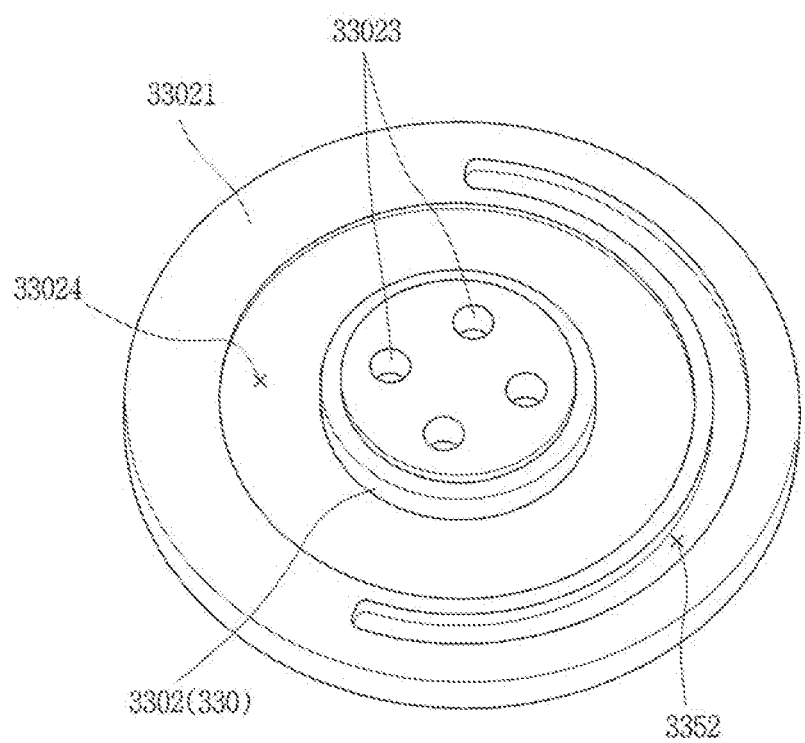
FIG. 22 is a perspective view illustrating a third swivel shaft and a separation preventing portion of FIG. 20 according to an embodiment of the present disclosure.

FIG. 20 is a cross-sectional view illustrating the fixing unit of FIG. 1, FIG. 21 is a bottom perspective view illustrating an upper fixing member of FIG. 20, and FIG. 22 is a perspective view illustrating a third swivel shaft and a separation preventing portion of FIG. 20.

As illustrated in FIGS. 20 to 22, the fixing unit 310a according to the implementation can include an upper fixing member 311a placed on an upper surface of the fixing object 101, a lower fixing member 315 disposed on a lower surface of the fixing object 101 and disposed to be movable close to or away from the upper fixing member 311a, a pressing member 317 coupled to an upper surface of the lower fixing member 315 to be movable up and down, and a manipulation handle 319 screwed through the lower fixing member 315 and having one end portion connected to the pressing member 317.

A guide 312 can extend downward from one side of the upper fixing member 311a.

The lower fixing member 315 can be coupled to the guide 312 to be movable up and down.

The lower fixing member 315 can include a female screw portion 3151, and the manipulation handle 319 can be provided with a male screw portion 3191 screwed to the female screw portion 3151.

The guide 312 can include a concave-convex part 313 with concave portions 3131 and convex portions 3132 disposed in an alternating manner.

The lower fixing member 315 can include a guide accommodating portion 3152 in which the guide 312 is accommodated to be movable up and down.

The lower fixing member 315 can include an engagement protrusion 3154 engaged with the guide 312.

The lower fixing member 315 can include an elastic member 3155 for applying elastic force so that the engagement protrusion 3154 is engaged with the concave portion 3131.

The elastic member 3155 can be implemented as, for example, a leaf spring 3155.

A cutout portion 3153 can be formed in a cutting manner at one side of the guide accommodating portion 3152 such that the elastic member 3155 (leaf spring) can be inserted.

The elastic member 3155 can be provided with an elastic contact portion 31551 disposed in the guide accommodating portion 3152 to be elastically brought into contact with the guide 312.

The elastic contact portion 31551 can have a cross-section that is convex toward the guide 312.

A fixing member (e.g., a screw) 3156 can be coupled in the lower fixing member 315 to fix the elastic member 3155.

On the other hand, the pillar 270a can be coupled to the upper surface of the fixing unit 310a to be relatively rotatable.

A lower plate 325 can be provided on a lower end of the pillar 270a.

The lower plate 325 can include, for example, a body 3251 in a disk shape, and an inserting portion 3252 protruding from an upper surface of the body 3251 and inserted into the pillar 270a.

The lower plate 325 can include a skirt portion 3253 in which an upper area of the fixing unit 310a is accommodated to be relatively rotatable. The skirt portion 3253 can have a cylindrical shape that extends downward from an edge of the body 3251 and also extend in the circumferential direction.

The third swivel shaft 330 can be disposed in a coupling area between the fixing unit 310a and the pillar 270a.

The pillar 270a can rotate relative to the fixing unit 310a centering on the third swivel shaft 330.

The third swivel shaft 330 can be provided in the pillar 270a, for example.

The third swivel shaft 330 can be provided in the lower plate 325.

The third swivel shaft 330 can include, for example, an upper shaft 3301 protruding downward from the lower plate 325, and a lower shaft 3302 coupled to the upper shaft 3301 in the axial direction.

A third swivel shaft accommodating portion 3111 in which the third swivel shaft 330 is relatively rotatably accommodated can be formed through the fixing unit 310a in the axial direction.

The third swivel shaft accommodating portion 3111 can include a protrusion 3112 protruding upward from the upper surface of the upper fixing member 311a.

Correspondingly, an accommodating portion 3113 can be upwardly recessed into the lower plate 325 such that the third swivel shaft accommodating portion 3111 is accommodated to be relatively rotatable.

On the other hand, the lower shaft 3302 can be provided with a separation preventing portion 33021 extending outwardly along the radial direction. The separation preventing portion 33021 can be formed in a disk shape that extends in the radial direction from a lower end of the lower shaft 3302 and also extends in the circumferential direction.

A recessed portion 33022 can be upwardly recessed into the upper fixing member 311a such that the separation preventing portion 33021 is accommodated to be relatively rotatable.

A friction reducing member 3114 for reducing friction during the relative rotation of the pillar 270a can be provided in the contact area between the pillar 270a and the fixing unit 310a.

The friction reducing member 3114 can include, for example, an internal friction reducing member 3114a inserted between the third swivel shaft 330 and the third swivel shaft accommodating portion 3111, and an external friction reducing member 3114b inserted between an upper surface of the upper fixing member 311a and a lower surface of the lower plate 325.

The internal friction reducing member 3114a can include, for example, a first friction reducing member 3114a1 coupled to a circumference of the upper shaft 3301, and a second friction reducing member 3114a2 coupled to a circumference of the lower shaft 3302.

On the other hand, a stopper 335 for limiting a relative movement range of the pillar 270a with respect to the fixing unit 310a can be provided in the contact area between the pillar 270a and the fixing unit 310a.

The stopper 335 can include, for example, a stopper protrusion 3351 protruding from any one of contact surfaces of the pillar 270a and the fixing unit 310a, and a stopper protrusion accommodating portion 3352 in which the stopper protrusion 3351 is accommodated to be relatively rotatable.

As illustrated in FIG. 21, the stopper protrusion 3351 can be disposed on the fixing unit 310a. The stopper protrusion 3351 can protrude downward from the lower surface of the upper fixing member 311a.

As illustrated in FIG. 22, the stopper protrusion accommodating portion 3352 can be formed in the lower shaft 3302.

A fixing member insertion hole 33023 through which a fixing member 33025 coupled to the upper shaft 3301 through the lower shaft 3302 can be formed through the lower shaft 3302. The implementation exemplarily illustrates fourth fixing member insertion holes 33023, but the present disclosure is not limited thereto.

A second friction reducing member accommodating portion 33024 in which the second friction reducing member 3114a2 can be accommodated can be formed in a circumference of the lower shaft 3302.

The stopper protrusion accommodating portion 3352 can be formed, for example, in an arcuate shape in the upper surface of the separation preventing portion 33021 of the lower shaft 3302 to correspond to a rotation trajectory of the stopper protrusion 3351.

The stopper protrusion accommodating portion 3352, for example, can be formed such that an internal angle between both end portions is approximately 180 degrees or less.

Figure 23:
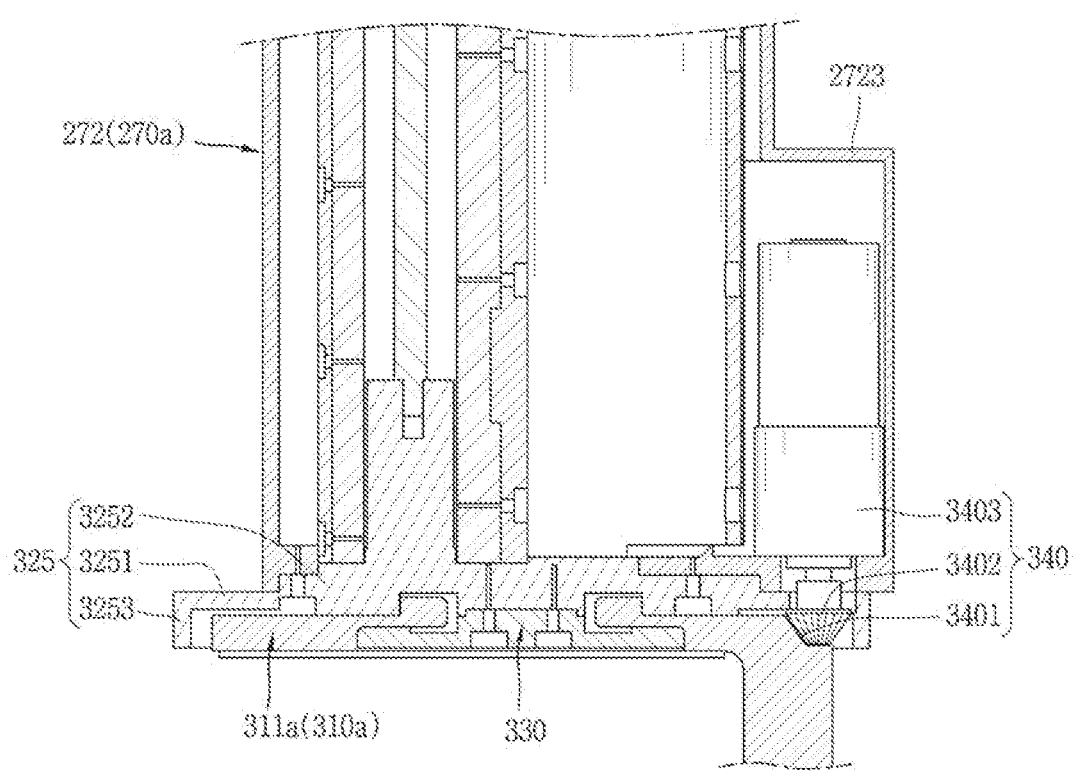
FIG. 23 is a cross-sectional view illustrating a third swivel driving unit of FIG. 1 according to an embodiment of the present disclosure.
Figure 24:
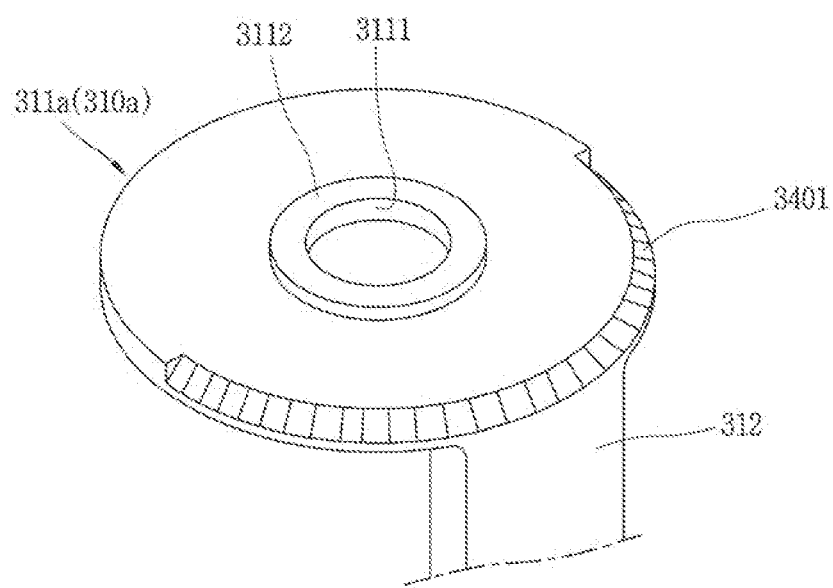
FIG. 24 is a perspective view illustrating an upper fixing member of FIG. 23 according to an embodiment of the present disclosure.

FIG. 23 is a cross-sectional view illustrating a third swivel driving unit of FIG. 1 and FIG. 24 is a perspective view illustrating an upper fixing member of FIG. 23.

As illustrated in FIG. 23, a third swivel driving unit 340 for allowing the pillar 270a to rotate relative to the fixing unit 310a can be provided.

The third swivel driving unit 340 can include, for example, a third swivel shaft 330 disposed in a contact area between the pillar 270a and the upper fixing member 311a, a fixed gear 3401 disposed on the upper fixing member 311a in the circumferential direction based on the third swivel shaft 330, a driving gear 3402 engaged with the fixed gear 3401 to be relatively movable, and a third swivel driving motor 3403 to rotate the driving gear 3402.

As illustrated in FIG. 24, the fixed gear 3401 can be formed on the upper fixing member 311a in the circumferential direction.

The fixed gear 3401 can be tilted downwardly with respect to the axial direction of the third swivel shaft 330.

The fixed gear 3401 can be disposed at about 45 degrees with respect to the axial direction.

The implementation illustrates the example in which the fixed gear 3401 is disposed at 180 degrees along the circumferential direction of the upper fixing member 311a, but the present disclosure is not limited thereto.

The fixed gear 3401, for example, can be formed such that an internal angle between both end portions is in the range of 120 degrees to 180 degrees.

The driving gear 3402 can be engaged with the fixed gear 3401.

The driving gear 3402 can be disposed on a rotating shaft of the third swivel driving motor 3403.

The driving gear 3402 can be tilted, for example, at 45 degrees with respect to the rotating shaft of the third swivel driving motor 3403.

A third swivel driving motor accommodating portion 2723 in which the third swivel driving motor 3403 is accommodated can be formed in the pillar 270a.

The driving gear 3402 can be disposed below the third swivel driving motor accommodating portion 2723 and engaged with the fixed gear 3401.

With the configuration, when the driving gear 3402 is rotated in one direction (clockwise) by the third swivel driving motor 3403, the driving gear 3402 can move clockwise along the circumferential direction of the fixed gear 3401. Accordingly, the pillar 270a can rotate clockwise with respect to the fixing unit 310a centering on the third swivel shaft 330. When viewed from the front of the display unit 100a, the display unit 100a can rotate (move) to the left.

Conversely, when the driving gear 3402 is rotated counterclockwise, the driving gear 3402 can move counterclockwise along the circumferential direction of the fixed gear 3401, and the pillar 270a can rotate counterclockwise centering on the third swivel shaft 330. Accordingly, the display unit 100a can rotate (move) to the left of the pillar 270a.

Figure 25:
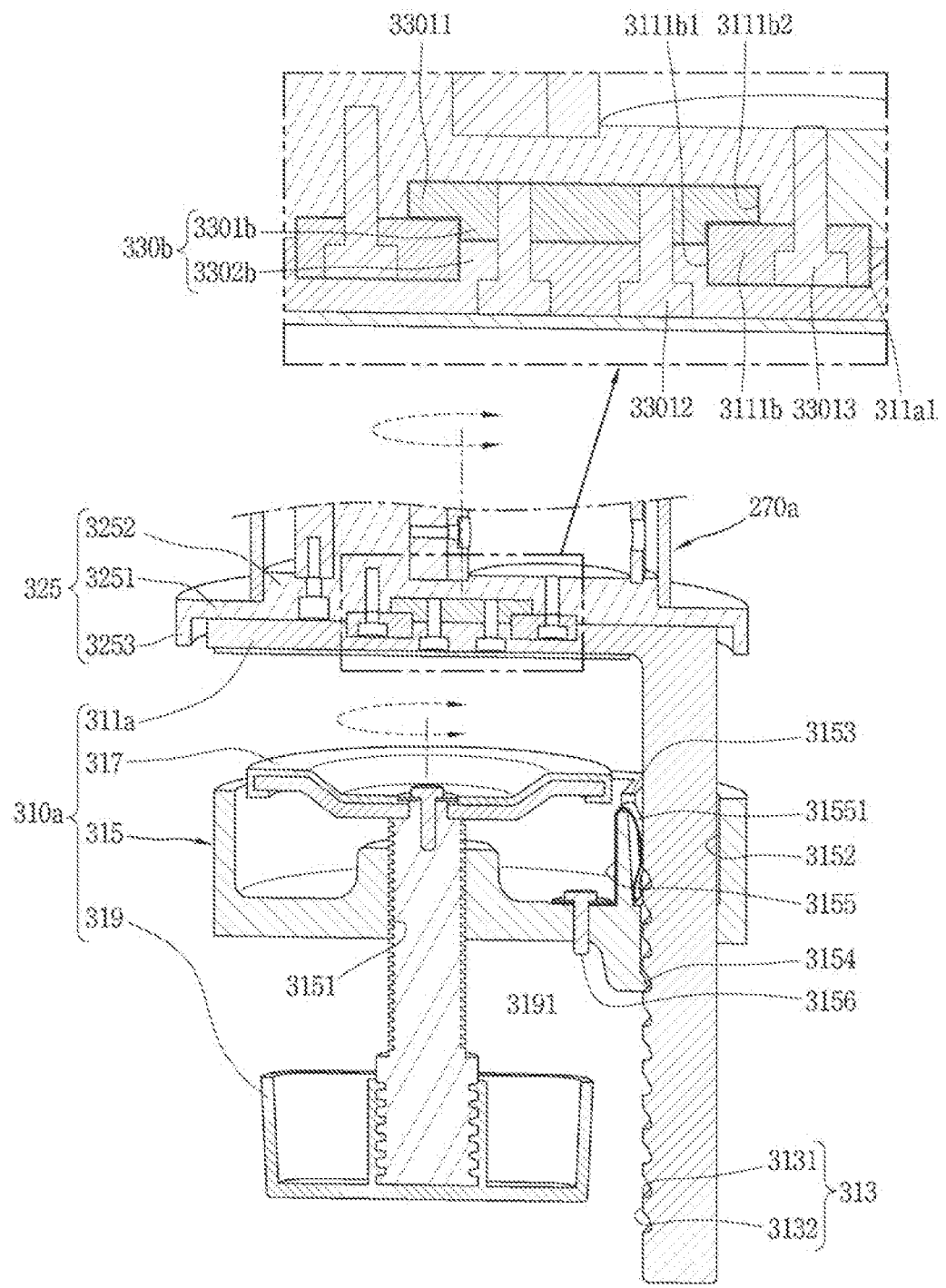
FIG. 25 is a view illustrating a modified example of a fixing unit of FIG. 24 according to an embodiment of the present disclosure.

FIG. 25 is a view illustrating a modified example of the fixing unit of FIG. 20. As described above, the fixing unit 310a according to the implementation can be detachably coupled to the fixing object 101.

With the configuration, size and weight of a portion of the fixing unit 310a (i.e., an upper fixing member 311a to be explained later) that is placed on the upper surface of the fixing object 101 can be remarkably reduced.

As a result, the fixing unit 310a can occupy a relatively small area of the upper surface of the fixing object 101 (e.g., desk or table), which can result in increasing a utilization area of the upper surface of the fixed object 101.

As illustrated in FIG. 25, the fixing unit 310a according to the implementation can include an upper fixing member 311a placed on an upper surface of the fixing object 101, a lower fixing member 315 disposed on a lower surface of the fixing object 101 to be movable close to or away from the upper fixing member 311a, a pressing member 317 coupled to an upper surface of the lower fixing member 315 to be movable up and down, and a manipulation handle 319 screwed through the lower fixing member 315 and having one end portion connected to the pressing member 317.

On the other hand, the pillar 270a can be coupled to the fixing unit 310a (the upper fixing member 311a) to be relatively rotatable centering on a third swivel shaft 330b.

A lower plate 325 can be provided on a lower end of the pillar 279a.

The lower plate 325 can include, for example, a body 3251 in a disk shape, and an inserting portion 3252 protruding from an upper surface of the body 3251 to be inserted into the lower pillar 272.

The lower plate 325 can include a skirt portion 3253 extending downward from the edge of the body 3251 and extending in the circumferential direction.

The skirt portion 3253 can have a size large enough to accommodate the upper fixing member 311a such that the upper fixing member 311a can be relatively movable.

The third swivel shaft 330b can be provided in the upper fixing member 311a, for example.

The pillar 270a can be provided with a third swivel shaft accommodating portion 3111b1 in which the third swivel shaft 330b is accommodated to be relatively movable.

The third swivel shaft 330b can include, for example, a lower shaft 3302b integrally formed with the upper fixing member 311a, and an upper shaft 3301b coupled to the lower shaft 3302b.

An upper shaft fixing member 33012 for fixing the upper shaft 3301b can be coupled to the upper fixing member 311a. The upper shaft fixing member 33012 can be screwed to the upper shaft 3301b through the upper fixing member 311a. Accordingly, the upper shaft 3301b can be fixedly coupled to an upper end of the lower shaft 3302b to protrude in the axial direction.

The upper shaft 3301b can be provided with a separation preventing portion 33011 extending in the radial direction.

The third swivel shaft accommodating portion 3111b1 can be formed, for example, in a third swivel shaft accommodating member 3111b having a disk shape.

An accommodating portion 311a1 can be recessed into the upper fixing member 311a so that the third swivel shaft accommodating member 3111b can be coupled to be relatively rotatable. The lower shaft 3302b can be disposed in the center of the accommodating portion 311a1.

A separation preventing portion accommodating portion 3111b2 in which the separation preventing portion 33011 is accommodated to be relatively rotatable can be recessed into the lower plate 325.

The third swivel shaft accommodating member 3111b can be disposed beneath the separation preventing portion 33011.

The third swivel shaft accommodating member 3111b can be fixedly coupled to the lower plate 325 by a fixing member 33013.

The separation preventing portion 33011 and the third swivel shaft accommodating member 3111b can be disposed to overlap each other in the axial direction. An inner area of the third swivel shaft accommodating member 3111b can be disposed to overlap a lower side (one side in the axial direction) of the separation preventing portion 33011.

Accordingly, the pillar 270a (the lower plate 325) can rotate relative to the fixing unit 310a and can be prevented from being unexpectedly separated from the fixing unit 310a (the upper fixing member 311a).

Figure 26:
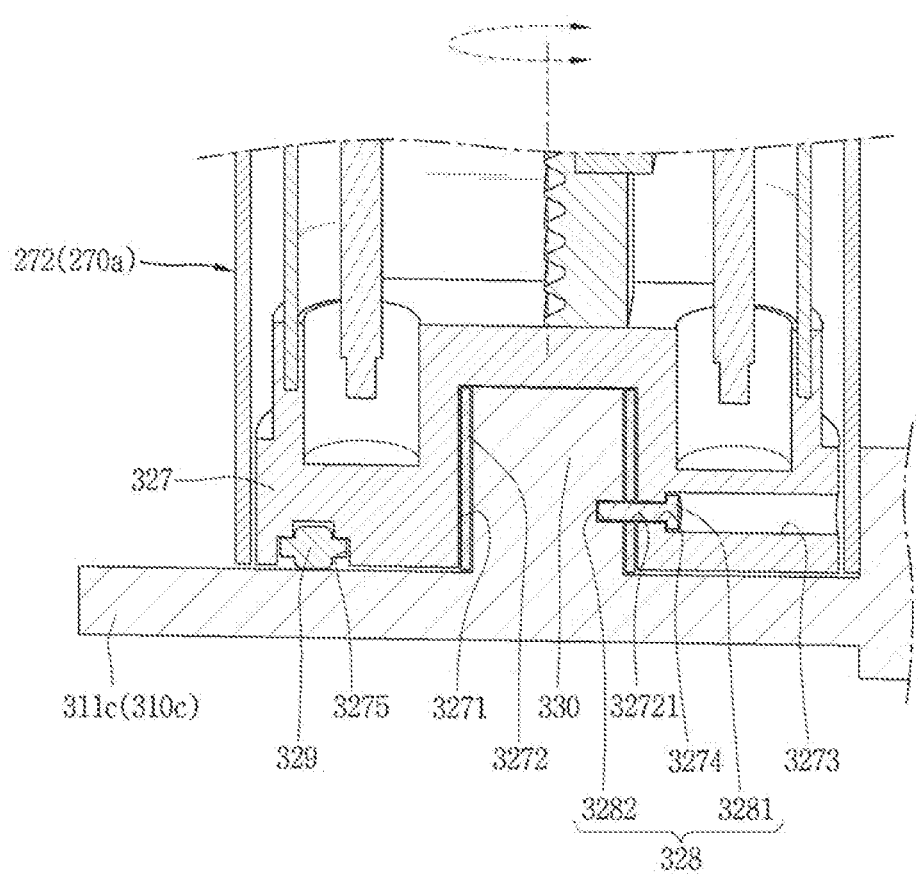
FIG. 26 is a view illustrating a modified example of a fixing unit of FIG. 20 according to an embodiment of the present disclosure.

FIG. 26 is a view illustrating a modified example of the fixing unit of FIG. 20. As illustrated in FIG. 26, the pillar 270a can be coupled to an upper surface of an upper fixing member 311c of a fixing unit 310c to be relatively rotatable.

The third swivel shaft 330 can protrude upward from the upper surface of the upper fixing member 311c.

A lower frame 327 can be provided in a lower portion of the pillar 270a.

The lower frame 327 can be provided inside a lower end of the pillar 270a.

A third swivel shaft accommodating portion 3271 in which the third swivel shaft 330 is accommodated can be disposed in the lower frame 327.

A bush 3272 in a cylindrical shape can be disposed in the third swivel shaft accommodating portion 3271. Accordingly, friction between the lower frame 327 and the third swivel shaft 330 can be reduced.

A separation preventing portion 328 can be disposed in the lower frame 327 to prevent the pillar 270a from being unexpectedly separated from the fixing unit 310c.

The separation preventing portion 328, for example, can include a fixing member 3281 having one side coupled to the lower frame 327 and another side inserted into the third swivel shaft 330 to be relatively movable, and a fixing member groove 3282 recessed into the third swivel shaft 330 in the radial direction to correspond to a relative rotation trajectory of the fixing member 3281 and extending in the circumferential direction.

A fixing member insertion portion 3273 in which the fixing member 3281 can be inserted can be formed in the lower frame 327.

A fixing member accommodating hole 32721 in which the fixing member 3281 can be inserted to be relatively movable can be formed in the bush 3272. The fixing member accommodating hole 32721 can be formed through the bush 3272 in the radial direction and extend in the circumferential direction by a length (arcuate length) corresponding to the fixing member groove 3282.

The fixing member insertion portion 3273 can be formed radially in a penetrating manner from an outer surface of the lower frame 327, for example.

The lower frame 327 can be provided with a female screw portion 3274 to which the fixing member 3281 can be screwed.

On the other hand, a bearing member 329 for reducing friction during the rotation of the pillar 270a relative to the fixing unit 310c can be provided in a contact area between the pillar 270a and the fixing unit 310c.

The bearing member 329 can be provided in the pillar 270a, and can be relatively movable in rolling contact with the fixed unit 310c.

The bearing member 329 can be provided in plurality spaced apart from one another along the circumferential direction.

The lower frame 327 can be provided with a bearing member accommodating portion 3275 into which the bearing member 329 is inserted.

Although not specifically illustrated in the drawings, the upper fixing member 311c can be provided with a bearing guide groove in which one area of the bearing member 329 is accommodated and moved.

With the configuration, upon desiring to rotate the pillar 270a and the third arm 220 relative to the fixing unit 310c, the pillar 270a and/or the third arm 220 can be gripped and rotated in a desired direction. Accordingly, the pillar 270a and the third arm 220 can be rotated centering on the third swivel shaft 330.

Figure 27:
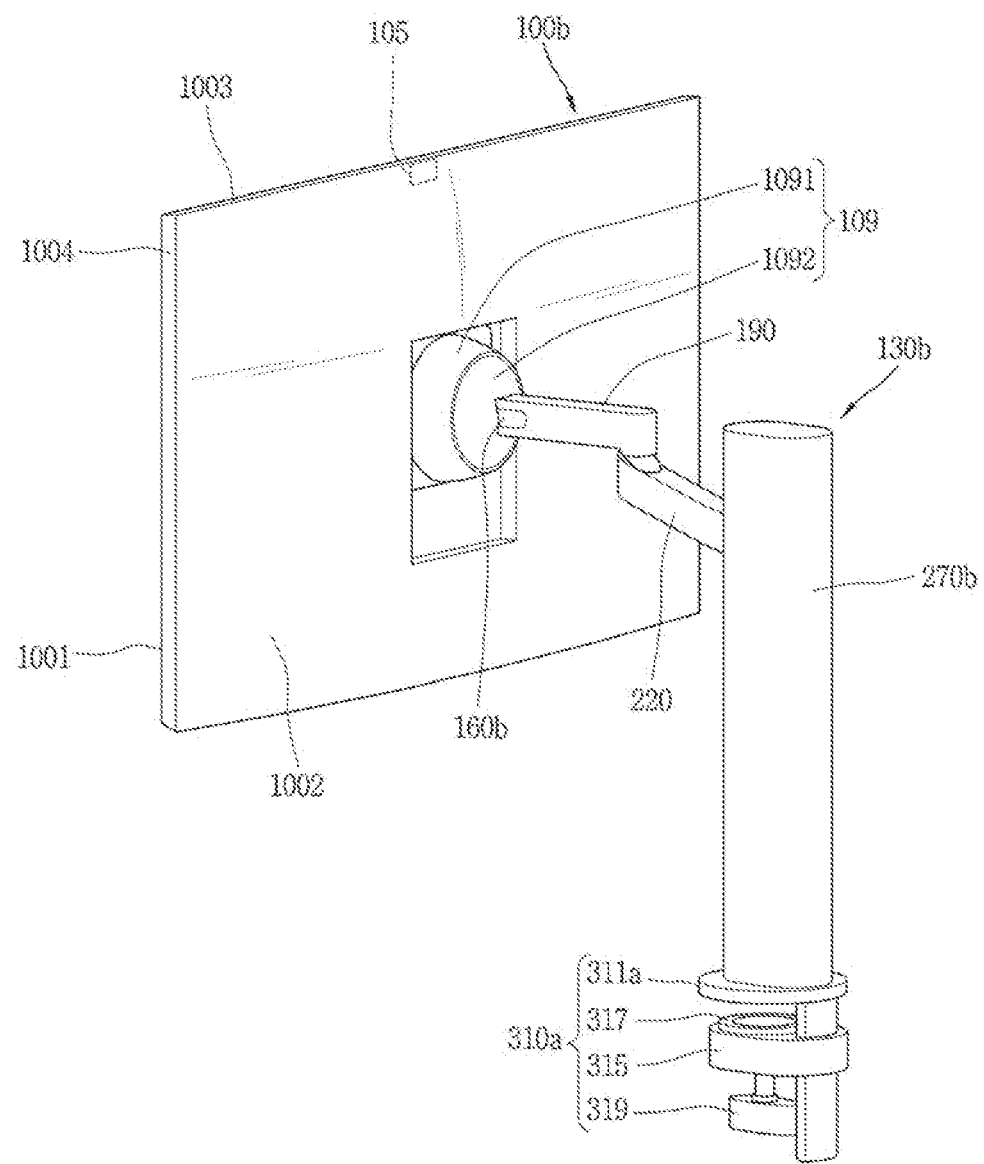
FIG. 27 is a rear perspective view of a display device in accordance with still one implementation of the present disclosure.
Figure 28:
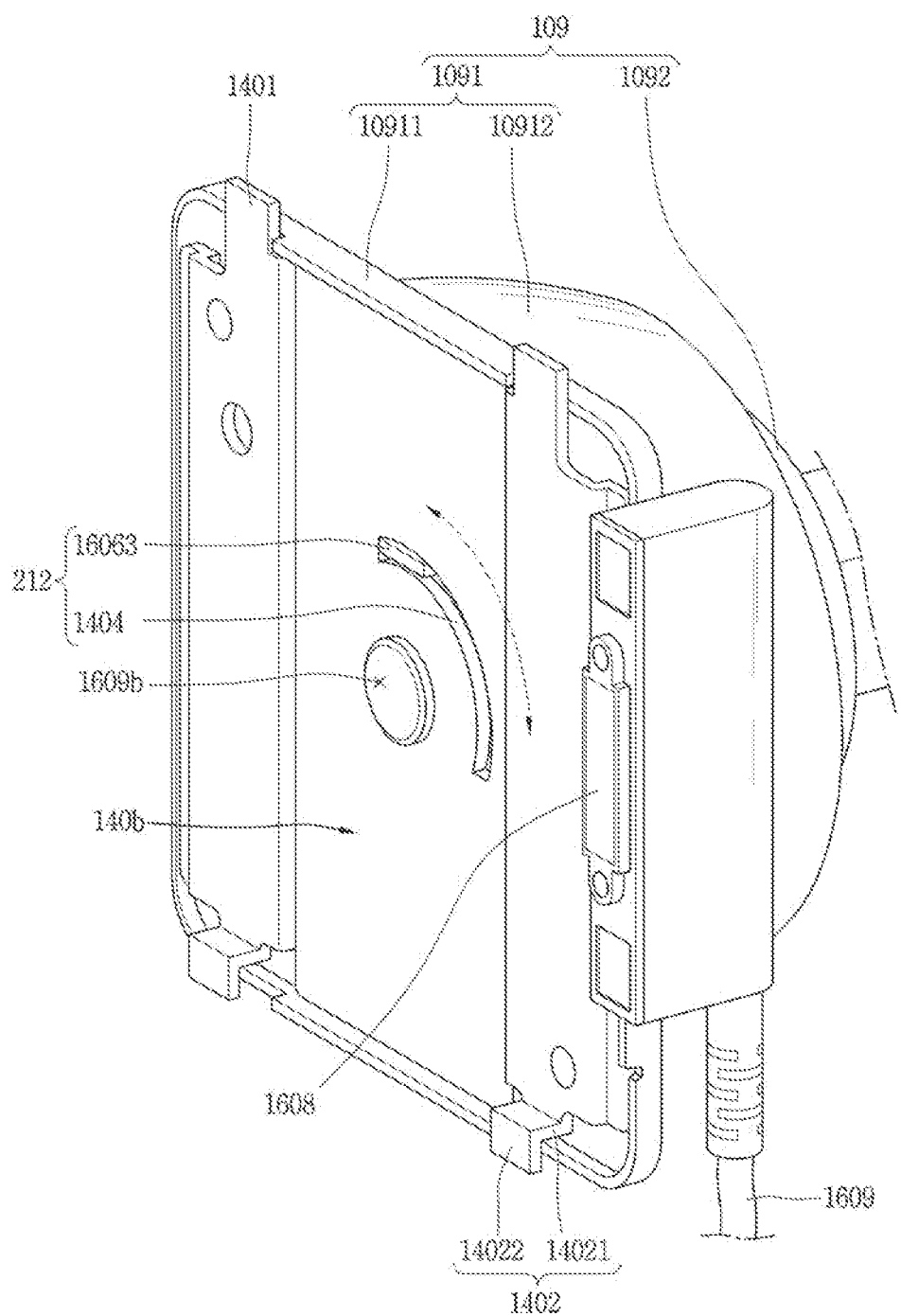
FIG. 28 is a perspective view of a mounting bracket area of FIG. 27 before coupling, according to an embodiment of the present disclosure.
Figure 29:
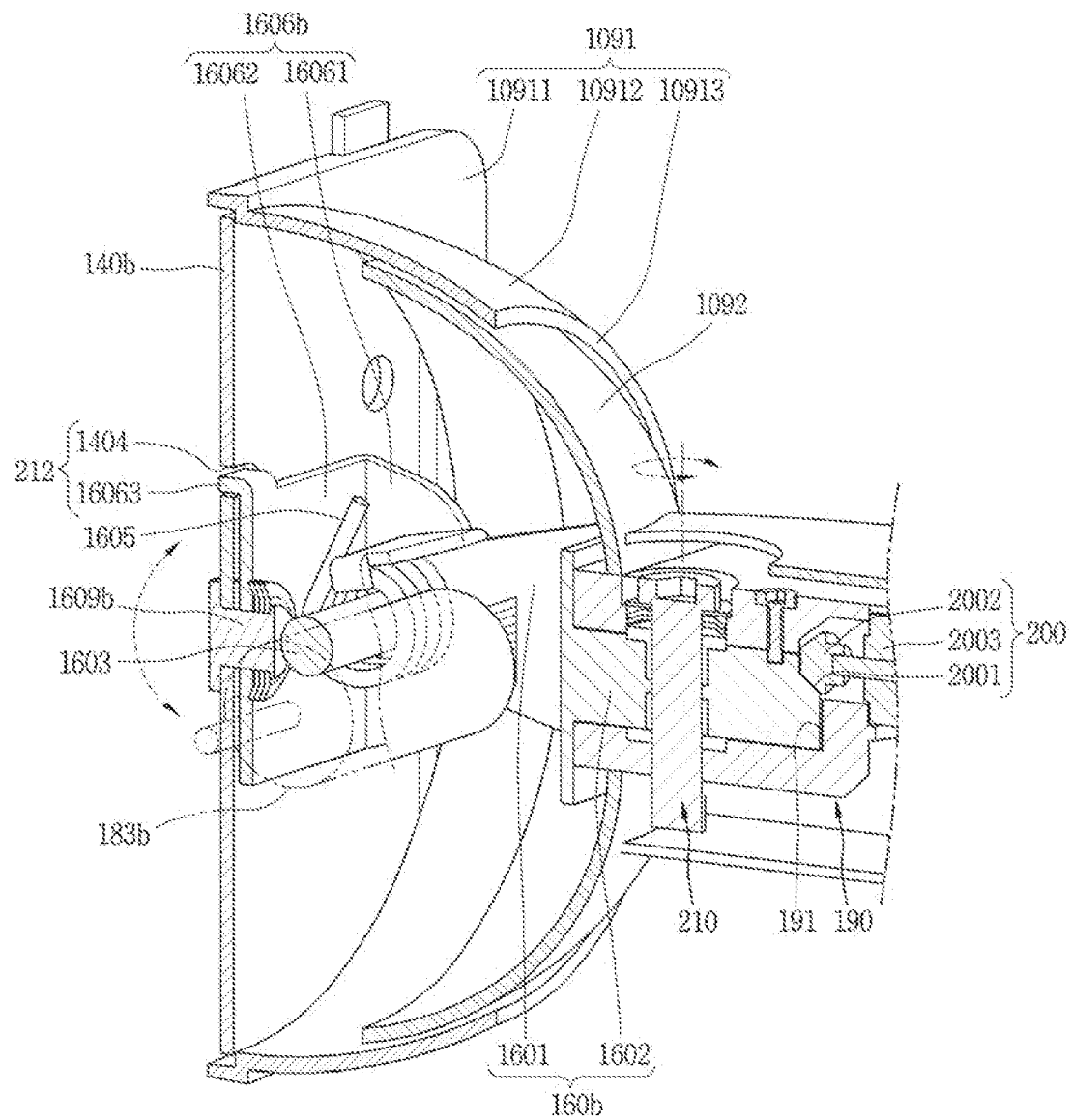
FIG. 29 is a view illustrating the inside of FIG. 28 according to an embodiment of the present disclosure.
Figure 30:
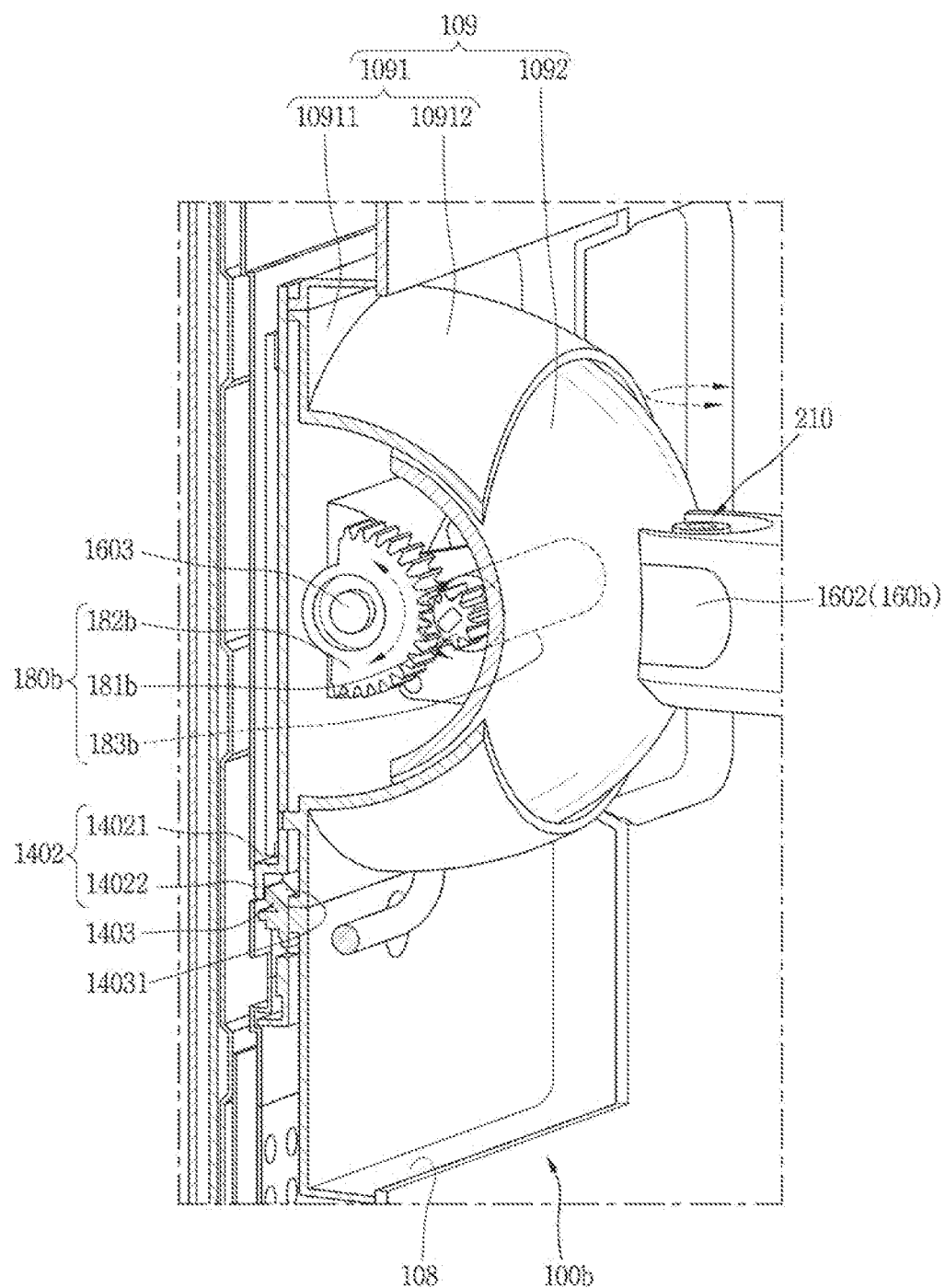
FIG. 30 is a view illustrating a driving gear and a driven gear of a tilting driving unit of FIG. 27 according to an embodiment of the present disclosure.

FIG. 27 is a rear perspective view of a display device in accordance with still another implementation of the present disclosure, FIG. 28 is a perspective view of a mounting bracket area of FIG. 27 before coupling, FIG. 29 is a view illustrating the inside of FIG. 28, and FIG. 30 is a view illustrating a driving gear and a driven gear of a tilting driving unit of FIG. 27.

As illustrated in FIGS. 27 to 30, a display device according to still another implementation can include a display unit 100b, and a support device 130b coupled to a rear surface of the display unit 100b to support the display unit 100b such that tilting angle, height, and distance of the display unit 100b can be adjusted.

The support device 130a can include a mounting bracket 140b, a first arm 160b, a second arm 190, a third arm 220, a pillar 270b, and a fixing unit 310a.

The display unit 100b can be formed, for example, in a rectangular parallelepiped shape having two long side portions 1003 and two short side portions 1004.

A camera 105 for capturing a user can be provided, for example, on an upper long side portion 1003 of the display unit 100b.

The mounting bracket 140b can be coupled to a rear surface of the display unit 100b.

The first arm 160b can be connected to the mounting bracket 140b to be relatively rotatable (tiltable) in the vertical direction.

The second arm 190 can be connected to a rear end portion of the first arm 160b to be relatively rotatable centering on a shaft disposed in the vertical direction.

The third arm 220 can be connected to a rear end portion of the second arm 190 to be relatively rotatable centering on a shaft disposed in the vertical direction.

The third arm 220 can be coupled to the pillar 270b to be movable up and down.

The pillar 270b can be coupled to an upper surface of the fixing unit 310a to be relatively rotatable centering on a shaft disposed in the vertical direction.

The fixing unit 310a can be detachably coupled to the fixing object 101.

A coupling portion 108 to which the mounting bracket 140b is coupled can be provided on the rear surface of the display unit 100b.

The coupling portion 108 can be covered by a coupling portion cover 109.

The mounting bracket 140b can be disposed inside the coupling portion cover 109.

The mounting bracket 140b can have a substantially rectangular plate shape.

An upper coupling protrusion 1401 can protrude upward from an upper side of the mounting bracket 140b.

An upper coupling protrusion groove into which the upper coupling protrusion 1401 is inserted can be provided in the rear surface of the display unit 100b.

A lower coupling protrusion 1402 can be provided on a lower side of the mounting bracket 140b. The lower coupling protrusion 1402 can include a horizontal section 14021 protruding forward from the lower side of the mounting bracket 140b in a horizontal direction, and a vertical section 14022 bent downward from an end portion of the horizontal section 14021.

The display unit 100b can include an elastic protrusion 1403 provided at the rear of the lower coupling protrusion 1402 to protrude and retract.

As illustrated in FIG. 28, a connector 1608 electrically connected to a connector provided on the display unit 100b can be provided on one side of the mounting bracket 140b. The connector 1608 provided on the mounting bracket 140b can be connected to another electronic device (e.g., a personal computer body). Accordingly, when the mounting bracket 140b and the display unit 100b are coupled to each other, the connector 1608 can be connected to the connector provided on the display unit 100b, so that the display unit 100b can be electrically connected to the another electronic device.

The coupling portion cover 109, as illustrated in FIG. 28, can include a movable cover 1091 coupled to the display unit 100b, and a fixed cover 1092 to which the movable cover 1091 is coupled to be relatively movable.

The movable cover 1091 can be coupled to the rear of the mounting bracket 140b. Accordingly, the mounting bracket 140b can be covered by the movable cover 1091 to be invisible from the outside of the movable cover 1091.

The movable cover 1091 can include, for example, a body 10911 in a rectangular shape and a protruding portion 10912 protruding from the body 10911 into a truncated hemispherical shape.

An opening 10913 can be formed through a rear end portion of the protruding portion 10912.

The fixed cover 1092 having a substantially hemispherical shape can be coupled into the protruding portion 10912.

The fixed cover 1092 can be inserted from a side of the body 10911 of the movable cover 1091 and drawn out through the rear opening 10913.

The fixed cover 1092 can be relatively movable while its outer surface comes in surface contact with an inner surface of the protruding portion 10912 of the movable cover 1091.

The movable cover 1091 can rotate in the vertical direction centering on the fixed cover 1092.

The movable cover 1091 can rotate in the left and right directions centering on the fixed cover 1092.

The first arm 160b can be accommodated in the fixing cover 1092.

The first arm 160b can include, for example, a first arm body 1601, and a second arm connecting portion 1602 disposed on a rear end portion of the first arm body 1601 to be connected to the second arm 190.

A first swivel shaft 210 can be provided in a connection area between the first arm 160b and the second arm 190.

The second arm 190, as aforementioned, can be provided with a first arm accommodating part 191 in which the first arm 160b (the second arm connecting portion 1602) is accommodated to be relatively rotatable.

A first swivel driving unit 200 that allows the first arm 160b to rotate relative to the second arm 190 can be provided in a coupling area between the first arm 160b and the second arm 190. As described above, the first swivel driving unit 200 can include a fixed gear 2001 formed on the first arm 160b in the circumferential direction, a driving gear 2002 engaged with the fixed gear 2001, a first swivel driving motor 2003 to rotate the driving gear 2002. Since the configuration of the first swivel driving unit 200 according to this implementation is similar to that of the foregoing implementation, a detailed description of the configuration and operation will be omitted.

Meanwhile, a tilting shaft 1603 disposed horizontally can be provided on the front of the first arm 160b.

The tilting shaft 1603 can be disposed in the left and right direction. In the implementation, the tilting shaft 1603 can be arranged parallel to the long side portion 1003 of the display unit 100b.

The tilting shaft 1603 can be provided with a tilting member 1606b that is rotatable (tiltable) up and down about the tilting shaft 1603.

The tilting member 1606b can have, for example, a shape like "U".

The tilting member 1606b can include, for example, both side wall portions 16061 coupled to the tilting shaft 1603, and a connecting portion 16062 connecting the both side wall portions 16061.

The tilting member 1606b can be coupled to the rear of the mounting bracket 140b such that the connecting portion 16062 can come in surface contact with the mounting bracket 140b.

The tilting member 1606b can be coupled to the mounting bracket 140b to perform a pivot motion.

A pivot shaft 1609b can be provided on the tilting member 1606b and the mounting bracket 140b.

On the other hand, a stopper 212 for limiting a relative rotation range of the mounting bracket 140b and the tilting member 1606b can be provided in a contact area between the mounting bracket 140b and the tilting member 1606b.

The stopper 212 can include, for example, a stopper protrusion 16063, and a stopper protrusion accommodating portion 1404 that accommodates the stopper protrusion 16063 and is formed to correspond to a rotation trajectory of the stopper protrusion 16063.

The stopper protrusion 16063 can protrude forward from the tilting member 1606b.

The stopper protrusion 16063 can be bent from an upper end of the tilting member 1606b.

The stopper protrusion accommodating portion 1404, for example, as illustrated in FIG. 29, can be formed through the mounting bracket 140b.

The stopper protrusion accommodating portion 1404, for example, can have both end portions forming approximately 90 degrees.

The stopper 212 can be configured, for example, to rotate between a first position at which the long side portion 1003 of the display unit 100b is horizontally arranged and a second position at which the long side portion 1003 is vertically arranged.

As illustrated in FIG. 29, the tilting shaft 1603 can be provided with an elastic member 1605 that accumulates elastic force when the mounting bracket 140b (the display unit 100b) rotates downward.

Accordingly, the upward rotation of the display unit 100b can be facilitated.

The elastic member 1605 can be implemented as, for example, a torsion coil spring.

The elastic member 1605 can be coupled to a circumference of the pivot shaft 1603.

One end portion of the elastic member 1605 can be supported by the first arm 160b and another end portion can be fixed to the tilting member 1606b.

The elastic member 1605 can accumulate elastic force while being compressed when the tilting member 1606b rotates downward centering on the tilting shaft 1603.

Meanwhile, a tilting driving unit 180b for tilting the display unit 100b up and down about the tilting shaft 1603 can be provided near the tilting member 1606b.

Accordingly, a viewing angle of the screen of the display unit 100b can be easily adjusted.

The tilting driving unit 180b can include a driving gear 181b disposed on any one of the first arm 160b and the tilting member 1606b, a driven gear 182b disposed on another one of the first arm 160b and the tilting member 1606b to be engaged with the driving gear 181b, and a tilting driving motor 183b to rotate the driving gear 181b.

The tilting driving motor 183b can be provided on the first arm 160b, for example.

The driving gear 181b can be provided on a rotating shaft of the tilting driving motor 183b.

The driven gear 182b can be provided on the tilting member 1606b.

As illustrated in FIG. 30, the driven gear 182b can have a substantially semicircular shape, and can be coupled to the tilting shaft 1603.

The driving gear 181b can be disposed at the rear of the tilting shaft 1603 and can be disposed at the center in the circumferential direction of the driven gear 182b.

With the configuration, when the driving gear 181b is rotated in one direction (clockwise) by the tilting driving motor 183b, the driven gear 182b can be rotated counterclockwise centering on the tilting shaft 1603. Accordingly, the tilting member 1606b, the mounting bracket 140b, and the display unit 100b can move down about the tilting shaft 1603. The screen of the display unit 100b can thus face downward.

Conversely, when the driving gear 181b is rotated counterclockwise, the driven gear 182b can be rotated clockwise centering on the tilting shaft 1603. Accordingly, the tilting member 1606b, the mounting bracket 140b, and the display unit 100b can move up about the tilting shaft 1603. The screen of the display unit 100b can thus face upward.

Figure 31:
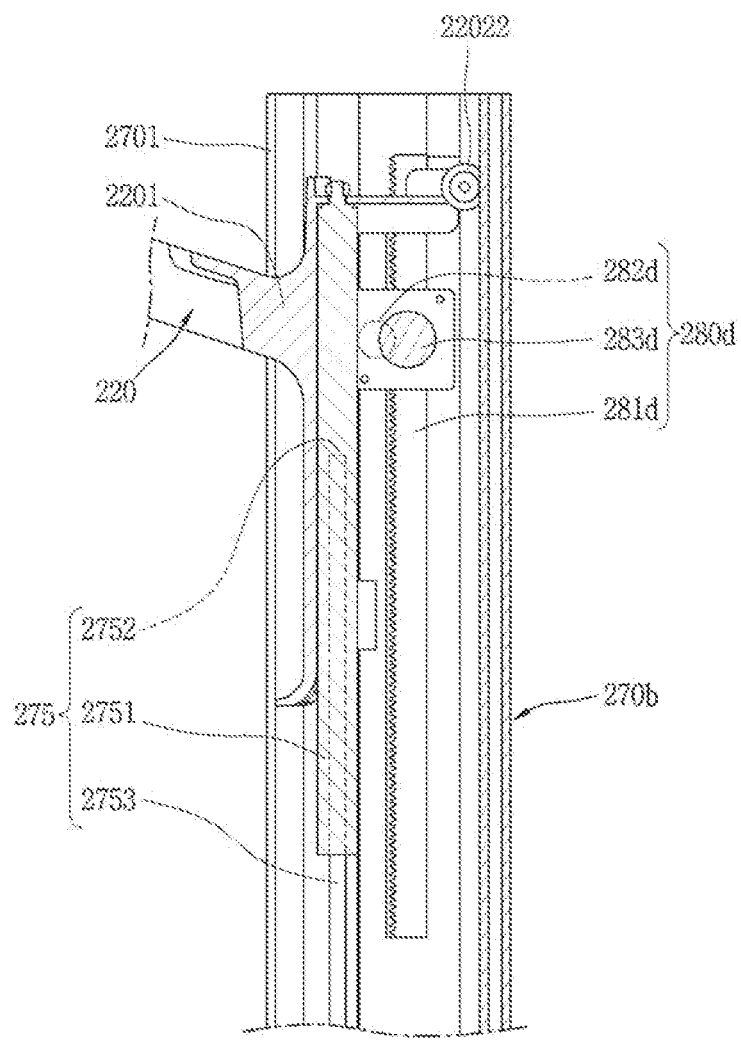
FIG. 31 is a view illustrating an inside of a pillar of FIG. 27 according to an embodiment of the present disclosure.
Figure 32:
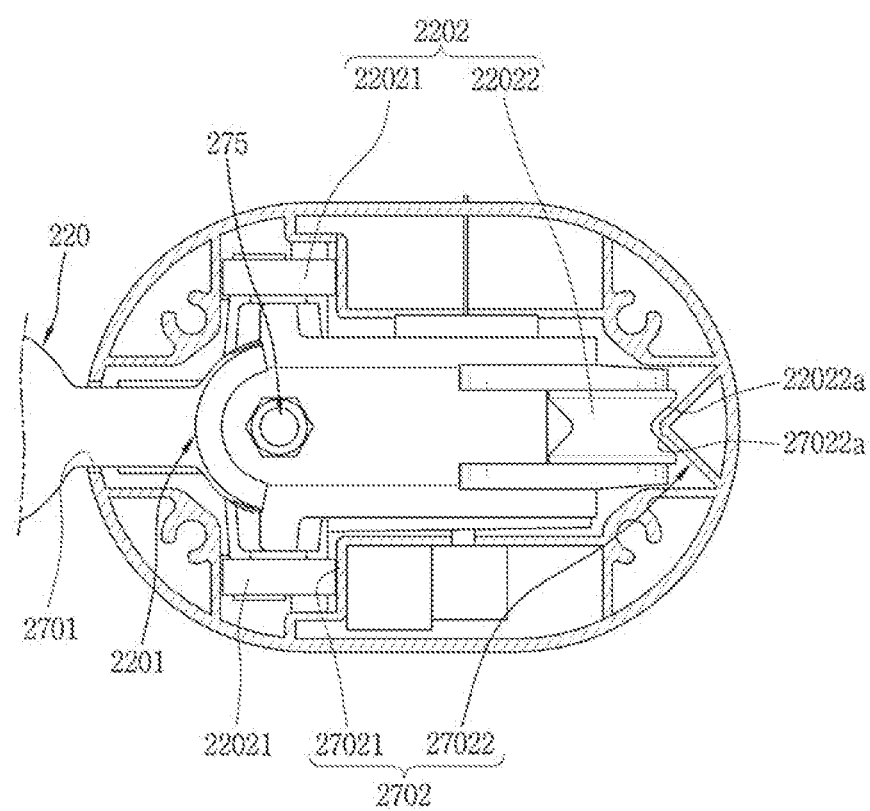
FIG. 32 is a planar view of a roller installation area of FIG. 31 according to an embodiment of the present disclosure.
Figure 33:
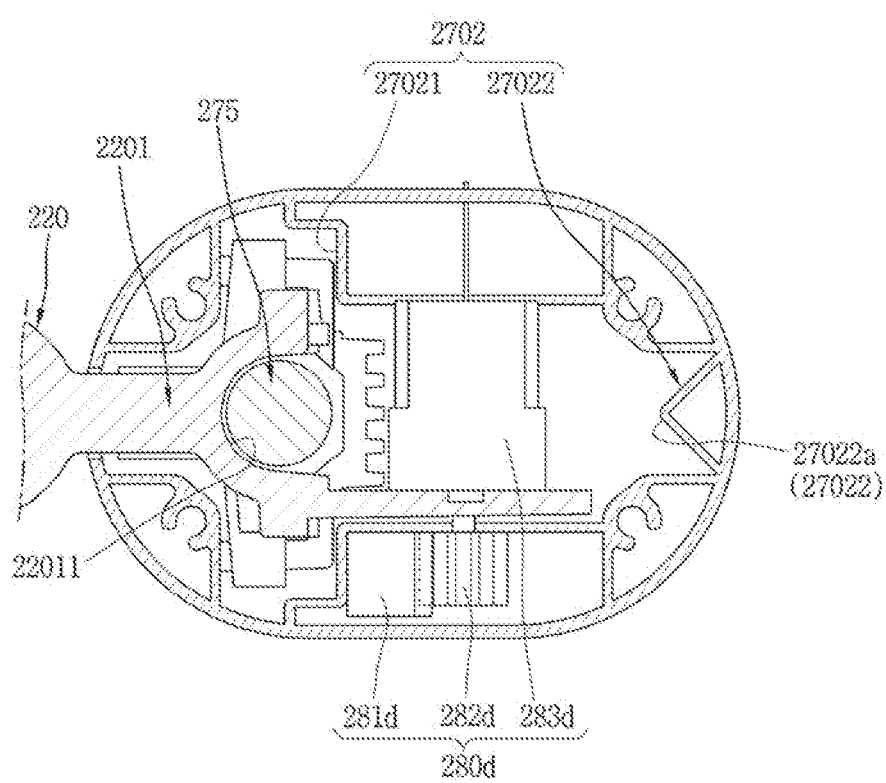
FIG. 33 is a cross-sectional view illustrating a driving motor area of FIG. 32 according to an embodiment of the present disclosure.

FIG. 31 is a view illustrating an inside of a pillar of FIG. 27, FIG. 32 is a planar view of a roller installation area of FIG. 31, and FIG. 33 is a cross-sectional view illustrating a driving motor area of FIG. 32. As illustrated in FIG. 31, the third arm 220 can include a slider 2201 disposed inside the pillar 270b to be movable up and down.

A sliding support portion 2702 for slidably supporting the slider 2201 can be provided on the pillar 270b.

A cutout portion 2701 can be formed by cutting out one side (front side) of the pillar 270b along a movement trajectory of the third arm 220. The third arm 220 can be connected to the slider 2201 through the cutout portion 2701.

The slider 2201 can be formed long in the vertical direction.

The third arm 220 can include an elastic member 275 that accumulates elastic force by being compressed during downward movement of the third arm 220.

The elastic member 275 can be implemented as a gas spring 275 that expands and contracts along the vertical direction.

The gas spring 275 can include, for example, a cylinder 2751, a piston 2752 reciprocating inside the cylinder 2751, and a piston rod 2753 having one end connected to the piston 2752 and another end extending to the outside of the cylinder 2751.

An elastic member coupling portion 22011 into which the elastic member 275 is inserted can be provided in a front area of the slider 2201.

The pillar 270b can be provided with a height adjusting unit 280d for adjusting the height of the third arm 220 by moving the third arm 220 up and down.

This can result in adjusting the height of the display unit 100b.

The height adjusting unit 280d can include a rack tooth part 281d disposed inside the pillar 270b in the vertical direction, a pinion 282d provided on the slider 2201 and engaged with the rack tooth part 281d, and a pinion driving motor 283d to rotate the pinion 282d.

The rack tooth part 281d can be disposed at the rear of the slider 2201.

The elastic member 275 can be disposed at the front of the rack tooth part 281d.

This can result in preventing the slider 2201 from being tilted due to a load applied to the third arm 220.

Meanwhile, the slider 2201 can include a plurality of rollers 2202.

The plurality of rollers 2202 can include, for example, a front roller 22021 provided on a front end portion of the slider 2201 and a rear roller 22022 provided on a rear end portion of the slider 2201.

The sliding support portion 2702 can include, for example, a front rail 27021 with which the front roller 22021 is in rolling contact, and a rear rail 27022 with which the rear roller 22022 is in rolling contact.

As illustrated in FIG. 32, the front roller 22021 can be provided in plurality.

The front rollers 22021 can be spaced apart from each other on both sides of the front end portion of the slider 2201.

The front rollers 22021 can be disposed in both sides of the third arm 220.

This can result in preventing an occurrence of clearance (inclination) of the slider in a transverse direction.

The front roller 22021 can have a cylindrical shape.

The rear roller 22022 can be disposed on the center of the rear end portion of the slider 2201.

The rear roller 22022 can include a concave portion with a center recessed concavely.

The rear rail 27022 can include a convex portion formed to correspond to the concave portion of the rear roller 22022 to come in surface contact with the rear roller 22022.

This can result in preventing an occurrence of clearance (inclination) of the slider in a transverse direction.

As illustrated in FIGS. 31 and 33, the pinion driving motor 283d can be disposed between the elastic member 275 and the rear rail 27022.

With the configuration, when the pinion 282d is rotated counterclockwise by the pinion driving motor 283d, the pinion 282d can move downward along the rack tooth part 281d. Accordingly, the slider 2201 can move upward along the sliding support portion 2702.

Conversely, when the pinion 282d is rotated in an opposite direction (counterclockwise), the pinion 282d can move downward along the rack tooth part 281d and thereby the slider 2201 can move downward along the sliding support portion 2702.

Figure 34A:
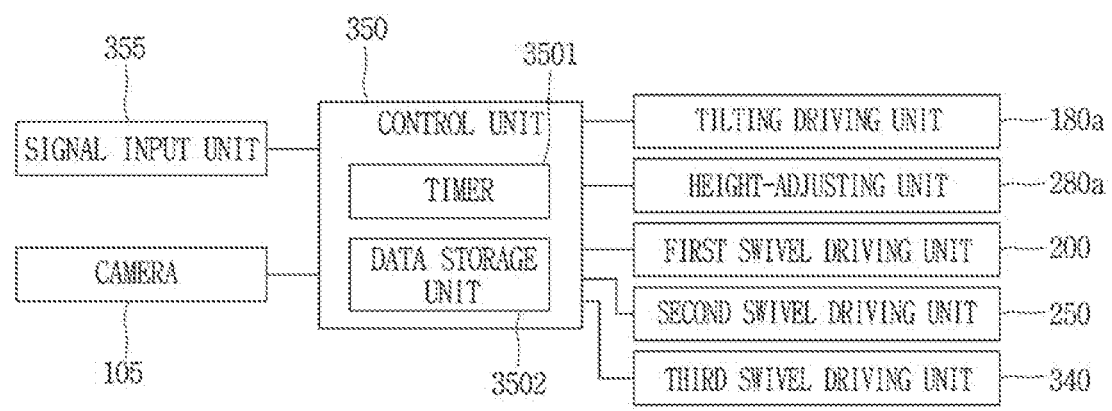
FIG. 34A is a control block diagram of the display device of FIG. 1 according to an embodiment of the present disclosure.

FIG. 34A is a control block diagram of the display device of FIG. 1. As illustrated in FIG. 34A, the display device according to the implementation can include a control unit 350 implemented as a microprocessor by including a control program.

The control unit 350 can adjust tilting angle, height, and distance of the display unit 100a, respectively.

The control unit 350 can include a signal input unit 355 for inputting an operation signal.

The signal input unit 355 can be configured to input a signal in a pressing and/or touching manner, for example.

A camera 105 for capturing a user's posture can be connected to the control unit 350 to perform communication. The camera 105 can be disposed on the front surface of the display unit 100a.

The control unit 350 can be connected to the tilting driving unit 180a to adjust the tilting angle of the display unit 100a.

The control unit 350 can be connected to the height adjusting unit 280a to adjust the height of the display unit 100a.

The control unit 350 can be connected to a distance adjusting unit to adjust the distance of the display unit 100a.

The distance adjusting unit can include, for example, the first swivel driving unit 200 and the second swivel driving unit 250.

The distance adjusting unit can include, for example, the second swivel driving unit 250 and the third swivel driving unit 340.

The distance adjusting unit can include, for example, the first swivel driving unit 200, the second swivel driving unit 250, and the third swivel driving unit 340.

The control unit 350 can include, for example, the second swivel driving unit 250 and the third swivel driving unit 340.

Hereinafter, a description will be given of a case in which the distance adjusting unit includes the first swivel driving unit 200, the second swivel driving unit 250, and the third swivel driving unit 340.

The control unit 350 can recognize user's basic posture and changed posture captured by the camera 105 and adjust the user's viewing angle by controlling each of the tilting driving unit 180a, the height adjusting unit 280a, the first swivel driving unit 200, the second swivel driving unit 250, and the third swivel driving unit 340.

For example, when the user maintains the basic posture for a preset time or longer, the control unit 350 can induce the change in the user's posture by actively adjusting viewing angles of the user and the display unit 100a.

When the user's posture is changed from the basic posture and the preset time elapses, the control unit 350 can notify that the posture has changed through the display unit 100a.

When the user's posture changes from the basic posture and the preset time elapses, the control unit 350 can guide posture change information through the display unit 100a and also allow the user to perform a light neck exercise while looking at the display unit 100a. More specifically, while the user is looking at the screen of the display unit 100a, when the user rotates the display unit 100a up and down, the control unit 350 can guide the user to move his or her neck up and down. On the other hand, when the display unit 100a moves to left and right, the control unit 350 can guide the user to move his or her neck to left and right.

The control unit 350 can include a timer 3501 for counting time.

The control unit 350 can include a data storage unit 3502 for storing various types of information including information related to the user's basic posture and changed postures.

Figure 34B:
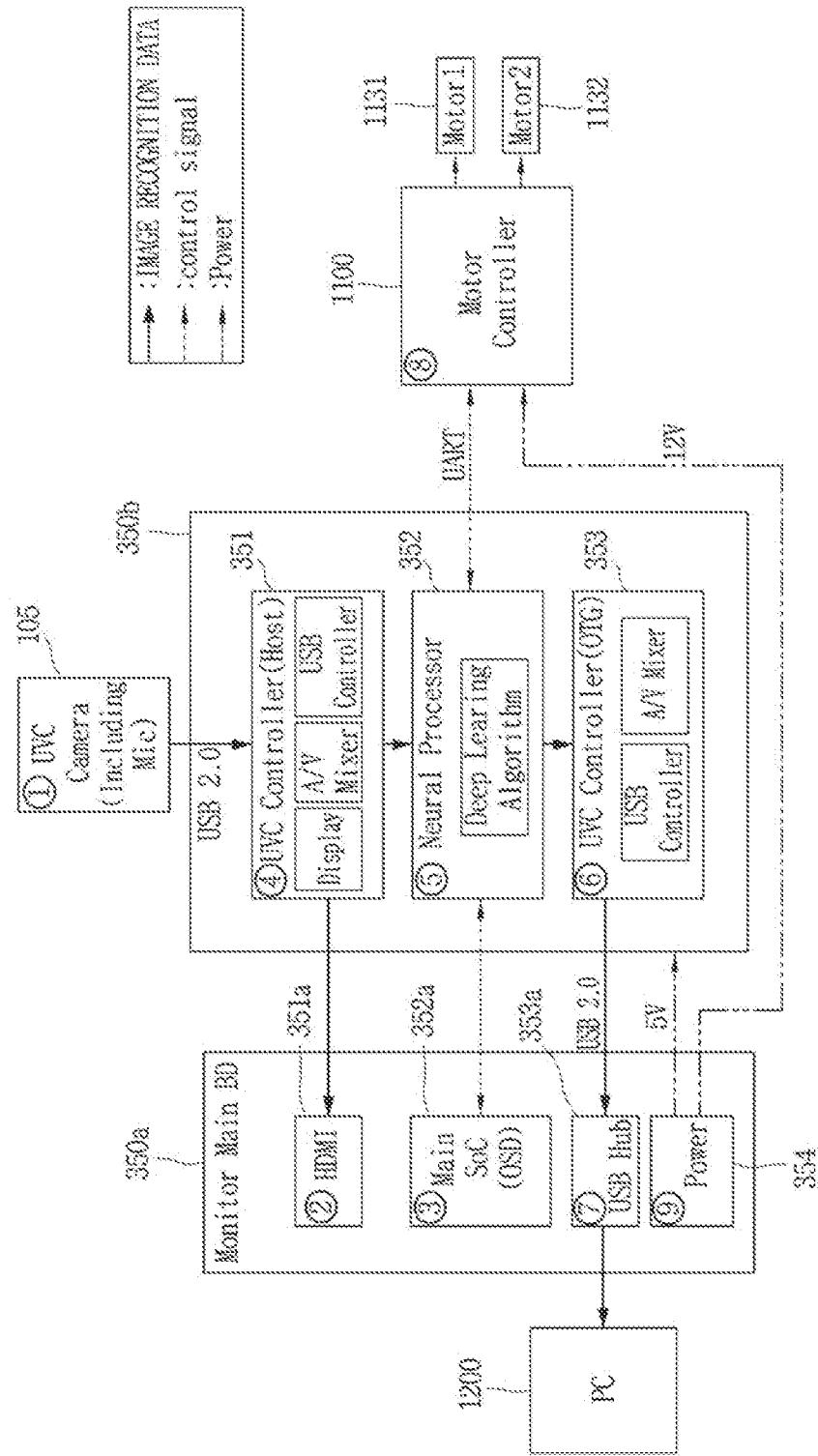
FIG. 34B is a block diagram illustrating the configuration of a motor control system (driving control system) for controlling driving of the display device of FIG. 1 according to an embodiment of the present disclosure.

FIG. 34B is a block diagram illustrating configuration of a motor control system (or driving control system) for controlling the driving of the display device of FIG. 1. The motor control system of FIG. 34B can be referred to as an AI camera system.

As illustrated in FIGS. 1, 2, 34A, and 34B, the motor control system can include the display device 100, a control unit 350b, and a motor controller 1100. In addition, the motor control system can further include a controller PC 1200 interoperating with the control unit 350b. The control unit 350 can be implemented in the display device 100 as illustrated in FIG. 34A. Alternatively, the control unit 350b can be disposed outside the display device 100 to interoperate with the display device 100, as illustrated in FIG. 34B. As another example, the control unit 350b can be implemented as a main board of a monitor corresponding to the display unit 100a, to be disposed in the display device 100 as illustrated in FIG. 34A. The control unit 350b corresponding to a camera system can be implemented as, for example, NXP 1.MX8M PLUS for AI computing, but the present disclosure is not limited thereto.

The display device 100 can include a main board 350a, a control unit 350b, and a motor controller 1100. The main board 350a can include an HDMI 351a, a main SoC 352a, a USB hub 353a, and a power supply unit 354. The display unit 100a can be implemented as an On-screen display.

The main SoC 352a of the display unit 100a can adjust (control) a screen of the monitor corresponding to the display unit 100a. The display unit 100a can be serially connected to the camera system corresponding to the control unit 350b to perform serial communication. The power supply unit 354 can supply power to the main board of the monitor corresponding to the display unit 100a. In addition, the power supply unit 354 can supply power even to the motor controller 1100 connected to a camera board and a plurality of motors.

The camera 105 can be configured to capture and transmit RGB image data. The camera 105 can be connected to the control unit 350b corresponding to the camera system through a USB interface. The camera 105 can be a USB camera that supports a USB among video devices. The camera 105 can be a UVC camera corresponding to a USB video device class, but is not limited thereto.

The control unit 350b corresponding to the camera system can include a first controller 351, a neural processor 352, and a second controller 353. The first controller 351, the neural processor 352, and the second controller 353 can be interfaced through the HDMI 351a, the main SoC 352a, and the USB hub 353a, respectively.

The first controller 351 can be referred to as a UVC controller and operate as a host. The first controller 351 as the host can receive a video/audio signal of the UVC camera 105. The neural processor 352 can implement an embedded deep-learning acceleration system to drive an image recognition algorithm. The second controller 353 can transmit the video/audio signal of the UVC camera 105 to the controller PC 1200 through an On-The-Go (OTG) operation. The second controller 353 can receive a Stand controller signal from the controller PC 1200. The second controller 353 which received the stand controller signal can control the display device 100.

The controller PC 1200 can receive a signal from the UVC camera 105 through a USB interface. The controller PC 1200 can transmit the Stand controller signal through the USB interface.

The motor controller 1100 can drive a plurality of motors to move or tilt the display device 100 in the vertical direction. In this regard, the motor controller 1100 can be connected to the control unit 350b corresponding to the camera system through a General Purpose Input/Output (GPIO) interface.

In this regard, the UVC camera 105 can be provided on the display unit 100a to capture the user's posture, and can be connected to the control unit 350b to perform communication. The control unit 350b can determine the user's basic posture and posture change (changed posture) photographed by the UVC camera 105, respectively. The control unit 350b can include the tilting driving unit 180a, the height adjusting unit 280a, the first swivel driving unit 200, the second swivel driving unit 250, and the third swivel driving unit 340, to adjust the user's viewing angle.

Figure 34C:
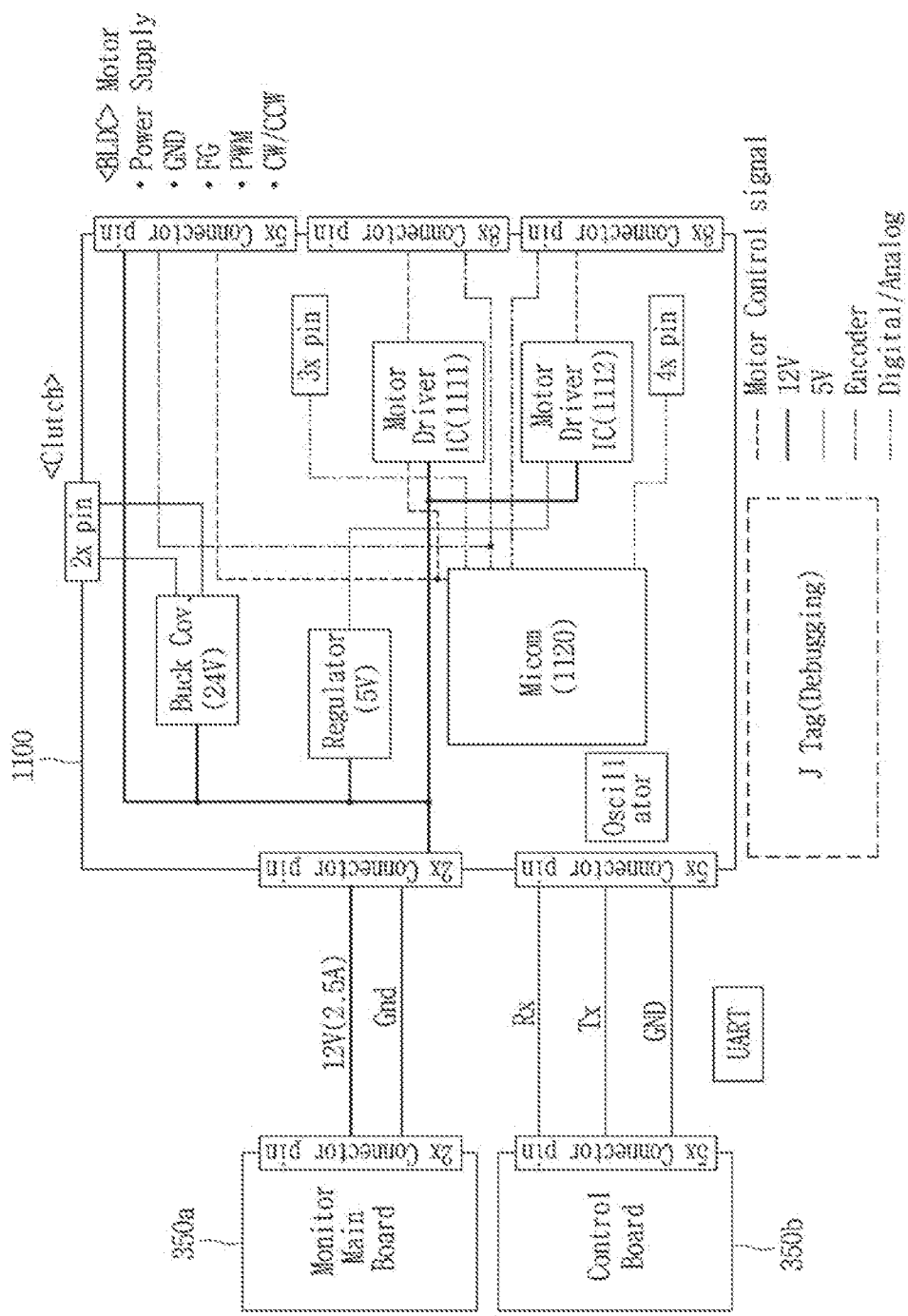
FIG. 34C is a diagram illustrating the configuration of a motor controller connected to a plurality of control boards in accordance with an implementation of the present disclosure.

Meanwhile, the controller 350, 350b disclosed herein can be connected to the motor controller 1100 through a Universal Asynchronous Receiver Transmitter (UART) interface. FIG. 34C is a diagram illustrating the configuration of a motor controller connected to a plurality of control boards in accordance with an implementation of the present disclosure.

Referring to FIG. 34C, the main board 350a and the control board 350b corresponding to the control unit 350b can be operatively coupled to the motor controller 1100. The main board 350a can be connected to the motor controller 1100 through a power line and a ground line. The control board 350b can be connected to the motor controller 1100 through a reception line Rx, a transmission line Tx, and a ground line GND. The control board 350b can be disposed in the fixing unit 310 of FIGS. 1 and 10, but is not limited thereto. The motor controller 1100 can be interfaced with the control board 350b or disposed in the control board 350b.

The motor controller 1100 can be configured such that first and second motor driver ICs 1111 and 1112 are controlled through a microcomputer chip 1120. The first and second motor driver ICs 1111 and 1112 can control first and second motors 1131 and 1132 of FIG. 34B through a motor control signal. A voltage signal of 12V or 5V can be applied to the first and second motor driver ICs 1111 and 1112. Meanwhile, a motor control signal and an encoder signal can be transmitted to the first and second motors 1131 and 1132 through an output of the motor controller 1100.

At least one of the tilting driving unit 180a, the height adjusting unit 280a, the first swivel driving unit 200, the second swivel driving unit 250, and the third swivel driving unit 340 of FIG. 34A can be controlled by the first and second motors 1131 and 1132 that are controlled by the motor control signal and the encoder signal.

Figure 35A:
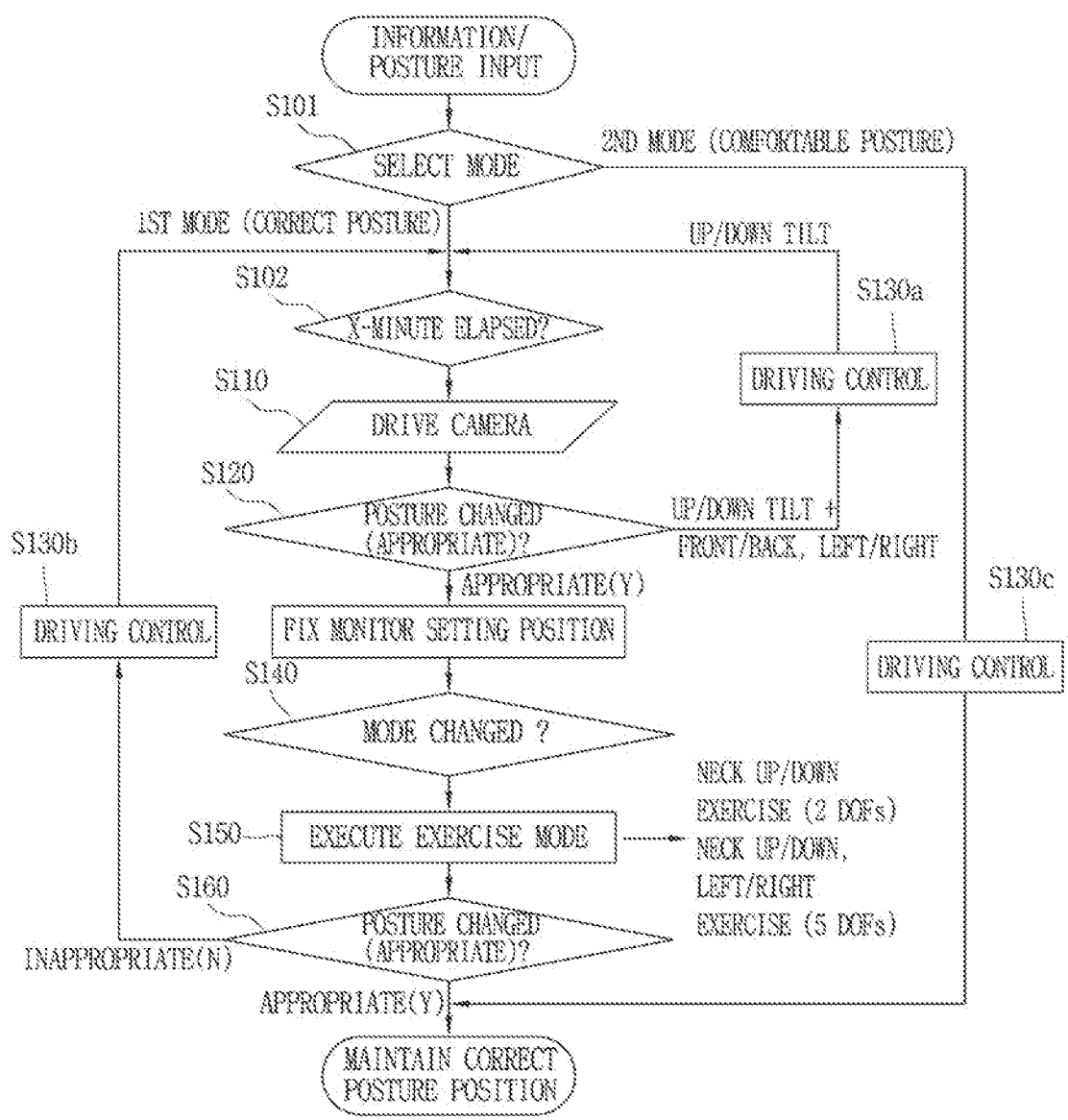
FIG. 35A is a flowchart of a driving control method for a display device in accordance with an implementation.
Figure 35B:
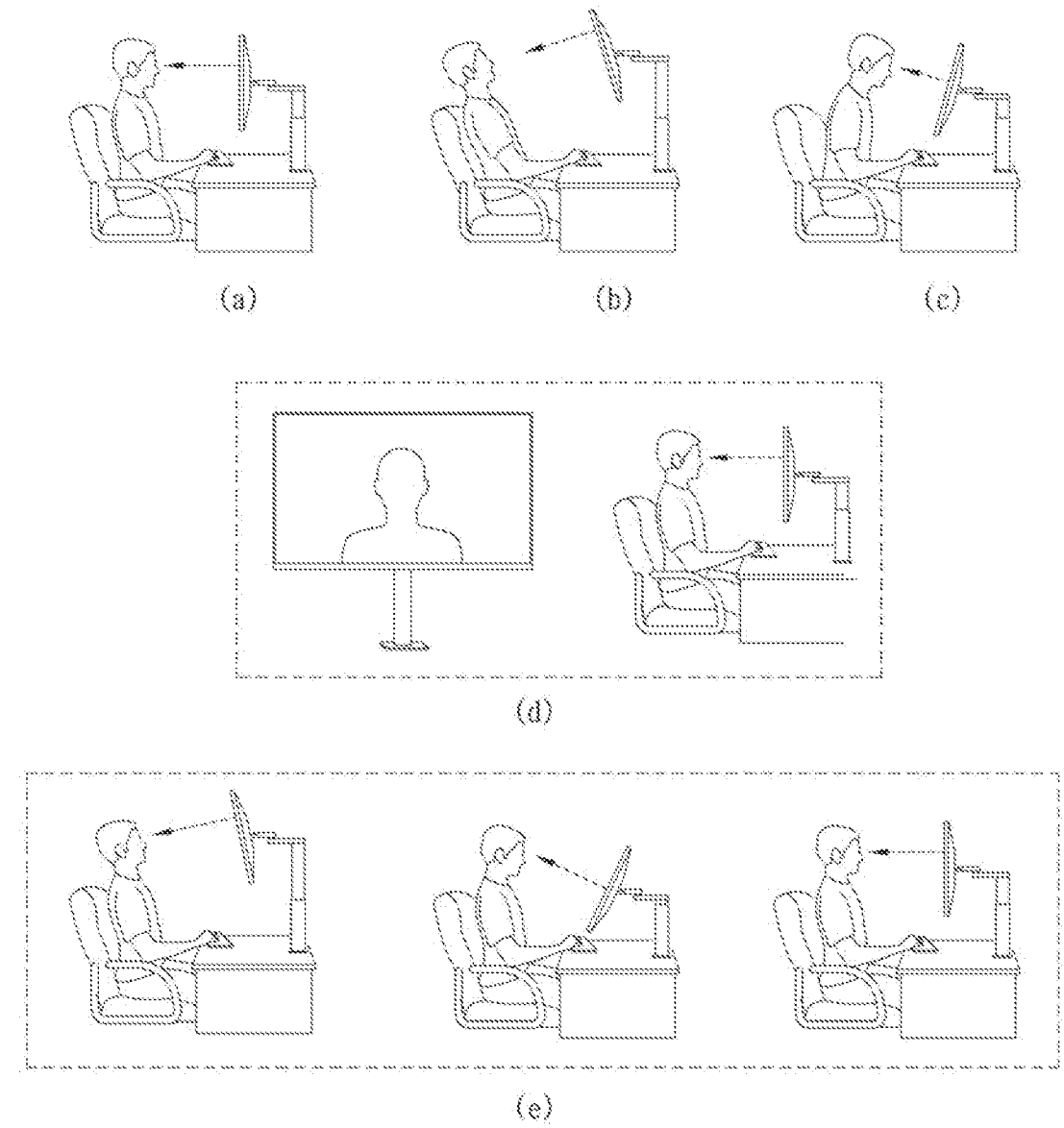
FIG. 35B is a conceptual view illustrating various postures of a user using the display device according to an embodiment of the present disclosure.

On the other hand, the display device described herein can be tilted, adjusted in height, and swiveled to adjust the user's viewing angle based on information related to the user's posture. With regard to this, FIG. 35A is a flowchart of motor (driving) control method for a display device in accordance with an implementation. FIG. 35B is a conceptual view illustrating various postures of a user using the display device. The motor control method for the display device can be performed by the controller 350, 350b of FIGS. 34A and 34b in association with other components of the motor control system.

Referring to FIGS. 34A to 35A, the motor control method for the display device can include a camera driving (operating) process (S110), a posture change determination process (S120), and driving control processes (S130a and S130b). The motor control method for the display device can further include a mode selection process (S101) and a time lapse determination process (S102). In addition, the motor control method for the display device can further include a mode change determination process (S140) and an exercise mode execution process (S150).

The motor control method for the display device can be performed by the control unit 350 of FIG. 34A, in cooperation with the camera 105, the (signal) input unit 355, and the driving units 180a, 280a, 200, 250, and 340. In the mode selection process S101, the control unit can recognize a posture of a user using the display device to determine whether the user's posture is a first mode (correct posture) or a second mode (comfortable posture or incorrect posture). That is, in the mode selection process S101, the control unit can recognize the posture of the user who uses the display device, to determine whether the user's posture is a first mode corresponding to a correct posture or a second mode corresponding to another posture other than the correct posture. In this regard, the posture of the user using the display device can be recognized by the camera 105.

Referring to FIG. 35B, the control unit can recognize various postures of the user who uses the display device. As illustrated in (a) of FIG. 35B, the user can be recognized as sitting in a correct posture, and it can be determined as a first mode (correct posture) in the mode selection process S101. As illustrated in (b) of FIG. 35B, the user can be recognized as sitting in a backwardly declined posture. It can be determined as a second mode (a backwardly declined posture) in the mode selection process S101. As illustrated in (c) of FIG. 35B, the user can be recognized as sitting in a forwardly inclined posture. It can be determined as a second mode (a forwardly inclined posture) in the mode selection process S101.

When it is determined that the user's posture is the first mode in the mode selection process S101, the control unit can determine whether or not a predetermined time has elapsed in the time lapse determination process S102. When the user's posture is the first mode and the predetermined time elapses, the user can operate the camera provided on the display device after a predetermined time (e.g., several minutes) by using the display device in the camera driving process S110. In the posture change determination process S120, the control unit can determine whether the user's posture captured through the camera has changed and whether a changed posture is appropriate. In this regard, as illustrated in (d) of FIG. 35B, when the user's gaze is recognized in a central area of the display unit and the user's posture is determined to be correct, the monitor can be fixed to the corresponding setting. Accordingly, when the user's posture is determined as the first mode (correct posture), an optimal height of the monitor can be set according to the user's gaze (eye level) according to a guidance. On the other hand, when the changed posture is determined to be incorrect, the driving control process S130a can be carried out.

In the driving control process S130a, the control unit can control the first arm 160a of FIG. 1 to be tilted in the vertical direction such that the display device can be tilted in the vertical direction. In this regard, in addition to the vertical tilting control, the position of the monitor can also be controlled to be moved in a front and rear direction or a left and right direction. On the other hand, when it is determined that the changed posture is appropriate, the control unit can control a monitor setting position to be fixed. Thereafter, the mode change determination process S140 and the exercise mode execution process S150 can be performed.

On the other hand, when the user's posture is the second mode, the driving control process S130c can be performed to correct the user's posture. In the driving control process S130c, the control unit can control the first arm 160a of FIG. 1 to be tilted in the vertical direction such that the display device can be tilted in the vertical direction. In this regard, in addition to the vertical tilting control, the position of the monitor can also be controlled to be moved in a front and rear direction or a left and right direction.

When it is determined that the user's posture is inappropriate, the vertical tilting and height of the monitor can be adjusted, as illustrated in (e) of FIG. 35B, through the driving control processes S130a to S130c of FIG. 35A. Accordingly, as illustrated in (e) of FIG. 35b, while the height and tilting angle of the monitor can be periodically adjusted in an automatic manner, the user can move his or her neck or waist to sit in a correct posture.

In the mode change determination process S140, the control unit can determine whether a predetermined time (e.g., several minutes or several hours) has elapsed after the monitor setting position is fixed. That is, in the mode change determination process S140, the control unit can determine whether it is necessary to execute an automatic change mode to automatically change the position of the monitor as the predetermined time elapses after the monitor setting position is fixed.

When the execution of the automatic change mode is required, the control unit can receive an input for selecting a part of the user's body to be exercised through the input unit, and automatically adjust the height and tilting angle of the monitor to induce the exercise of the part of the user's body such as a neck or waist, in the exercise mode execution process S150. In this regard, the display device can be tilted in the vertical direction so that the neck or waist can be moved in the vertical direction. A direction, a range, and a speed in which the display device is driven can be differently set depending on the part of the user's body selected through the input unit. To this end, a driving control for the display device can be performed in two degrees of freedom. In addition, the display device can be tilted to left and right so that the neck can be moved to left and right. To this end, a driving control for the display device can be performed in five degrees of freedom.

To this end, the control unit 350, 350b of FIGS. 34A and 34B can determine whether the posture of the user photographed through the camera has changed and whether a changed posture is appropriate. When it is determined that a changed posture is inappropriate, the control unit can control the first arm to be tilted in the vertical direction such that the display unit can be tilted in the vertical direction. On the other hand, when it is determined that the changed posture is appropriate, the control unit 350, 350b can control the monitor setting position to be fixed. When a predetermined time elapses after the monitor setting position is fixed, the control unit 350, 350b can control the monitor to be adjusted in height and tilting angle in the vertical direction or the left and right direction.

The driving control method for the display device can further include a posture change determination process (S160) and a setting position maintenance process (S170) even after the exercise mode execution process S150 is performed. In the posture change determination process S160, the control unit can determine whether the user's posture captured through the camera at a currently set position of the monitor has changed and whether a changed posture is appropriate.

When the changed posture is determined to be inappropriate, the driving control process S130b can be carried out again. In the driving control process S130b, the control unit can control the first arm 160a of FIG. 1 to be tilted in the vertical direction such that the display device can be tilted in the vertical direction. In this regard, in addition to the vertical tilting control, the position of the monitor can also be controlled to be moved in the front and rear direction or the left and right direction. On the other hand, when the changed posture is determined to be appropriate, the setting position maintenance process S170 can be performed so that the monitor setting position can be fixed.

Even after the driving control processes S130a and S130b are performed, whether a predetermined time has elapsed can be determined (S102) and the processes following the camera driving process S110 can be repeatedly performed.

Figure 36:
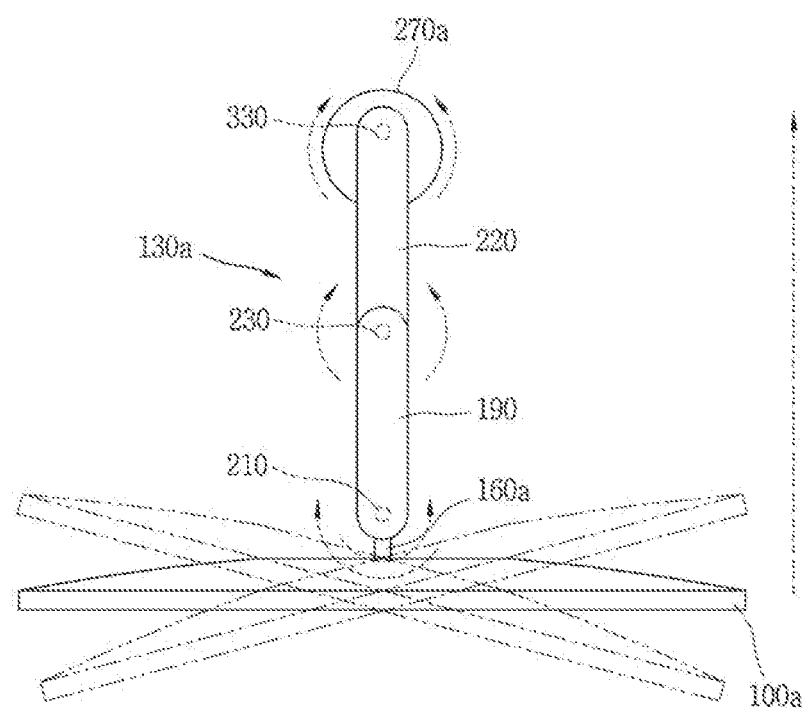
FIG. 36 is a planar view illustrating a forward movement of a display unit of FIG. 1 according to an embodiment of the present disclosure.
Figure 37A:
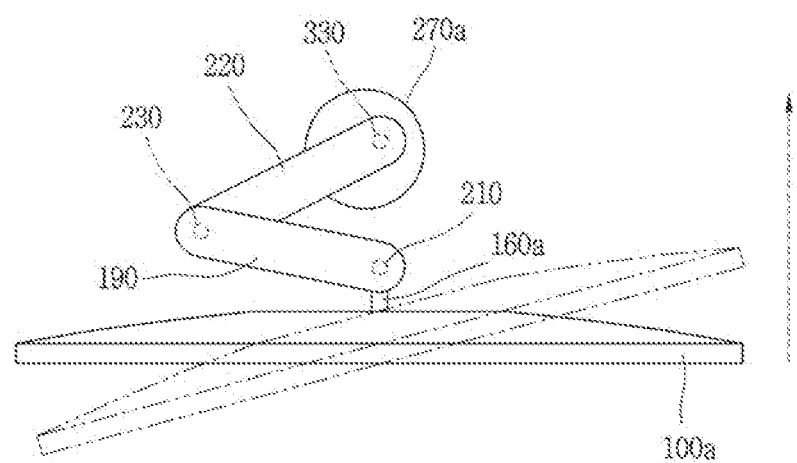
FIG. 37A is a planar view illustrating an intermediate movement of the display unit of FIG. 36 according to an embodiment of the present disclosure.
Figure 37B:
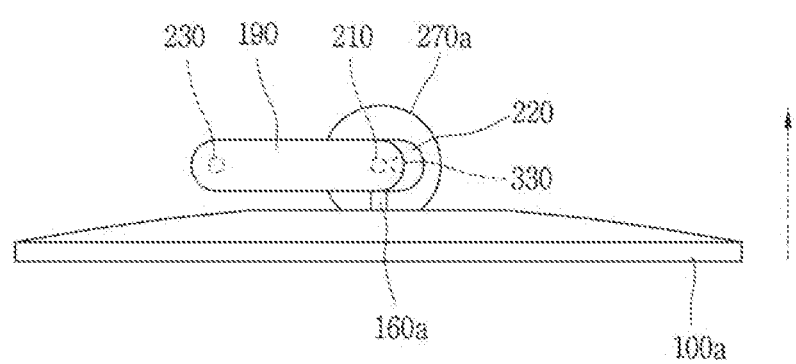
FIG. 37B is a view illustrating a rearward movement of the display unit of FIG. 36 according to an embodiment of the present disclosure.

With respect to the configuration and flowchart for controlling the display device described herein, the display unit 100a of FIG. 1 can move forward and backward. In this regard, FIG. 36 is a planar view illustrating a forward movement of the display unit of FIG. 1, FIG. 37A is a planar view illustrating an intermediate movement of FIG. 36, and FIG. 37B is a view illustrating a rearward movement of the display unit of FIG. 36.

As illustrated in FIGS. 36A to 37B, the control unit 350 can control the distance adjusting unit to adjust the distance between the display unit 100a and the user.

In the implementation, the distance of the display unit 100a can be adjusted by the user's manual manipulation with respect to the display device.

As illustrated in FIG. 35, the control unit 350 can control the third arm 220 to protrude forward with respect to the pillar 270a, the second arm 190 to extend in the longitudinal direction of the third arm 220, and the first arm 160a to extend in the longitudinal direction of the second arm 190.

In this case, the display unit 100a can protrude forward farthest from the pillar 270a.

The control unit 350 can control the first swivel driving unit 200 such that the display unit 100a can swivel to left and right about the first swivel shaft 210.

Accordingly, the screen of the display unit 100a can swivel to left and right.

When it is desired to move the display unit 100a backward, as illustrated in FIGS. 34A and 36, the control unit 350 can control the third swivel driving unit 340 to swivel the third arm 220 in a clockwise direction and control the second swivel driving unit 250 to swivel the second arm 190 in a counterclockwise direction. The control unit 350 can control the first swivel driving unit 200 so that the screen of the display unit 100a faces forward.

When it is desired to move the display unit 100a further backward, as illustrated in FIG. 37B, the control unit 350 can control the third swivel driving unit 340 to set the third arm 220 in the left and right direction and control the second swivel driving unit 250 to set the second arm 190 above the third arm 220 in the left and right direction. The control unit 350 can control the first swivel driving unit 200 so that the screen of the display unit 100a faces forward.

Figure 38:
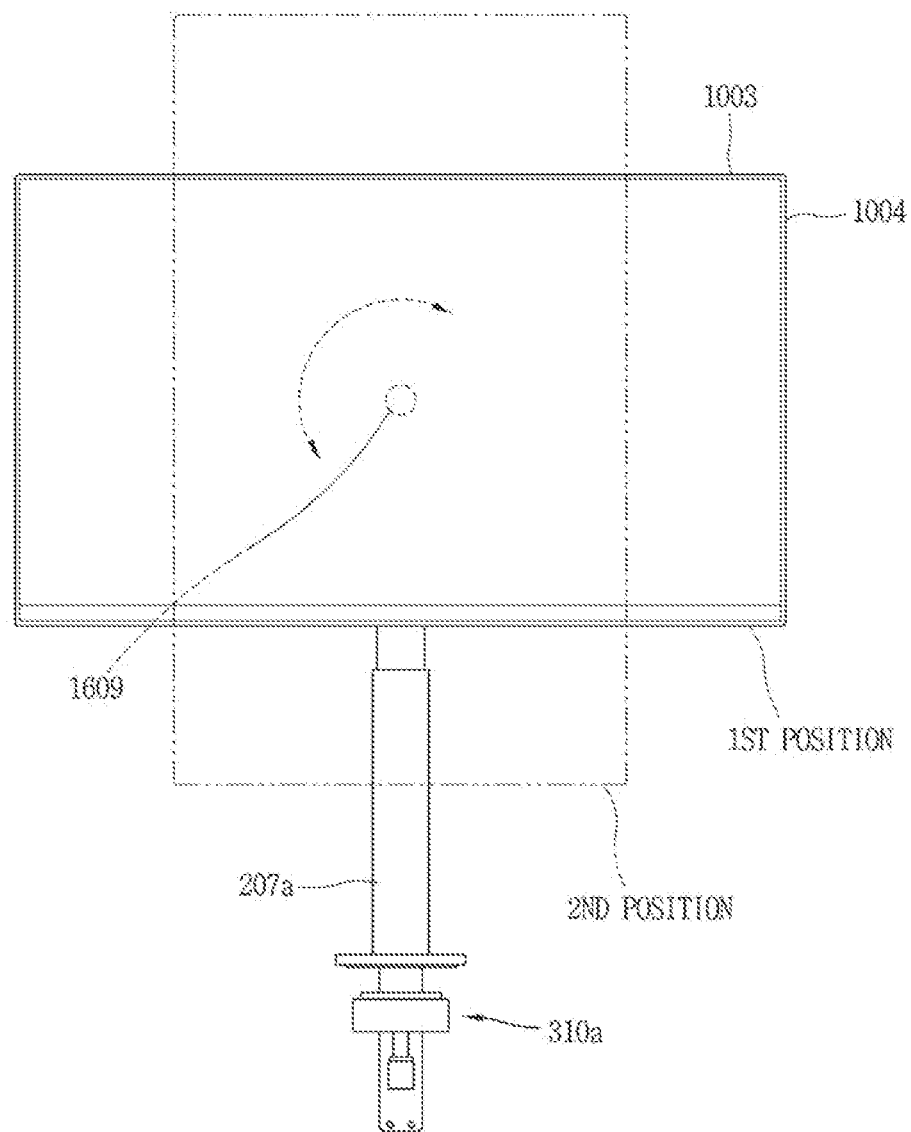
FIG. 38 is a view illustrating a state in which the display unit of FIG. 2 has pivoted in a vertical (up and down) direction according to an embodiment of the present disclosure.

FIG. 38 is a view illustrating a state in which the display unit of FIG. 2 pivots in the vertical (up and down) direction. As illustrated in FIG. 38, the display device according to the implementation can pivot (rotate, swivel) between a first position at which the long side portion 1003 of the display unit 100a is horizontally arranged and a second position at which the long side portion 1003 is vertically arranged.

When it is desired to pivot the display unit 100a to the second position, the display unit 100a can pivot clockwise. When the display unit 100a is pressed in the clockwise direction, the display unit 100a can pivot about the pivot shaft 1609a. At this time, the display unit 100a can be stopped at the second position by the stopper 211.

Figure 39:
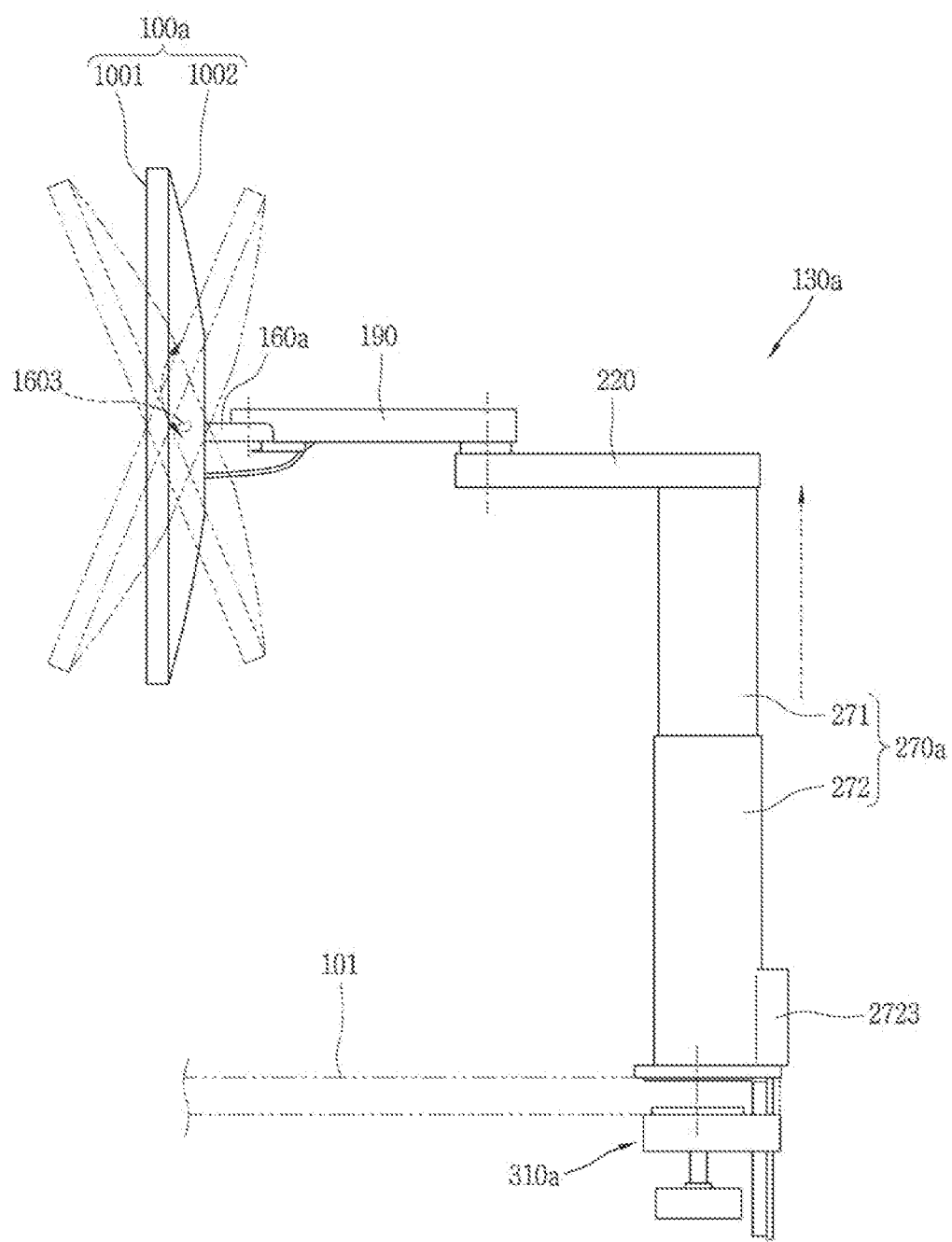
FIG. 39 is a view illustrating vertical tilting and height adjustment of the display unit of FIG. 2 according to an embodiment of the present disclosure.

FIG. 39 is a view illustrating vertical tilting and height adjustment of the display unit of FIG. 2. As illustrated in FIG. 39, the control unit 350 can control the tilting driving unit 180a to adjust a tilting angle of the screen of the display unit 100a.

In the implementation, the tilting angle of the screen of the display unit 100a can be manually adjusted. Specifically, when it is desired to manually adjust the tilting angle of the screen of the display unit 100a, the display unit 100a can be pressed upward or downward by gripping an edge of the display unit 100a. Accordingly, the display unit 100a can rotate upward or downward centering on the tilting shaft 1603.

The control unit 350 can control the height adjusting unit 280a to adjust the height of the display unit 100a.

In the implementation, the height of the display unit 100a can be manually adjusted. To increase the height of the display unit 100a, the upper pillar 271 or the third arm 220 can be moved upward while gripping the lower pillar 272. On the other hand, when it is desired to reduce the height of the display unit 100a, the third arm 220 or the upper pillar 271 can be pressed toward the lower pillar 272.

The foregoing description has been given of specific implementations of the present disclosure. However, since the present disclosure can be embodied in various forms without departing from the range or essential characteristics thereof, the implementations described above should not be limited by specific contents for carrying out the invention.

It should also be understood that the above-described implementations are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A display device comprising:
   a display configured to display an image;
   a mounting bracket coupled to a rear surface of the display;
   a first arm connected to the mounting bracket for tilting the mounting bracket up and down;
   a second arm connected to an end portion of the first arm and the first arm being configured to rotate based on a first swivel shaft disposed in the second arm;
   a third arm connected to an end portion of the second arm and the second arm being configured to rotate based on a second swivel shaft disposed in the third arm;
   a pillar connected to the third arm and the pillar being configured to move up and down;
   a fixing part configured to be fixed to an external object;
   a tilting shaft horizontally disposed on an end portion of the first arm; and
   a camera disposed on the display, the camera being configured to capture a posture of a user or a viewing angle of the user's eyes,
   wherein the pillar is connected to an upper surface of the fixing part and the pillar is configured to rotate based on a third swivel shaft disposed in the fixing part or the pillar,
   wherein the first arm is coupled to be vertically tilted on the tilting shaft,
   wherein vertical tilting angle of a screen of the display is adjusted with respect to the viewing angle, and
   wherein a coupling area between the first arm and the second arm are includes:
   a first swivel shaft coupled to the second arm for providing a movable joint between the first arm and the second arm;
   a fixed gear disposed on an end portion of the first arm in a circumferential direction;
   a driving gear engaged with the fixed gear; and
   a first swivel driving motor configured to rotate the driving gear.

2. The display device of claim 1, further comprising:
   a tilting driving unit disposed between the display unit and the first arm to allow the display unit to be tilted based on a tilting shaft disposed horizontal to the first arm;
   a height adjusting unit to adjust a height of the third arm with respect to the pillar; and
   a control unit to control each of the tilting driving unit and the height adjusting unit based on an input signal.

3. The display device of claim 2, further comprising:
   a first swivel driving part configured to allow the first arm to rotate relative to the second arm;
   a second swivel driving part configured to allow the second arm to rotate relative to the third arm; and
   a third swivel driving part configured to allow the pillar to rotate relative to the fixing part,
   wherein the controller is further configured to control each of the first swivel driving part, the second swivel driving part, and the third swivel driving part to adjust a distance between the display and a user based on an input signal.

4. The display device of claim 3, further comprising a camera disposed on the display, the camera being configured to capture an image includes a posture of the user and communicate with the controller,
   wherein the controller is further configured to:
   determine a basic posture of the user and a changed posture of the user based on the image captured by the camera, and
   control each of the tilting driving part, the height adjusting part, the first swivel driving part, the second swivel driving part, and the third swivel driving part to adjust a position of the display to be aligned with a viewing angle of the user.

5. The display device of claim 2, wherein the controller is further configured to:
   determine whether a posture of the user using the display device is a first mode corresponding to a correct posture or a second mode corresponding to another posture other than the correct posture, and
   in response to a predetermined amount of time elapsing after determining that the posture of the user is the first mode, determine whether the posture has changed from the first mode.

6. The display device of claim 5, wherein the controller is further configured to:
   in response to determining that the posture of the user has changed from the first mode, tilt the first arm in a vertical direction for tilting the display in the vertical direction,
   set a monitor setting position of the display device to a fixed state when the display is tilted to align with a viewing angle of the user, and
   automatically readjust a height and a tilting angle of the display when a predetermined time elapses after the monitor setting position has been set to the fixed state.

7. The display device of claim 1, wherein the pillar comprises:
   a lower pillar connected to the fixing part;
   an upper pillar configured to move up and down with respect to the lower pillar; and
   a first elastic member configured to compress when the upper pillar moves down and accumulate elastic force, and
   wherein the third arm is disposed on the upper pillar.

8. The display device of claim 7, wherein the lower pillar includes a rack tooth part, and a pinion engaged with the rack tooth part.

9. The display device of claim 7, wherein the upper pillar includes a lead screw, and
   wherein the lower pillar includes a female screw member screwed to the lead screw.

10. The display device of claim 1, wherein the third arm includes a slider disposed in the pillar and the slider being configured to move up and down, and
    wherein the pillar includes:
    a sliding support portion configured to support the slider; and
    a first elastic member configured to compress when the slider moves down and accumulate elastic force.

11. The display device of claim 10, wherein the slider includes a plurality of rollers, and
    wherein the sliding support portion includes a plurality of rails, the plurality of rollers being in rolling contact with the plurality of rails.

12. The display device of claim 11, wherein the pillar includes a cutout portion cut out along a movement trajectory of the third arm,
    wherein the plurality of rollers include:
    front rollers disposed in a front area of the slider adjacent to the cutout portion; and a rear roller disposed in a rear area of the slider spaced apart from the cutout portion.

13. The display device of claim 12, wherein the front rollers are disposed on opposite sides of the third arm in an area of the slider that is adjacent to the cutout portion, and wherein the rear roller is disposed on an extension line of the third arm in an area of the slider that is spaced apart from the cutout portion.

14. The display device of claim 11, wherein the pillar includes a height adjusting part configured to adjust a height of the third arm.

15. The display device of claim 14, wherein the height adjusting part includes:
   a rack tooth part disposed in the pillar in a vertical direction; and
   a pinion disposed on the slider and engaged with the rack tooth part.

16. The display device of claim 1, further comprising:
   a tilting member configured to be tiltable up and down based on the tilting shaft and connected to the mounting bracket; and
   a tilting driving part configured to tilt the display based on the tilting shaft,
   wherein the tilting driving unit is disposed at the tilting member and the first arm to allow the tilting member to be tilted up and down based on the tilting shaft.

17. The display device of claim 1, further comprising:
   a pivot shaft configured to support the tilting member.

18. The display device of claim 1, wherein the first arm includes a first arm body and a pivot shaft pivotable with respect to the first arm body or the mounting bracket;
   wherein the tilting shaft is disposed in or adjacent to the pivot shaft.

19. The display device of claim 1, further comprising:
   a protrusion protruding in an axial direction from one of contact surfaces of the first arm and the second arm; and
   a protrusion accommodating portion formed in another one of the contact surfaces of the first arm and the second arm to accommodate an end portion of the protrusion, and
   wherein the protrusion accommodating portion is formed to correspond to a relative rotation trajectory of the protrusion.

20. The display device of claim 1, wherein a coupling area between the second arm and the third arm includes:
   a second swivel shaft having one end portion disposed in the third arm and another end portion disposed in the second arm;
   a fixed gear disposed on one end portion of the second swivel shaft;
   a driving gear engaged with the fixed gear; and
   a second swivel driving motor configured to rotate the driving gear.

21. The display device of claim 20, wherein the second swivel shaft is fixed to the third arm and the second swivel shaft is configured to move relative to the second arm, and
   wherein the second swivel driving motor and the driving gear are disposed inside the second arm.

22. The display device of claim 1, wherein the fixing part includes:
   an upper fixing member configured to be disposed on an upper surface of the external object;
   a lower fixing member configured to be disposed on a lower surface of the external object and movable relative to the upper fixing member;
   a pressing member coupled to an upper surface of the lower fixing member; and
   a manipulation handle screwed through the lower fixing member and having one end portion connected to the pressing member.

23. The display device of claim 22, wherein the pillar is coupled to an upper surface of the upper fixing member, and
   wherein a third swivel driving part is disposed in a coupling area between the pillar and the upper fixing member and the third driving part is configured to rotate the pillar relative to the fixing part.

24. The display device of claim 23, wherein the third swivel driving part includes:
   a third swivel shaft disposed in a vertical direction in a contact area between the pillar and the upper fixing member;
   a fixed gear disposed in a circumferential direction on the upper fixed member based on the third swivel shaft;
   a driving gear engaged with the fixed gear; and
   a third swivel driving motor configured to rotate the driving gear.

25. A device for supporting a display device, the device comprising:
   a mounting bracket configured to be coupled to a rear surface of a display device;
   a first arm connected to the mounting bracket for tilting the mounting bracket up and down;
   a second arm connected to an end portion of the first arm and the first arm being configured to rotate based on a first swivel shaft disposed in the second arm;
   a third arm connected to an end portion of the second arm and the second arm being configured to rotate based on a second swivel shaft disposed in the third arm;
   a pillar connected to the third arm and the pillar being configured to move up and down;
   a fixing part configured to be fixed to an external object; and
   a tilting shaft horizontally disposed on an end portion of the first arm; and
   a camera disposed on the display device, the camera being configured to capture a posture of a user or a viewing angle of the user's eyes,
   wherein the pillar is connected to an upper surface of the fixing part and the pillar is configured to rotate based on a third swivel shaft disposed in the fixing part or the pillar,
   wherein the first arm is coupled to be vertically tilted on the tilting shaft, and
   wherein vertical tilting angle of a screen of the display device is adjusted with respect to the viewing angle,
   wherein a coupling area between the first arm and the second arm are includes:
   a first swivel shaft coupled to the second arm for providing a movable joint between the first arm and the second arm;
   a fixed gear disposed on an end portion of the first arm in a circumferential direction;
   a driving gear engaged with the fixed gear; and
   a first swivel driving motor configured to rotate the driving gear.

* * * * *